(12) United States Patent
Lin et al.

(10) Patent No.: US 8,290,738 B2
(45) Date of Patent: Oct. 16, 2012

(54) LOW POWER SCAN TESTING TECHNIQUES AND APPARATUS

(75) Inventors: Xijiang Lin, West Linn, OR (US); Dariusz Czysz, Ostrow Wielkopolski (PL); Mark Kassab, Wilsonville, OR (US); Grzegorz Mrugalski, Wilsonville, OR (US); Janusz Rajski, West Linn, OR (US); Jerzy Tyszer, Poznan (PL)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/049,844

(22) Filed: Mar. 16, 2011

(65) Prior Publication Data

US 2011/0166818 A1     Jul. 7, 2011

Related U.S. Application Data

(62) Division of application No. 12/069,752, filed on Feb. 12, 2008, now Pat. No. 7,925,465.

(60) Provisional application No. 60/901,079, filed on Feb. 12, 2007.

(51) Int. Cl.
    *G06F 19/00*     (2011.01)

(52) U.S. Cl. ......................................................... 702/124
(58) Field of Classification Search .................. 702/124, 702/117, 118, 182–185, 188
See application file for complete search history.

(56) References Cited

U.S. PATENT DOCUMENTS

2010/0218062 A1*  8/2010  Wang et al. ................... 714/731
* cited by examiner

*Primary Examiner* — Edward Raymond

(57) ABSTRACT

Disclosed below are representative embodiments of methods, apparatus, and systems used to reduce power consumption during integrated circuit testing. Embodiments of the disclosed technology can be used to provide a low power test scheme and can be integrated with a variety of compression hardware architectures (e.g., an embedded deterministic test ("EDT") architecture). Among the disclosed embodiments are integrated circuits having programmable test stimuli selectors, programmable scan enable circuits, programmable clock enable circuits, programmable shift enable circuits, and/or programmable reset enable circuits. Exemplary test pattern generation methods that can be used to generate test patterns for use with any of the disclosed embodiments are also disclosed.

31 Claims, 31 Drawing Sheets

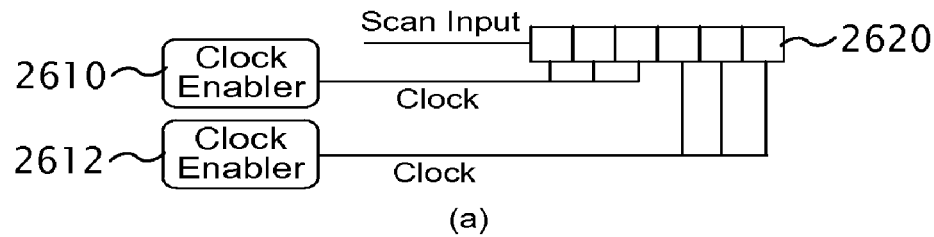
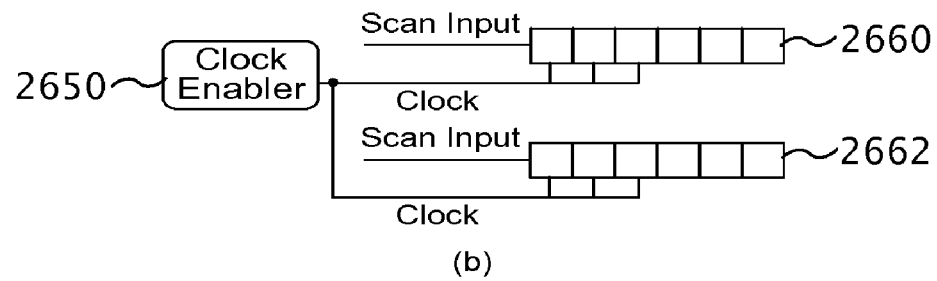
FIG. 26
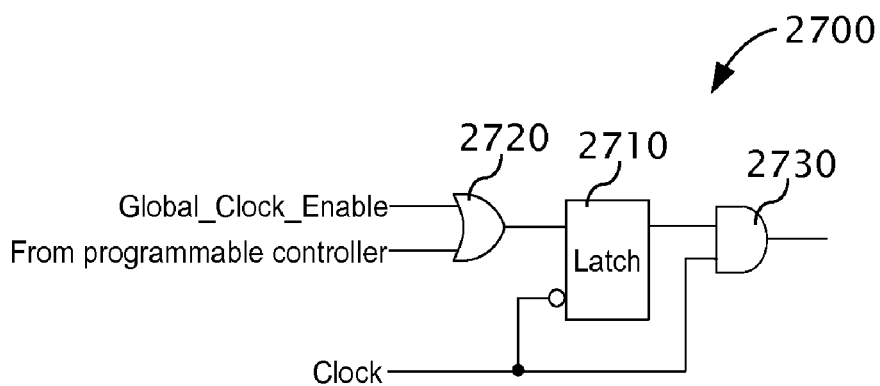
FIG. 27

4110 — APPLY SCAN ENABLE SIGNAL AS TEST PATTERN IS LOADED INTO SCAN CHAINS

4112 — APPLY SCAN ENABLE SIGNAL TO ONE OR MORE BUT NOT ALL OF THE SCAN CHAINS AS A TEST RESPONSE IS CAPTURED

4210 — APPLY CLOCK SIGNAL AS TEST PATTERN IS LOADED INTO SCAN CHAINS

4212 — SUPPRESS CLOCK SIGNAL TO ONE OR MORE BUT NOT ALL OF THE SCAN CHAINS OR SEGMENTS AS A TEST RESPONSE IS CAPTURED

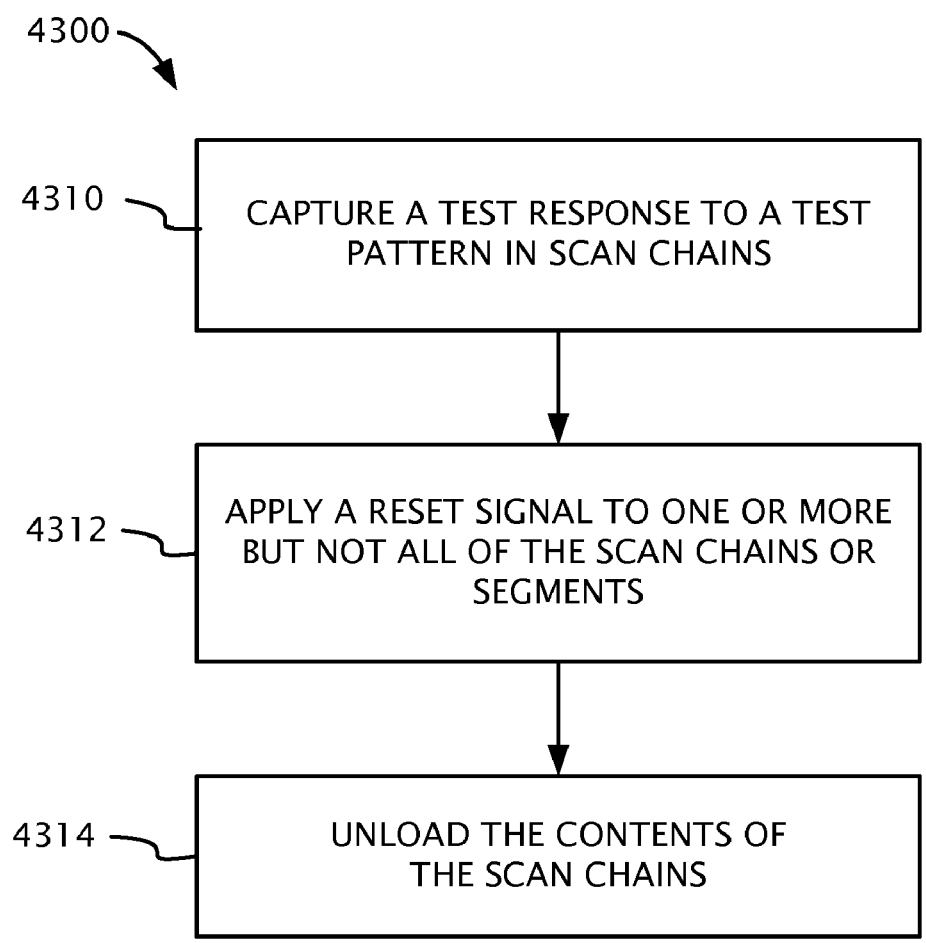

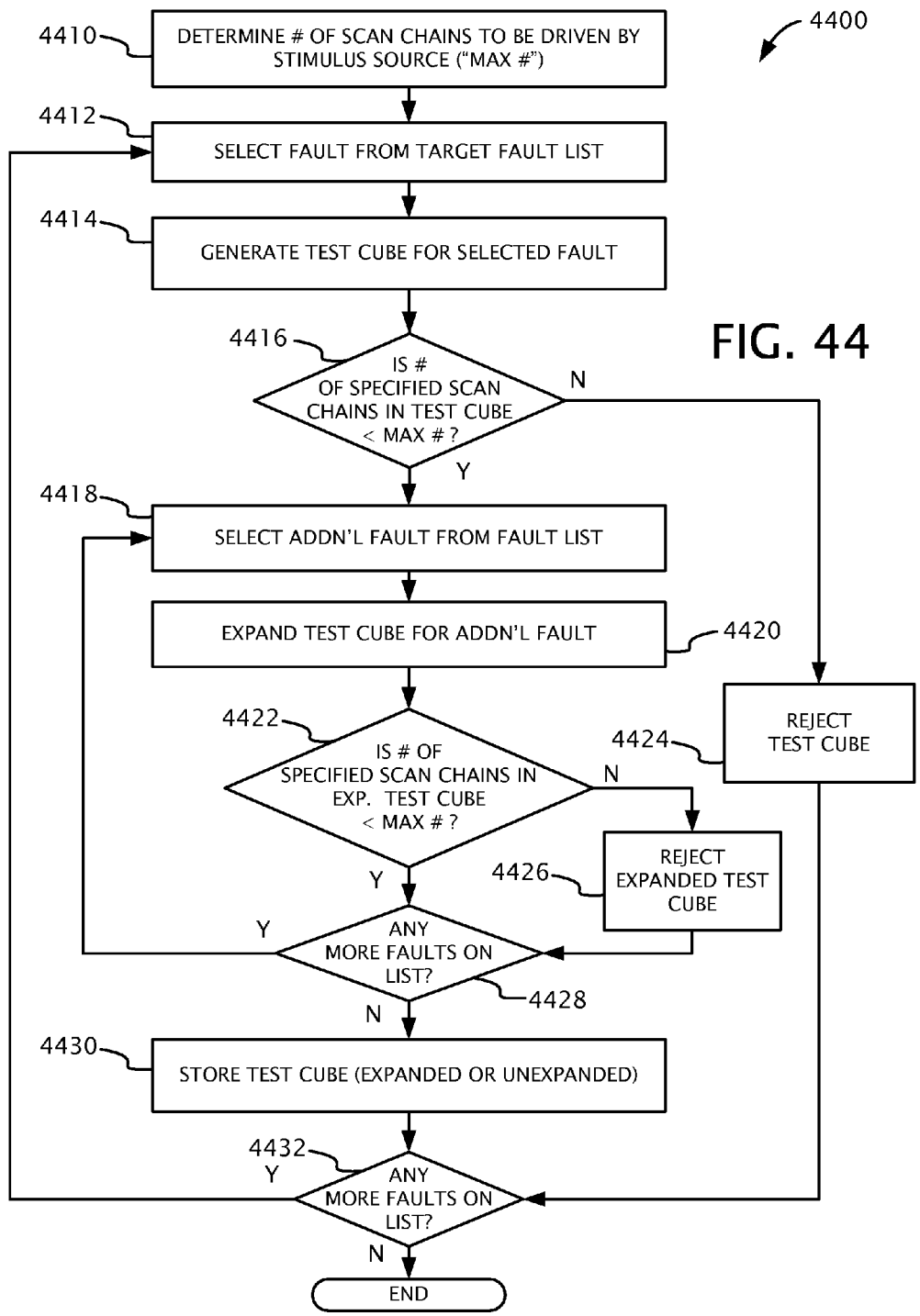

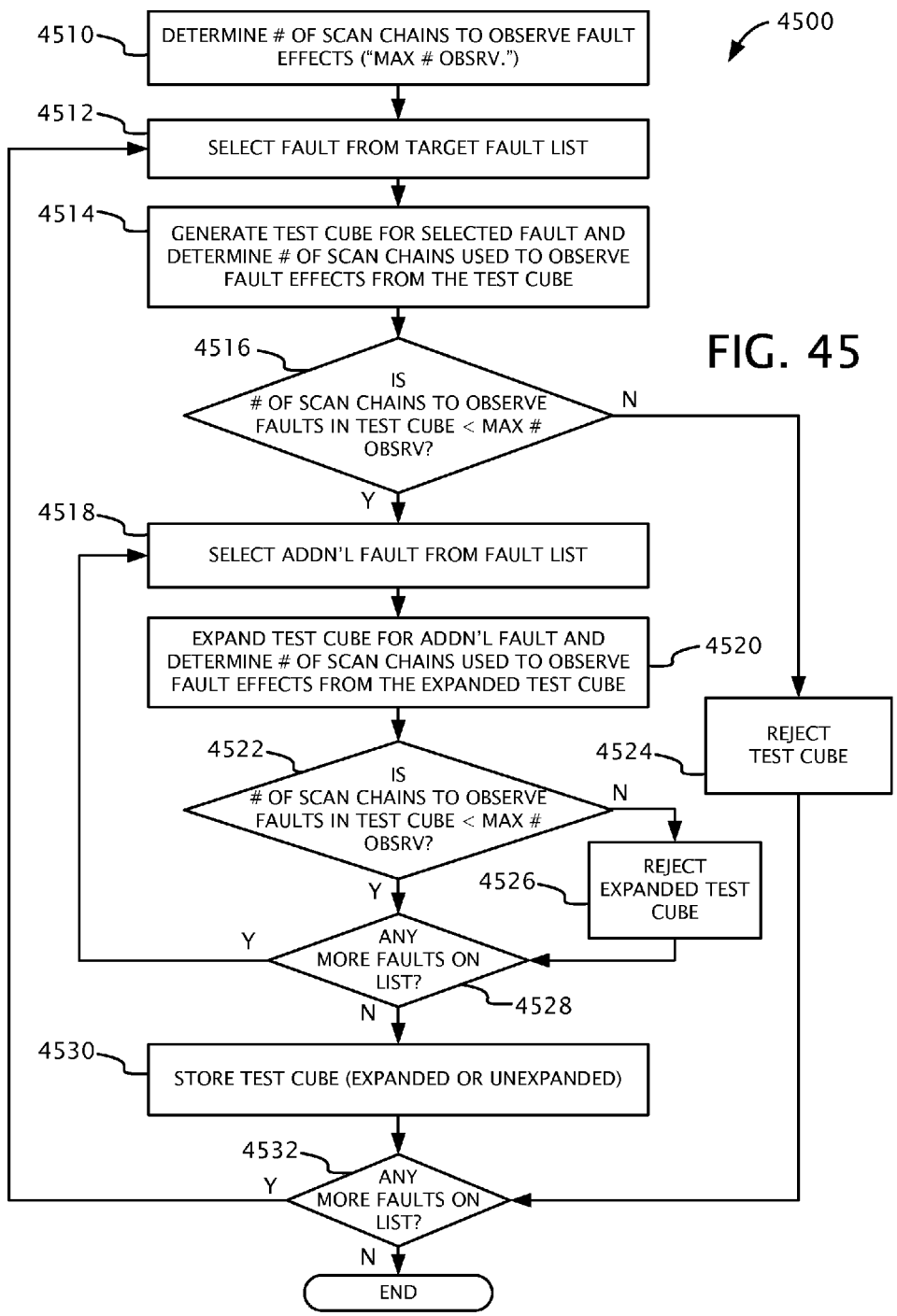

LOW POWER SCAN TESTING TECHNIQUES AND APPARATUS

CROSS-REFERENCE TO RELATED APPLICATIONS

This application is a divisional of U.S. patent application Ser. No. 12/069,752, filed on Feb. 12, 2008, now U.S. Pat. No. 7,925,465 entitled "Low Power Scan Testing Techniques And Apparatus" and naming Xijiang Lin et al. as inventors, which prior application in turn claims the benefit of U.S. Provisional Patent Application No. 60/901,079, filed on Feb. 12, 2007, both of which are incorporated herein by reference.

FIELD

This application relates generally to the field of testing integrated circuits. In particular, this application relates to tools and techniques that reduce power consumption during testing.

BACKGROUND

Design-for-testability ("DFT") techniques based on scan and automatic test pattern generation ("ATPG") are commonly used as part of integrated circuit manufacturing to provide high test coverage. For large circuits, however, the volume of test data required to test such circuits can cause a significant increase in test time and tester memory requirements. In order to cope with these challenges, various test data reduction schemes have been introduced. Some test data reduction schemes, for example, use on-chip decompression and compression hardware. By using such hardware, a tester can deliver test patterns in a compressed form, and the on-chip decompressor can expand (or decompress) the compressed test patterns into the actual data loaded into scan chains. The latter operation is possible because typically only a small number of bits in the decompressed test patterns are specified bits designed to target one or more specific faults in the integrated circuit. The remaining unspecified bits of the decompressed test pattern are termed "don't care" bits and are typically randomly determined as a result of the decompressor structure. The high number of randomly filled test pattern bits, however, can cause excessive switching in the scan cells of the scan chains as the decompressed test pattern is loaded. This, in turn, leads to undesirably high power consumption during the test procedure.

Similarly, the test responses that are captured after the test patterns have been loaded into the scan chains and launched into the system logic often contain many test response bits that are not indicative of the presence of any targeted fault. Because these test response bits do not contribute to fault detection or diagnosis, such test response bits can be termed "don't care" test response bits. As with the "don't care" test pattern bits, the "don't care" test response bits can also cause excessive switching in the scan cells of the scan chains when the test response is captured and/or when the test response is shifted out of the scan chains.

The excessive power used during the scan chain loading, capturing, and/or unloading processes can result in overheating or supply voltage noise—either of which can cause a device to malfunction, be permanently damaged, or exhibit reliability degradation due to accelerated electro-migration. Accordingly, improved methods and test architectures for reducing power consumption during testing are desired.

SUMMARY

Disclosed below are representative embodiments of methods, apparatus, and systems used to reduce power consumption during integrated circuit testing. Embodiments of the disclosed technology can be used to provide a low power test scheme and can be integrated with a variety of compression hardware architectures (e.g., an embedded deterministic test ("EDT") architecture).

Some of the disclosed embodiments include an integrated circuit comprising a test stimulus selector. For example, in particular embodiments, the integrated circuit comprises a first test stimulus source configured to generate original test pattern values, a second test stimulus source configured to generate a constant value, a controller configured to generate control signals, and a test stimulus selector having inputs coupled to the first test stimulus source, the second test stimulus source, and the controller. The test stimulus selector also has outputs coupled to a plurality of scan chains in the integrated circuit. In these embodiments, the test stimulus selector is configured to selectively output either an original test pattern value from the first test stimulus source or the constant value from the second test stimulus source at each of its respective outputs based on the control signals from the controller. In particular embodiments, the test stimulus selector is configured to selectively output values on a cycle-by-cycle basis, a scan-chain-segment-by-scan-chain-segment basis, or a pattern-by-pattern basis. Furthermore, the first test stimulus source can be a decompressor configured to receive compressed test pattern values from an external tester. In some implementations, the test stimulus selector comprises a plurality of multiplexers. Each of the multiplexers of these implementations has a first input coupled to a respective output of the first test stimulus source, a second input coupled to a respective output of the second stimulus source, a third input coupled to a respective output of the controller, and an output coupled to a respective one or more of the scan chains. The controller can be a programmable controller configured to load control data from one of an external tester, a memory on the integrated circuit, or a test generator on the integrated circuit. In certain implementations, the constant value is a first constant value, the integrated circuit further comprises a third test stimulus source configured to generate a second constant value, the test stimulus selector further has inputs coupled to the third stimulus source, and the test stimulus selector is configured to selectively output either an original test pattern value from the first test stimulus source, the first constant value from the second test stimulus source, or the second constant value from the third test stimulus source at each of its respective outputs based on the control signal from the controller. In these implementations, the first constant value and the second constant value can be 0 and 1, respectively, or 1 and 0, respectively. Further, the test stimulus selector of these implementations can comprise a plurality of multiplexers, where each of the multiplexers has a first input coupled to a respective output of the first test stimulus source, a second input coupled to a respective output of the second stimulus source, a third input coupled to a respective output of the third stimulus source, a fourth input coupled to a respective output of the controller, and an output coupled to a respective one or more of the scan chains. For any of these implementations, the controller can comprise one or more shift registers for loading and outputting control data. Further, the one or more shift registers can comprise a plurality of shift registers that form a multi-stage register pipeline. For instance, the plurality of shift registers can be configured to load data serially in response to a register shift clock and/or the plurality of shift registers can be configured to shift in parallel control data from one of the shift registers to another of the shift registers in response to a pipeline shift clock. One or more shadow registers can also be coupled to the one or more shift registers.

Furthermore, the controller can comprise an XOR or XNOR network coupled to at least one of the one or more shift registers, and the controller can further comprise a biasing circuit coupled to the XOR or XNOR network. For instance, the biasing circuit can be configured to bias one or more of the outputs of the XOR or XNOR network so that each of the biased outputs is more likely to produce a respective binary value. The biasing circuit can also be, for instance, a reconfigurable biasing circuit configured to bias one or more of the outputs of the XOR or XNOR network by a selectable amount.

In other disclosed embodiments, an integrated circuit comprises a test stimulus source configured to generate original test pattern values, a controller configured to generate control signals, and a test stimulus selector having inputs coupled to the test stimulus source and the controller and outputs coupled to a plurality of scan chains in the integrated circuit. In these embodiments, the test stimulus selector is configured to selectively output either an original test pattern value from the first test stimulus source or a constant value at each of its respective outputs based on the control signals received from the controller. Further, the test stimulus source can comprise gating logic configured to generate the constant value. In particular embodiments, the test stimulus selector is configured to selectively output values on a cycle-by-cycle basis, a scan-chain-segment-by-scan-chain-segment basis, or a pattern-by-pattern basis. In certain implementations, the test stimulus source is a decompressor configured to receive compressed test pattern values from an external tester. The controller can also be a programmable controller configured to load control data from one of an external tester, a memory on the integrated circuit, or a test generator on the integrated circuit. The control can, in some implementations, comprise one or more shift registers for loading and outputting control data. The one or more shift registers can comprise a plurality of shift registers that form a multi-stage register pipeline. The controller can further comprise an XOR or XNOR network coupled to at least one of the one or more shift registers. Additionally, the controller can comprise a biasing circuit coupled to the XOR or XNOR network. In such implementations, the biasing circuit can be configured to bias one or more of the outputs of the XOR or XNOR network so that each of the biased outputs is more likely to produce a respective binary value.

In one exemplary method disclosed herein, original test pattern values for testing an integrated circuit are received on m paths. The original test pattern values can be received, for example, from a decompressor. In this exemplary method, the test pattern values on at least n of the m paths are selectively modified, where n is less than m, so that the test pattern values on the n paths become at least two consecutive constant values. Test pattern values on m scan chain input paths are output. These test pattern values include the at least two consecutive constant values on n of the m scan chain input paths. In certain implementations, control data indicating which of the m paths are to be modified is received. The control data can be reused for multiple additional test patterns. The outputted test pattern values can include all specified bits of the original test pattern that target one or more faults in the integrated circuit. Further, the act of selectively modifying the test pattern values can comprise applying control signals to logic gates configured to produce the at least two consecutive constant values.

Also disclosed herein are embodiments of integrated circuits having exemplary scan enable circuits. For example, in particular embodiments, an integrated circuit comprises a decompressor coupled to data inputs of scan chains in the integrated circuit, a controller configured to generate control signals, and a scan enable circuit having an input coupled to the controller and outputs coupled to scan enable inputs of scan cells of the scan chains. In these embodiments, the scan enable circuit is configured to generate independently controllable scan enable signals at one or more of the outputs of the scan enable circuit. The values of the independently controllable scan enable signals are based at least in part on the control signals from the controller. The values of the independently controllable scan enable signals can comprise a first scan enable value and a second scan enable value. The first scan enable value can be used to cause one or more of the scan chains to operate in a shift mode, and the second scan enable value can be used to cause the one or more of the scan chains to operate in a normal circuit mode. In some implementations, the input of the scan enable circuit is a first input, and the scan enable circuit further comprises a second input configured to receive a global scan enable signal. In these implementations, the scan enable circuit can be configured so that at least some of the scan enable signals generated by the scan enable circuit are controlled in part by the global scan enable signal. Each output of the scan enable circuit can be coupled to the scan enable inputs of the scan cells in a respective one or more of the scan chains of the integrated circuit. Further, in certain implementations, the integrated circuit can comprise a test stimulus selector having outputs that are configured to be coupled to scan chains formed by the scan cells. The test stimulus selector can be configured to selectively output either an original test pattern value or a constant value at each respective one of the outputs of the test stimulus selector. In some implementations, the controller can be a programmable controller configured to load control data from one of an external tester, a memory on the integrated circuit, or a test generator on the integrated circuit. The controller can comprise, for instance, one or more shift registers for loading and outputting control data. The one or more shift registers can comprise a plurality of shift registers that form a multi-stage register pipeline. Further, one or more shadow registers can be coupled to the one or more shift registers. The controller can also comprise, in some implementations, an XOR or XNOR network coupled to at least one of the one or more shift registers. Furthermore, the controller can comprise a biasing circuit coupled to the XOR or XNOR network. The biasing circuit can be configured to bias one or more of the outputs of the XOR or XNOR network so that each of the biased outputs is more likely to produce a respective binary value.

Exemplary embodiments for applying scan enable signals to a circuit during testing are also disclosed herein. For instance, in some embodiments, a scan enable signal is applied to scan chains of a circuit-under-test as a decompressed test pattern from a decompressor is loaded into the scan chains. The scan enable signal causes the scan chains to operate as one or more shift registers. Further, the scan enable signal is applied to one or more of the scan chains as a test response to the decompressed test pattern is captured in a remainder of the scan chains to which the scan enable signal is not applied. In some implementations, the one or more of the scan chains to which the scan enable signal is applied comprise one or more scan chains that would otherwise capture unknown values. In further implementations, the scan enable signal can be applied to the scan chains of the circuit-under-test as the test response is unloaded from the scan chains. Control signals can also be received that control which of the scan chains will have the scan enable signal applied as the test response to the decompressed test pattern is captured. These control signals can be reused as multiple additional decompressed test patterns are loaded into the scan chains. Still further, the control signals for a next test pattern can be loaded as the test pattern is being loaded into the scan chains.

In another exemplary embodiment disclosed herein, one or more computer-readable media storing computer-executable instruction for causing a computer to perform a method are disclosed. In certain implementations, the method comprises simulating a test pattern being applied to a circuit-under-test and thereby producing a simulated test response, identifying one or more scan chains of the circuit-under-test that capture unknown states from the simulated test response, generating control signals for causing a scan enable circuit to suppress scan enable signals at the one or more identified scan chains during a capture window, and storing the control signals on one or more computer-readable media.

Also disclosed herein are embodiments of integrated circuits comprising clock enable circuits. For example, in certain disclosed embodiments, an integrated circuit comprises a decompressor coupled to data inputs of scan chains in the integrated circuit, a controller configured to generate control signals, and a clock enable circuit. The clock enable circuit of these embodiments has inputs coupled to the controller and outputs coupled to clock inputs of scan cells of the scan chains. Further, the clock enable circuit is configured to generate independently controllable clock signals at one or more of the outputs of the clock enable circuit based at least in part on the control signals from the controller. The independently controllable clock signals generated by the clock enable circuit can be capture clock signals. Further, in some implementations, the inputs of the clock enable circuit can be first inputs, the clock enable circuit can further comprise a second input configured to receive a source clock signal, and the clock signals generated by the clock enable circuit can be derived from the source clock signal. In certain implementations, the clock enable circuit further comprises a third input configured to receive a global clock enable signal, and the clock enable circuit is configured to generate clock signals at all of the outputs of the clock enable circuit when the global clock enable signal is activated. Each output of the clock enable circuit can be coupled to the clock inputs of the scan cells in a respective one or more of the scan chains of the integrated circuit. The clock enable circuit can comprise individual clock enabler circuits for controlling each respective output of the clock enable circuit. In certain implementations, the integrated circuit further comprises a test stimulus selector having outputs that are configured to be coupled to scan chains formed by the scan cells. The test stimulus selector can be configured to selectively output either an original test pattern value or a constant value at each respective one of the outputs of the test stimulus selector. Further, the controller can be a programmable controller configured to load control data from one of an external tester, a memory on the integrated circuit, or a test generator on the integrated circuit. The controller can comprise, for example, one or more shift registers for loading and outputting control data. The one or more shift registers can comprise a plurality of shift registers that form a multi-stage register pipeline. Further, one or more shadow registers can be coupled to the one or more shift registers. The controller can also comprise an XOR or XNOR network coupled to at least one of the one or more shift registers. In certain implementations, the controller further comprises a biasing circuit coupled to the XOR or XNOR network, the biasing circuit being configured to bias one or more of the outputs of the XOR or XNOR network so that each of the biased outputs is more likely to produce a respective binary value.

Among the disclosed embodiments are methods for applying and suppressing clock signals during testing. For example, in certain disclosed embodiments, a clock signal is applied to scan chains of a circuit-under-test as a decompressed test pattern from a decompressor is loaded into the scan chains of the circuit-under-test. The clock signal is suppressed to one or more but not all of the scan chains or segments of the scan chains as a test response to the decompressed test pattern is captured during a capture window. The suppression of the clock signal causes the one or more but not all of the scan chains or segments of the scan chains to remain in a constant state during the capture window. The one or more but not all of the scan chains or segments of the scan chains can comprise one or more scan chains or segments of the scan chains that would otherwise capture unknown values. In particular implementations, the clock signal has a first frequency as the test pattern is loaded into the scan chains and a second frequency as the test response is captured in the capture window. The disclosed embodiments can further comprise applying the clock signal to the scan chains of the circuit-under-test as the test response is unloaded from the scan chains. Furthermore, control signals can be received that control which scan chains or segments of the scan chains will have the clock signal suppressed during the capture window. The control signals can be reused as test responses to multiple additional decompressed test patterns are captured. The control signals for a next test pattern can also be loaded as the test pattern is being loaded into the scan chains.

In another exemplary embodiment disclosed herein, one or more computer-readable media storing computer-executable instruction for causing a computer to perform a method are disclosed. In certain implementations, the method comprises simulating a test pattern being applied to a circuit-under-test and thereby producing a simulated test response, identifying one or more scan chains of the circuit-under-test that capture unknown states from the simulated test response, generating control signals for causing a clock enable circuit to suppress the capture clock at the one or more identified scan chains during a capture window, and storing the control signals on one or more computer-readable media.

Also disclosed herein are embodiments of integrated circuits comprising reset enable circuits. For example, in some embodiments, an integrated circuit comprises a decompressor coupled to data inputs of scan chains in the integrated circuit, a controller configured to generate control signals, and a reset enable circuit having inputs coupled to the controller and outputs that are coupled to reset inputs of scan cells of the scan chains. The reset enable circuit can be configured to selectively generate a reset signal at one or more of the outputs of the reset enable circuit based at least in part on the control signals from the controller. The scan cells in the integrated circuit can be configured to be reset to 0 or 1 when the reset signal is applied to the reset inputs. The inputs of the reset enable circuit can be first inputs of the reset enable circuit, and the reset enable circuit can further comprise a second input configured to receive a source reset signal. In particular implementations, the reset enable circuit comprises individual reset enabler circuits for controlling each respective output of the reset enable circuit. Furthermore, in some implementations, each output of the reset enable circuit can be coupled to the reset inputs of the scan cells in a respective one or more of the scan chains of the integrated circuit. The reset inputs of the scan cells can comprise asynchronous control pins of the scan cells. The integrated circuit can further comprise a shift clock enable circuit having outputs that are coupled to shift clock inputs of scan chains in the integrated circuit. The shift clock enable circuit of these embodiments can be configured to selectively generate a shift clock signal at one or more of the outputs of the shift clock enable circuit. The shift clock enable circuit can further comprise inputs coupled to the controller, and the shift clock signals that are selectively generated can be based at least in part on the control signals from the controller. Further, the shift clock enable circuit can comprise individual shift clock enabler circuits for controlling each respective output of the shift clock enable circuit. The integrated circuit can also comprise a test stimulus selector having outputs that are configured to be coupled to scan chains formed by the scan cells. The test stimulus selector can be configured to selectively output either an original test pattern value or a constant value at each respective one of the outputs of the test stimulus selector. In certain implementations, the controller in the integrated circuit is a programmable controller configured to load control data from one of an external tester, a memory on the integrated circuit, or a test generator on the integrated circuit. The controller can comprise one or more shift registers for loading and outputting control data. Further, the one or more shift registers can comprise a plurality of shift registers that form a multi-stage register pipeline. One or more shadow registers can be coupled to the one or more shift registers. The controller can further comprise an XOR or XNOR network coupled to at least one of the one or more shift registers. Still further, the controller can comprise a biasing circuit coupled to the XOR or XNOR network. The biasing circuit can be configured to bias one or more of the outputs of the XOR or XNOR network so that each of the biased outputs is more likely to produce a respective binary value.

Exemplary embodiments for applying reset signals to a circuit during testing are also disclosed herein. In certain disclosed embodiments, a test response to a test pattern (e.g., a test pattern decompressed by a decompressor) is captured in scan chains of a circuit-under-test. A reset signal is applied to one or more but not all of the scan chains or segments of the scan chains after the test response to the test pattern is captured. The contents of the scan chains are unloaded after the reset signal is applied. The one or more scan chains or segments of the scan chains to which the reset signal is applied can comprise one or more scan chains or segments of the scan chains that would otherwise capture unknown values. The application of the reset signal can cause values captured into the one or more but not all of the scan chains or segments of the scan chains to become a single constant value (e.g., a 1 or 0). Control signals can be received that control which scan chains or segments of the scan chains will have the reset signal applied. These control signals can be reused for test responses to multiple additional test patterns. Further, control signals for a next test pattern can be loaded as the test pattern is being loaded into the scan chains.

In another exemplary embodiment disclosed herein, one or more computer-readable media storing computer-executable instruction for causing a computer to perform a method are disclosed. In certain implementations, the method comprises simulating a test pattern being applied to a circuit-under-test and thereby producing a simulated test response, identifying one or more scan chains of the circuit-under-test that capture unknown states from the simulated test response, generating control signals for causing a reset enable circuit to generate reset signals at the one or more identified scan chains, and storing the control signals on one or more computer-readable media.

Among the various embodiments disclosed herein are test pattern generation methods. These methods can be implemented, for instance, in one or more computer-readable media storing computer-executable instructions for causing a computer to perform a method. In some embodiments, a number of scan chains to be driven by an original test stimulus source is determined. The number is typically less than the number of available scan chains in a circuit design. A fault from a target fault list is selected. A test cube for the selected fault is generated. The test cube can comprise specified bits in a number of specified scan chains. A determination is made as to whether the number of specified scan chains in the test cube is less than the number of scan chains to be driven by the original test stimulus source. If the number of specified scan chains in the test cube does not exceed the number of scan chains to be driven by the original test stimulus source, the test cube is stored. In certain implementations, the fault is a first fault and the test cube is rejected if the number of specified scan chains in the test cube exceeds the number of scan chains to be driven by the original test stimulus. The acts of selecting, generating, determining, and storing can then be repeated for a second fault from the target fault list. In some implementations, the fault is a first fault, and a second fault is selected from the target fault list. The test cube for the first fault can be expanded to include one or more additional specified bits for detecting the second fault. A determination can be made as to whether the one or more additional specified bits causes the number of specified scan chains in the expanded test cube to exceed the number of scan chains to be driven by the original test stimulus source. If the number of specified scan chains in the expanded test cube does not exceed the number of scan chains to be driven by the original test stimulus source, the expanded test cube can be stored. If the number of specified scan chains in the expanded test cube exceeds the number of scan chains to be driven by the original test stimulus source, the expanded test cube can be rejected and the acts of selecting, expanding, determining, and storing repeated for a third fault from the target fault list. In some implementations, the encoding capacity of a controller for a test stimulus selector is determined in order to determine the number of scan chains to be driven by an original test stimulus source. Further, the number of scan chains to be driven by the original test stimulus source can be based on the maximum number of scan chains that can be individually controlled by a test stimulus selector. In certain implementations, the original test stimulus source is a decompressor configured to decompress compressed test patterns provided by an external tester. In some implementations, control signals for a test stimulus selector can be generated based on the test cube. These control signals can be capable of causing the test stimulus selector to apply constant values to the unspecified scan chains as a test pattern with the test cube is loaded during testing.

In other exemplary test pattern generation methods, a number of scan chains usable to observe fault effects is determined. The number is typically less than the number of available scan chains in a circuit design. A fault from a target fault list is selected. A test cube for the selected fault is generated. The number of scan chains used to observe fault effects from the test cube is determined. An evaluation is made as to whether the number of scan chains used to observe fault effects from the test cube is less than the number of scan chains usable to observe fault effects. If the number of scan chains used to observe fault effects from the test cube is less than the number of scan chains usable to observe fault effects, the test cube is stored. In certain implementations, the fault is a first fault, and the test cube is rejected if the number of scan chains used to observe fault effects from the test cube exceeds the number of scan chains usable to observe fault effects. The acts of selecting, generating, determining, evaluating, and storing can be performed for a second fault from the target fault list. In other implementations, the fault from the target fault list is a first fault from the target fault list, and a second fault from the target fault list is selected. The test cube for the first fault is expanded to include one or more additional specified bits for detecting the second fault. A determination is made as to whether the one or more additional specified bits cause the number of scan chains used to observe fault effects from the expanded test cube to exceed the number of scan chains usable to observe fault effects. If the number of scan chains used to observe fault effects from the test cube is less than the number of scan chains usable to observe fault effects, the expanded test cube is stored. If the number of scan chains used to observe fault effects from the test cube exceeds the number of scan chains usable to observe fault effects, the expanded test cube can be rejected. The acts of selecting, expanding, determining, and storing can be repeated for a third fault from the target fault list. In certain implementations, the encoding capacity for a controller of a scan enable circuit, a controller of a clock enable circuit, a controller of a reset enable circuit, or a controller of a shift clock enable circuit can be determined in order to determine the number of scan chains usable to observe fault effects. The number of scan chains used to observe fault effects from the test cube can be determined by simulating application of the test cube to a circuit-under-test. In certain implementations, the original test stimulus source is a decompressor configured to decompress compressed test patterns provided by an external tester. In some implementations, control signals for a scan enable circuit can be generated based on the test cube. These control signals can be capable of causing the scan enable circuit to suppress scan enable signals from scan chains that do not observe fault effects from the test cube when a test pattern with the test cube is applied during testing. In other implementations, control signals for a clock enable circuit can be generated based on the test cube. These control signals can be capable of causing the clock enable circuit to suppress clock signals from scan chains that do not observe fault effects from the test cube when a test pattern with the test cube is applied during testing. In further implementations, control signals can be generated for a reset enable circuit based on the test cube. These control signals can be capable of causing the reset enable circuit to apply reset signals to scan chains that do not observe fault effects from the test cube after a test response to a test pattern with the test cube is captured during testing. In other implementations, control signals for a shift clock enable circuit can be generated based on the test cube. These control signals can be capable of causing the shift clock enable circuit to suppress shift clock signals from scan chains that do not observe fault effects from the test cube after a test response to a test pattern with the test cube is captured during testing. In certain implementations, a number of scan chains to be driven by an original test stimulus source is also determined. In these implementations, the number of scan chains to be driven by the original test stimulus source is based on the maximum number of scan chains that can be independently controlled by a scan enable circuit, a clock enable circuit, a reset enable circuit, or a shift clock enable circuit.

Any of the disclosed embodiments can be performed in a variety of environments, including a simulation environment. Further, any of the disclosed methods can be implemented on one or more computer-readable media storing computer-executable instructions for causing a computer to perform any of the methods. Any of the disclosed methods implemented in a computer environment can be performed by a single computer or via a network. Further, computer-readable media storing test patterns, test pattern values, or control data (or any other final or intermediate results) produced by any of the disclosed methods are also disclosed. Additionally, any of the disclosed apparatus can be generated by a suitable electronic design automation ("EDA") software tool and stored as design data on one or more computer-readable media. For example, any of the disclosed testing architectures can be described or represented in an HDL file (such as a Verilog, VHDL, or register-transfer level file), a gate-level netlist, or other such EDA design file (e.g., a GDSII file or Oasis file).

The foregoing and other objects, features, and advantages of the invention will become more apparent from the following detailed description, which proceeds with reference to the accompanying figures.

BRIEF DESCRIPTION OF THE DRAWINGS

FIGS. 26(a)-26(b) are schematic block diagrams showing exemplary configurations for coupling outputs of clock enable circuits to scan chains as can be used in the embodiment of FIG. 25.

FIG. 27 is a schematic block diagram of an exemplary clock enable circuit as can be used in the embodiment of FIG. 25.

FIG. 43 is a flowchart of an exemplary method for selectively applying a reset signal to scan chains after a test response is captured during testing.

FIG. 44 is a flowchart of an exemplary test pattern generation method for generating test cubes where the number of scan chain to be driven by a test stimulus source is restricted.

FIG. 45 is a flowchart of an exemplary test pattern generation method for generating test cubes where the number of scan chains that observe fault effects during testing is to be restricted.

DETAILED DESCRIPTION

I. General Considerations

Figure 1:
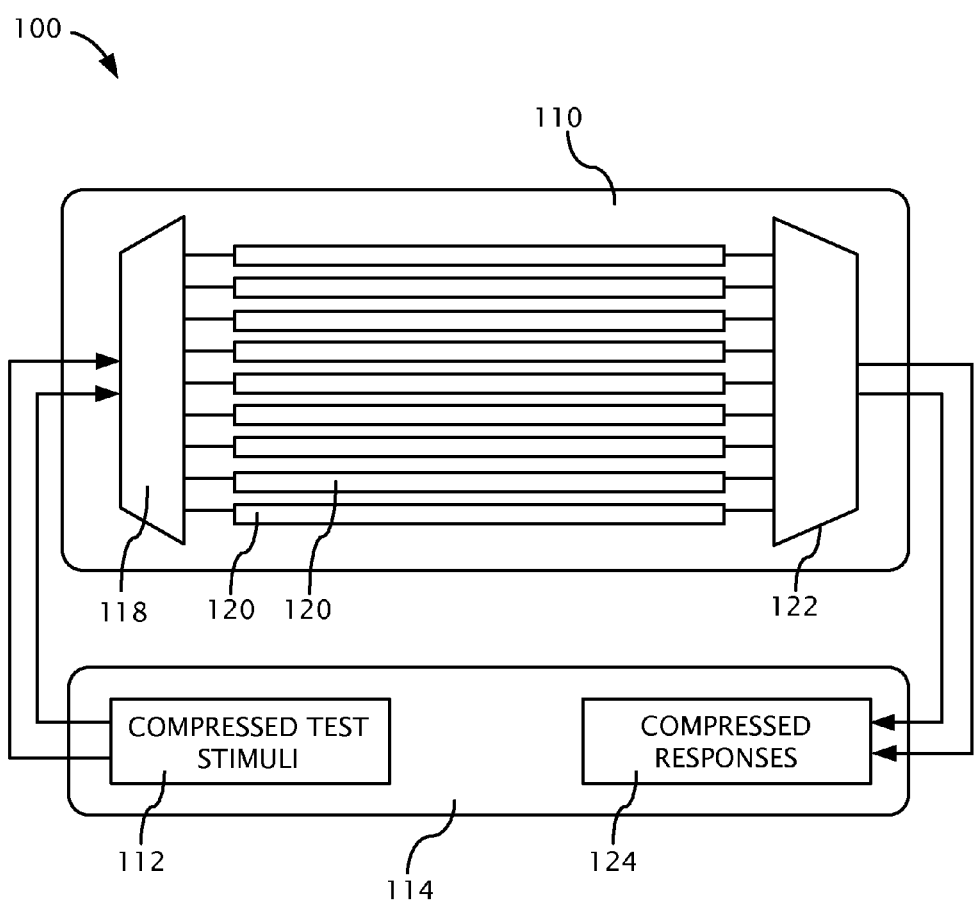
FIG. 1 is a schematic block diagram illustrating an exemplary testing environment in which embodiments of the disclosed technology can be used.
Figure 2A:
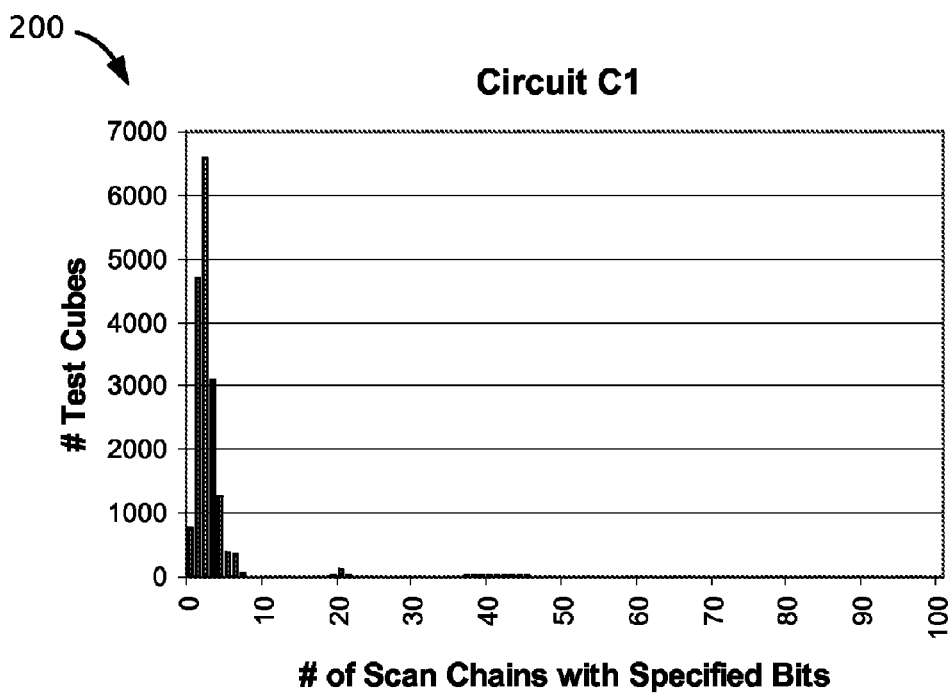
FIGS. 2(a)-2(d) are graphs showing the distributions of the number of scan chains having specified bits for primary target transition faults in exemplary test circuits.
Figure 2B:
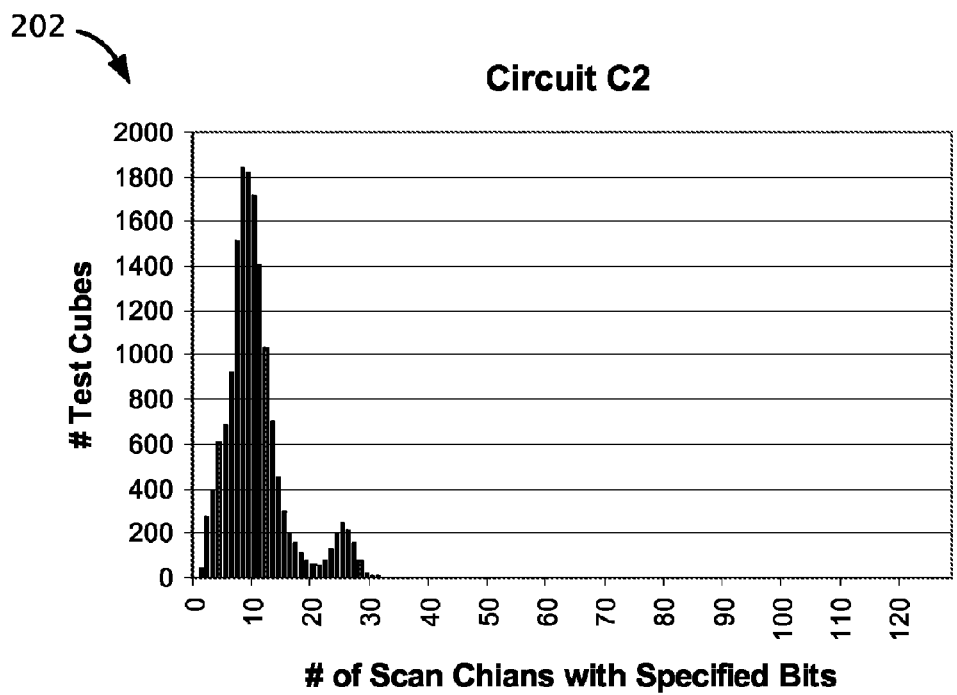
Figure 2C:
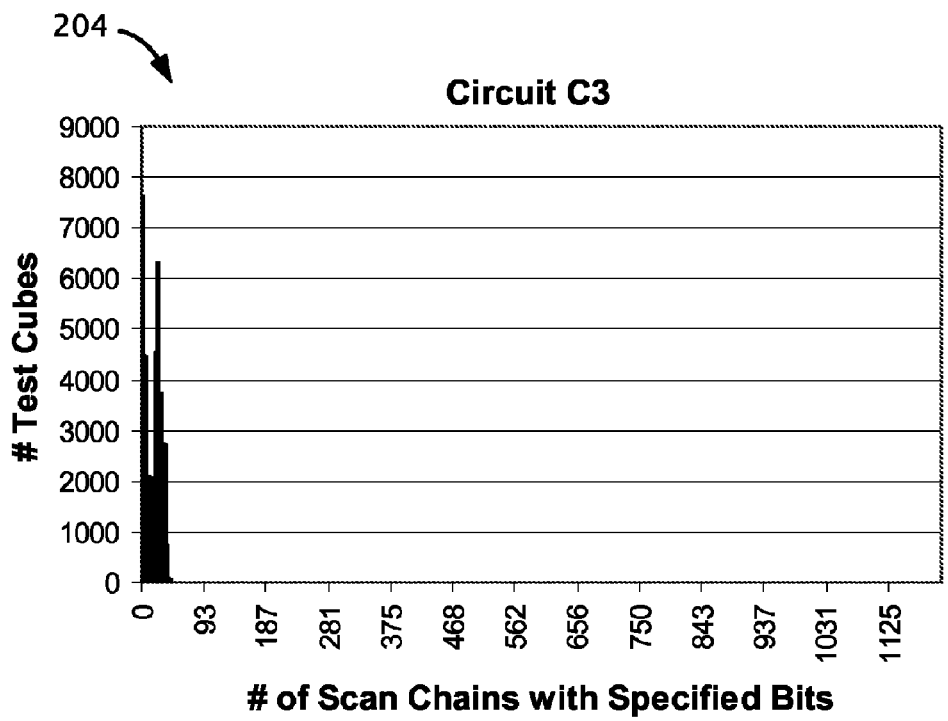
Figure 2D:
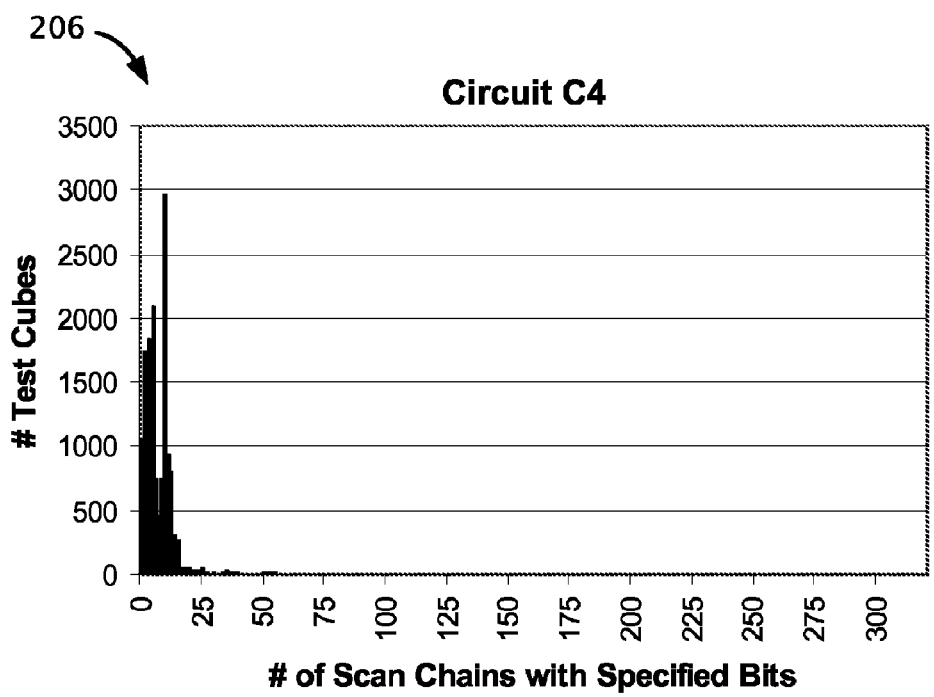
Figure 3A:
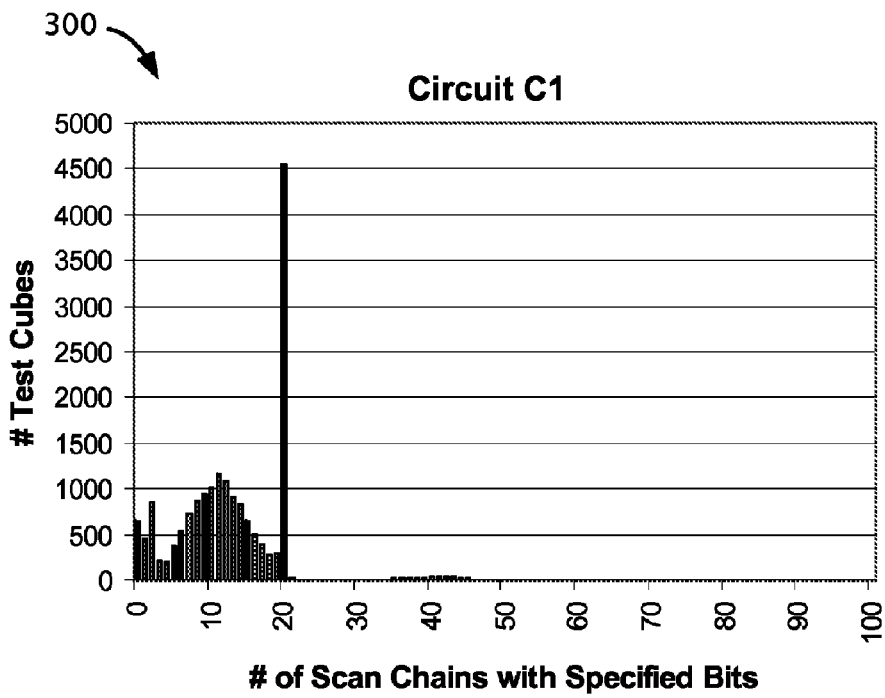
FIGS. 3(a)-3(d) are graphs showing the distribution of scan chains with specified bits after dynamic compaction for the exemplary test circuits.
Figure 3B:
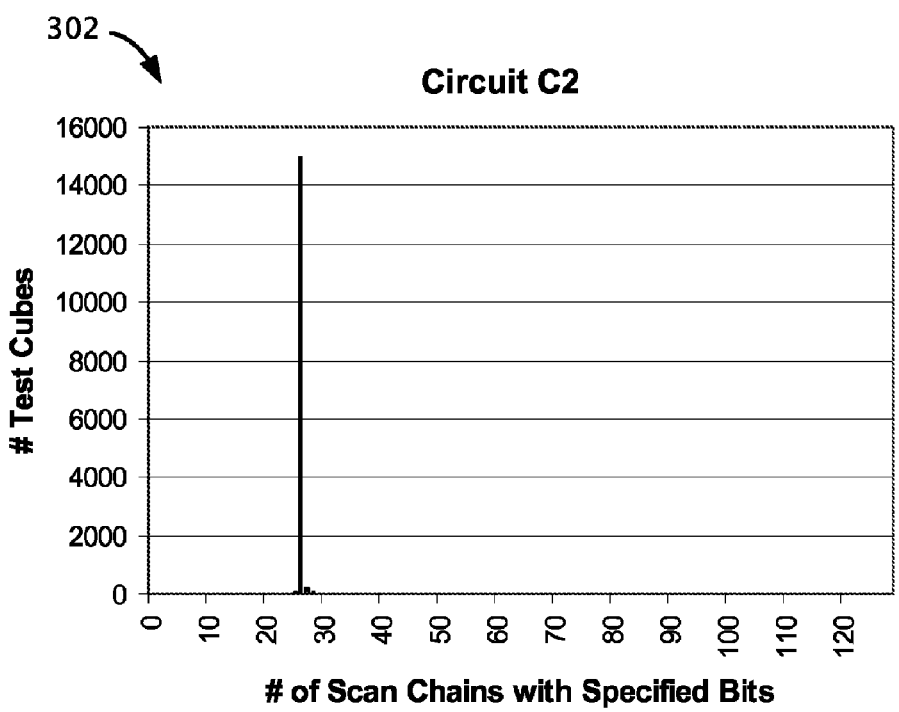
Figure 3C:
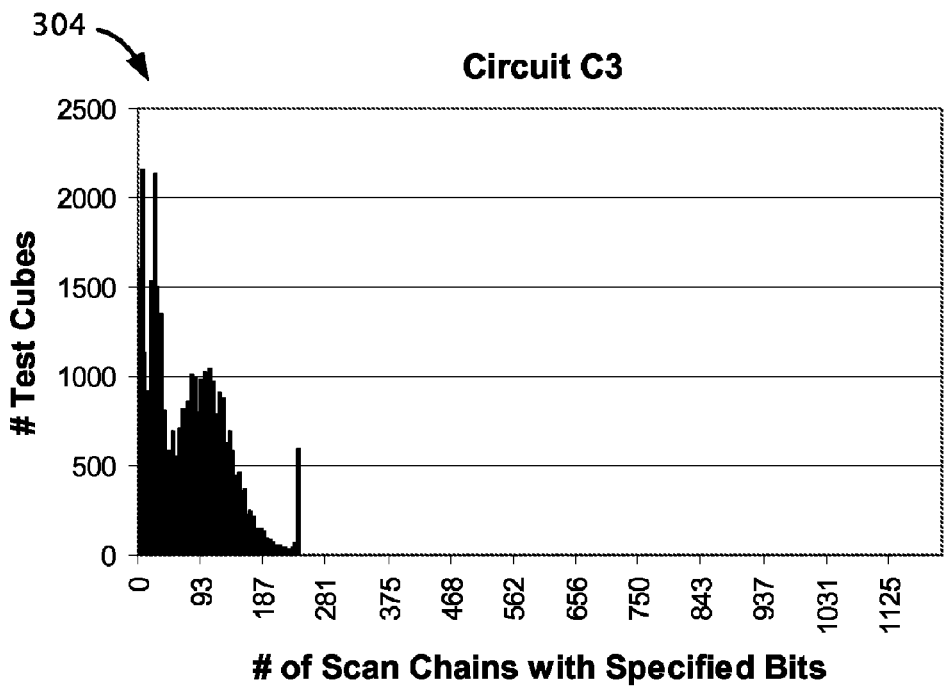
Figure 3D:
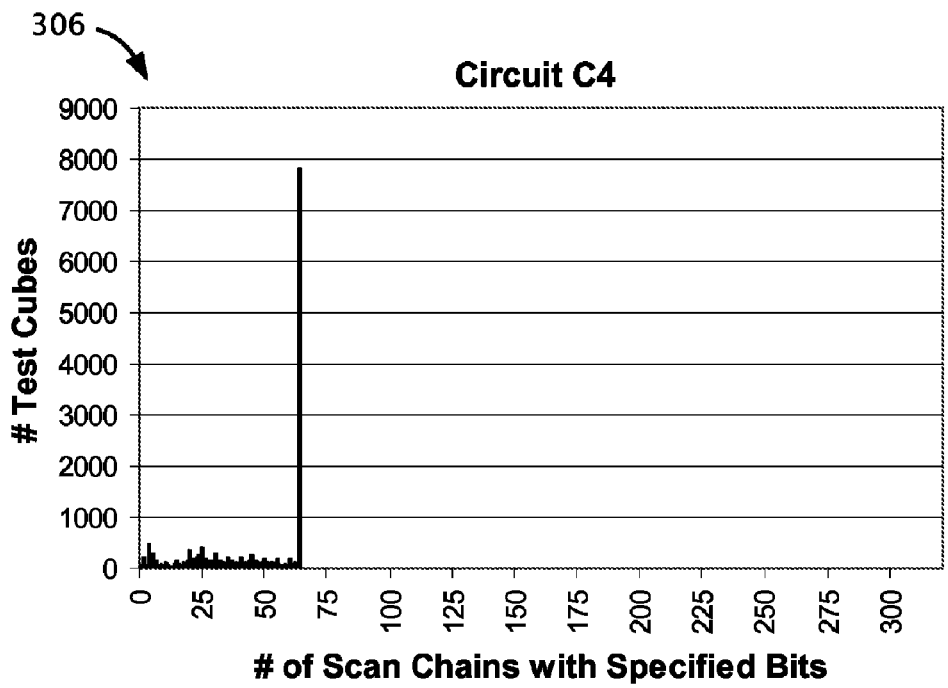

The disclosed methods, apparatus, and systems should not be construed as limiting in any way. Instead, the present disclosure is directed toward all novel and nonobvious features and aspects of the various disclosed methods, apparatus, systems, and equivalents thereof, alone and in various combinations and subcombinations with one another. The present disclosure is not limited to any specific aspect or feature, or combination thereof, nor do the disclosed methods, apparatus, and systems require that any one or more specific advantages be present or problems be solved.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "evaluate" and "determine" to describe the disclosed methods. These terms are high-level abstractions of the actual operations that are performed. The actual operations that correspond to these terms may vary depending on the particular implementation and are readily discernible by one of ordinary skill in the art.

The disclosed apparatus can be implemented in a wide variety of scan-based or partially-scan-based circuits (e.g., application-specific integrated circuits ("ASICs") (including mixed-signal ASICs), systems-on-a-chip ("SoCs"), or programmable logic devices ("PLDs"), such as field programmable gate arrays ("FPGAs")). Such circuits can be used in a vast assortment of electronic devices, ranging from portable electronics (e.g., cell phones, media players, and the like) to larger-scale items (e.g., computers, control systems, airplanes, automobiles, factories, and the like). All such items comprising one or more circuits having embodiments of the disclosed testing apparatus are considered to be within the scope of this disclosure.

Any of the disclosed apparatus can be described or represented as design data or design information stored on one or more computer-readable media. For example, any of the disclosed testing architectures can be described or represented in an HDL file (such as a Verilog, VHDL, or register-transfer level file), a gate-level netlist, or other such EDA design file (e.g., a GDSII file or Oasis file). Such design data or design information can be created in whole or in part through the use of software comprising computer-executable instructions stored on computer-readable media (e.g., computer-readable media, such as one or more CDs, volatile memory components (such as DRAM or SRAM), or nonvolatile memory components (such as hard drives)). Any of the disclosed techniques can also be implemented in whole or in part by software comprising computer-executable instructions stored on computer-readable media. Such software can comprise, for example, an appropriate electronic design automation ("EDA") software tool (e.g., an automatic test pattern generation ("ATPG") tool).

Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

Any of the disclosed methods can also be performed in a computer simulation or other EDA environment (e.g., in a simulation environment where test patterns are simulated as being applied to representations of circuits). For example, the disclosed methods can be performed using circuit design information representative of a circuit-under-test and the associated test hardware (for example, a netlist, HDL file (such as a Verilog, or VHDL file), RTL file, GDSII file, Oasis file, or the like) and stored on computer-readable media. For presentation purposes, however, the present disclosure sometimes refers to the circuit-under-test (including the various components of the circuit-under-test) and the associated testing hardware (including the various components of the hardware) by their physical counterparts (for example, scan chains, scan cells, shift register, shadow register, and other such terms). It should be understood, however, that any such reference in the detailed description or claims not only includes the physical components but also includes representations of such components as are used in simulation, automatic test pattern generation, or other such EDA environments.

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit.

Furthermore, as used herein, the term "test stimulus source" refers to a test stimulus generator that provides test stimuli directly or indirectly to scan chains and primary inputs. The test stimulus generator be can implemented in various forms. Such forms include, but are not limited to, external test equipment, weighted or non-weighted pseudo random pattern generators ("PRPGs"), PRPGs with phase shifter and/or biasing circuit, decompressors, sources producing a constant logic value 0, and sources producing a constant logic value 1.

The term "decompressor" refers to a functional unit that decompresses compressed test stimuli, such as deterministic test stimuli from external test equipment, for delivery to a circuit-under-test on the chip. A decompressor can be implemented in various forms. Such forms can include, but are not restricted to, broadcast circuits, selectable broadcast circuits, combinational circuits (including, but not limited to, MUX-based or XOR-based combinational circuits) with or without biasing circuits, feedback shift registers with or without phase shifters and/or biasing logic, and/or a feedback shift registers with reseeding.

The term "test stimulus selector" refers to a functional unit that selects at least one test stimulus source (e.g., from a plurality of such sources) that feeds scan chain inputs.

The term "programmable test stimulus selector" refers to a functional unit that can comprise, for example, two components: a programmable controller and a test stimulus selector. The programmable controller can, for example, be coupled to external test equipment or to an embedded test generator and configured to receive control data from the external tester or from the embedded test generator.

The term "scan chain segment" refers to a group of scan cells in a scan chain that are connected consecutively.

The term "scan enabler" or "scan enable circuit" refers to a functional unit that configures the scan chains in a shift mode or a functional capture mode (sometimes referred to as the "normal circuit" mode) during a capture window.

The term "programmable scan enabler" or "programmable scan enable circuit" refers to a functional unit that can comprise, for example, two components: a programmable controller and a scan enable circuit. The programmable controller can be coupled to external test equipment or to an embedded test generator and be configured to receive control data from the external tester or from the embedded test generator.

The term "clock enabler" or "clock enable circuit" refers to a functional unit that enables/disables a set of state elements to capture a system response in the capture window.

The term "programmable clock enabler" or "programmable clock enable circuit" refers to a functional unit that can comprise, for example, two components: a programmable controller and a clock enable circuit. The programmable controller can be coupled to external test equipment or to an embedded test generator and be configured to receive control data from the external tester or from the embedded test generator.

The term "shift clock enabler" or "shift clock enable circuit" refers to a functional unit that enables/disables a group of scan chains to load/unload test data during scan shift.

The term "reset enabler" or "reset enable circuit" refers to a functional unit that enables/disables a reset clock or reset signal that resets the scan cells in a scan chain.

The term "programmable reset/shift enabler" refers to a functional unit that can comprise, for example, three components: a programmable controller, a shift clock enable circuit, and a reset enable circuit. The programmable controller can be coupled to external test equipment or to an embedded test generator and be configured to receive control data from the external tester or from the embedded test generator.

It should be noted that these particular term usages should not be construed as limiting, as the terms may encompass additional features understood by those of ordinary skill in the art or indicated by the context of how the term is used.

II. Low-Power Testing, Generally

The technology disclosed herein relates to methods and apparatus for low-power testing. The disclosed technology is sometimes discussed in the context of an embedded deterministic test ("EDT") environment, though it should be understood that the principles described herein are not limited to this environment. For example, the low-power testing techniques and apparatus described herein can be used with other compression schemes that involve encoding test cubes having specified bits or with testing schemes that do not use compression hardware.

FIG. 1 illustrates an exemplary testing environment 100 in which compressed test stimuli 112 are delivered to a decompressor 118 embedded in a circuit-under-test 110. The illustrated embodiment shows a typical EDT environment in which the compressed test stimuli are provided by automatic test equipment ("ATE") 114 external to the circuit-under-test 110. The test stimuli are decompressed and applied as test patterns to scan chains 120. Outputs from the scan chains are compacted by a compactor 122 and delivered as compressed test responses 124 to the ATE 114 for analysis. Examples of EDT decompressors 118 and exemplary EDT environments that are suitable for use with the disclosed technology are described in, for example, U.S. Pat. Nos. 6,327,687; 6,353,842; 6,557,129; 6,684,358; 6,874,109; and U.S. Patent Application Publication No. 2003/0120988, all of which are hereby incorporated herein by reference.

Deterministic test vectors typically have only a small fraction of bits that are specified. The remaining positions can be either randomly filled with 0s and 1s, or they can be filled in other ways, often without compromising test coverage. Furthermore, a substantial amount of experimental evidence indicates that, very often, the locations of specified bits are confined to only a few scan chains. In order to illustrate this phenomenon, consider data collected from four industrial designs using EDT technology. The characteristics of these exemplary designs are reported in Table 1. FIGS. 2(a)-2(d) are graphs 200, 202, 204, 206, and show the distributions of the number of scan chains having specified bits for all primary target transition faults in the circuits C1-C4. Note that the number of scan chains with specified bits is counted before dynamic compaction. As can be seen, the majority of test cubes feature specified bits in less than 20% of the scan chains, and no test cube has specified bits in more than 50% of the scan chains.

TABLE 1

Characteristics of the Circuits Considered

| Circuit | # of scan cells | # of scan chains | # of scan channels | # of gates | # of transition faults |
|---|---|---|---|---|---|
| C1 | 45.4K | 100 | 1 | 0.89M | 2.0M |
| C2 | 156.1K | 128 | 8 | 2.4M | 6.0M |
| C3 | 142.9K | 1200 | 24 | 2.5M | 6.1M |
| C4 | 321.5K | 320 | 32 | 5.5M | 9.6M |

Dynamic compaction is typically used to reduce the pattern count during test generation. Starting from a test cube generated for a primary target fault, dynamic compaction expands this cube to cover additional faults by assigning appropriate values to the unspecified positions. As a result, the number of scan chains having specified bits gradually increases as dynamic compaction progresses. To employ scan chains that have no specified bits and that can be used to reduce toggling during test application, one desirably maximizes the number of such scan chains while minimizing the possible impact on the pattern count during dynamic compaction. To analyze the correlation between the pattern count and the number of scan chains with specified bits during test generation with dynamic compaction, one can limit the number of scan chains with specified bits. For instance, according to one exemplary embodiment, dynamic compaction can be carried out only if a test cube has less than a specified quantity (e.g., 20%) of scan chains with specified bits; and, among the scan chains with no specified bits, some specified quantity (e.g., 50%) of the total number of scan chains can be chosen randomly, and the scan cells in those scan chains can be filled with a constant value. For the rest of the unspecified bits, their logic values can be determined by the decompressor.

Figure 4:
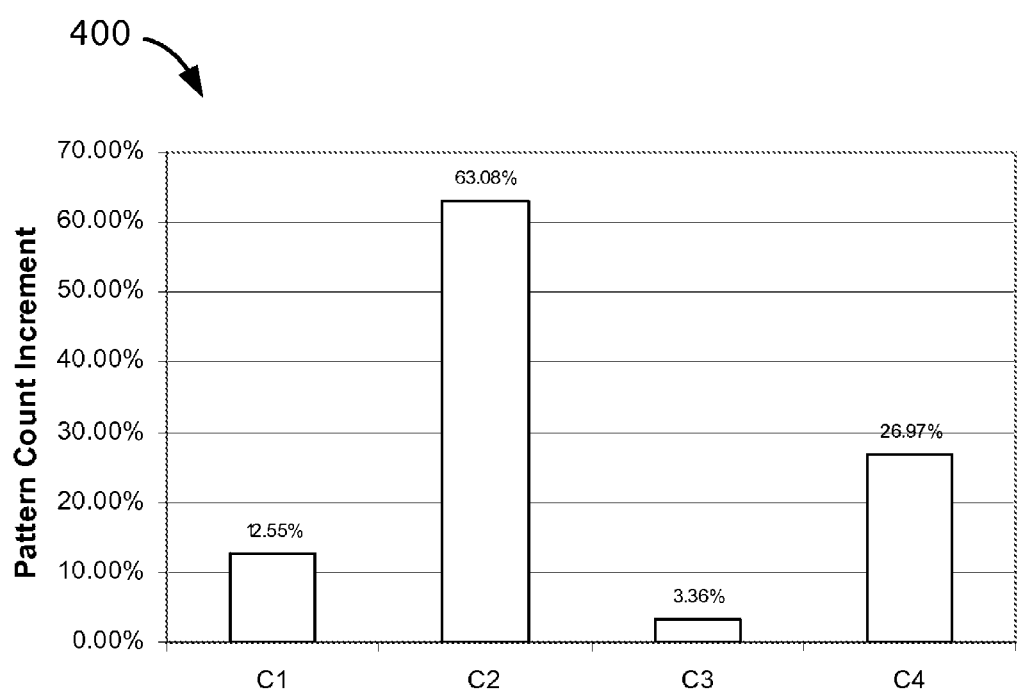
FIG. 4 is a graph showing the pattern count increase for a test generation scheme with a restricted number of scan chains having specified bits as compared to a test generation scheme that has no restrictions for the exemplary test circuits.
Figure 5A:
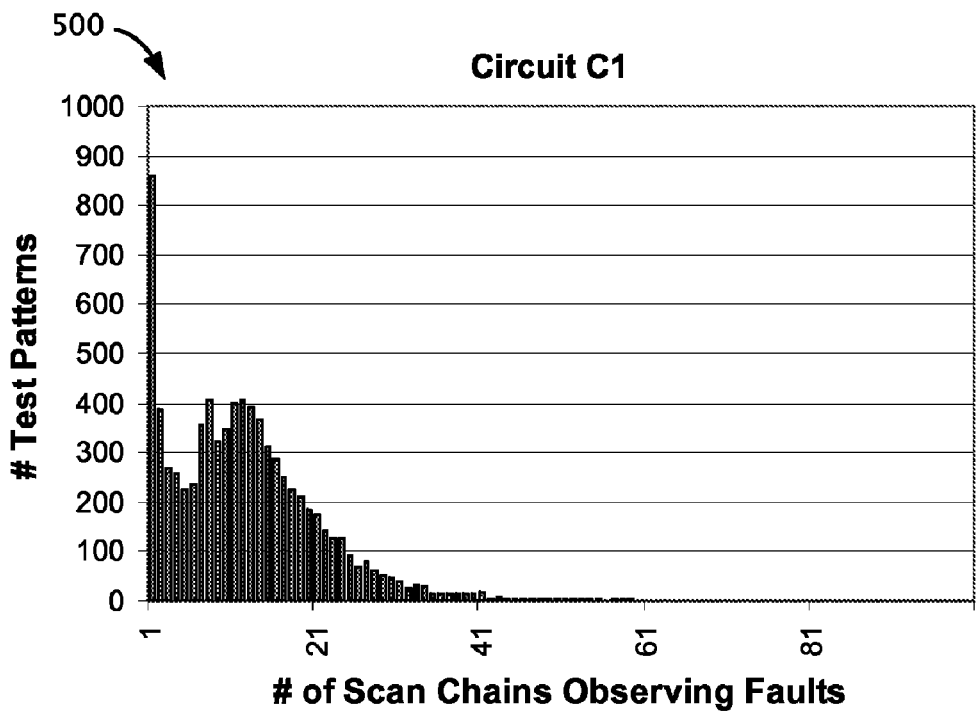
FIGS. 5(a)-5(d) are graphs showing the number of scan chains observing additional detected faults for the exemplary test circuits.
Figure 5B:
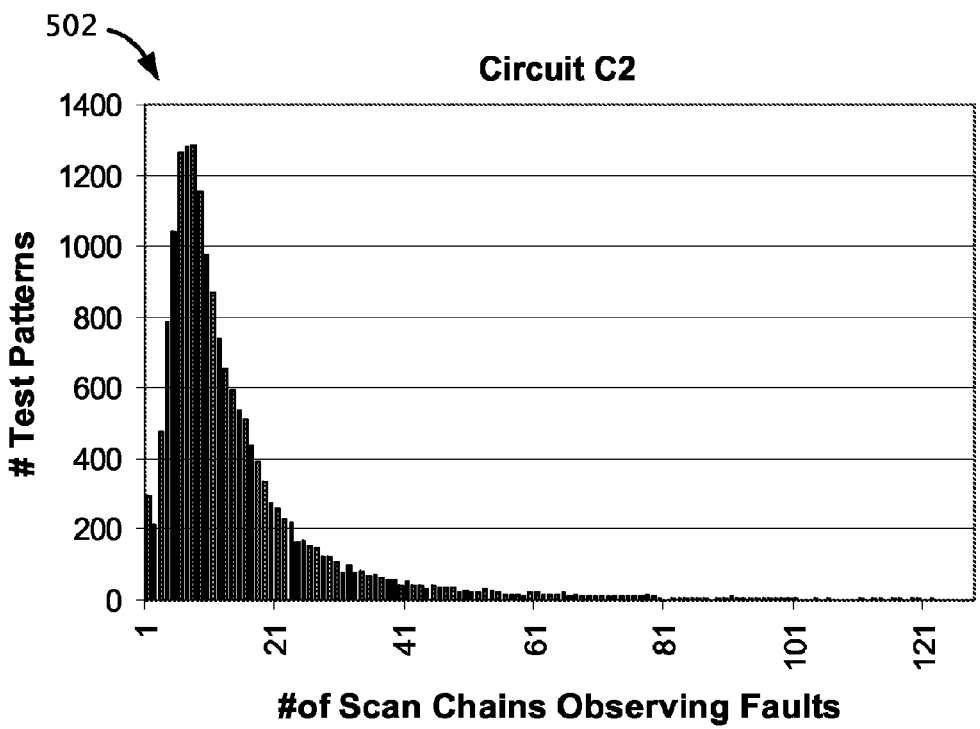
Figure 5C:
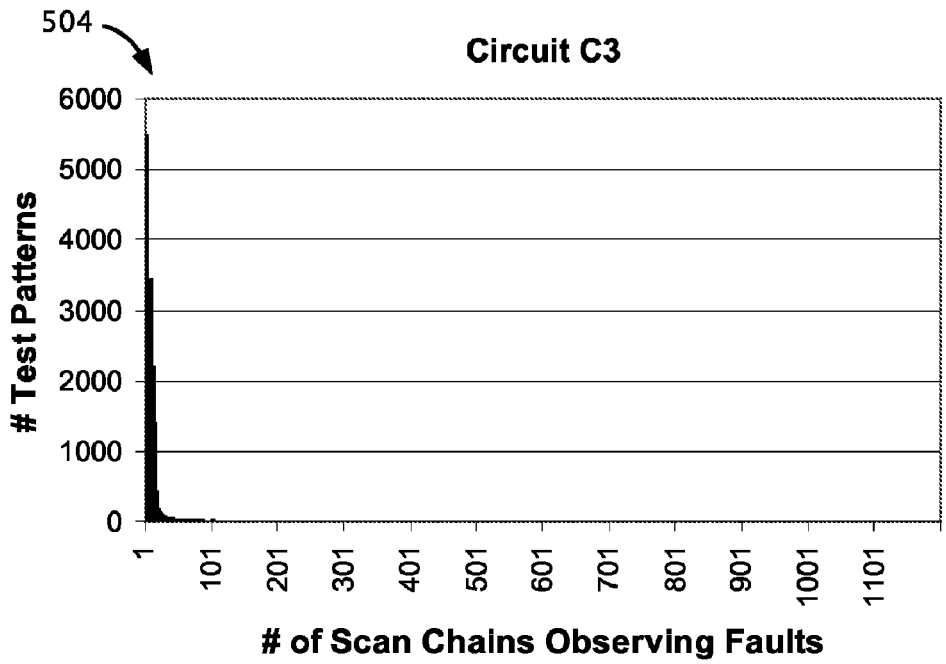
Figure 5D:
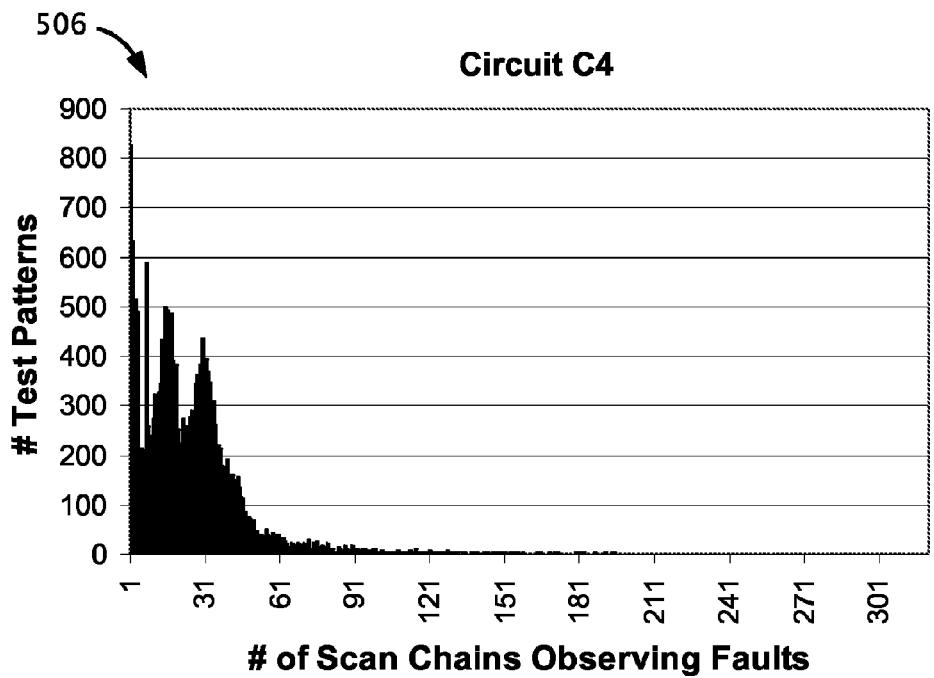

The distribution of scan chains with specified bits after dynamic compaction for the circuits C1-C4 is shown in graphs 300, 302, 303, 304 of FIGS. 3(a)-3(d). As can be seen, the majority of test cubes have specified bits in less than 20% of the scan chains. Furthermore, the use of the exemplary technique limiting dynamic compaction to situations where the number of scan chains with specified bits is low (e.g., 20%) has only a moderate impact on the pattern count. For instance, graph 400 in FIG. 4 shows the pattern count increase as compared to a test generation scheme that has no restrictions as far as scan chains hosting specified bits are concerned for the circuits C1-C4. For graph 400, a conventional EDT environment (e.g., as shown in FIG. 1) was used as an experimental platform. Moreover, there was no fault coverage loss reported due to the new test generation technique.

One can take advantage of the above observations by feeding the scan chains with specified bits directly from a test data decompressor while replacing "don't care" bits in the remaining chains with a constant value. Such an approach can significantly reduce the number of transitions during scan-in shifting, as shown in the following sections.

Besides reducing the switching activity from the test stimulus point of view, it is also possible to analyze the number of scan chains used to observe fault effects for the faults not detected by the previously applied test patterns. The distribution of the number of scan chains observing additional detected faults for the circuit C1-C4 is shown in graphs 500, 502, 504, 506 of FIGS. 5(a)-5(d). The test patterns applied in these examples were generated with 50% of the total number of scan chains driven by a decompressor while the remaining scan chains were driven by a constant 0. All the scan chains in this example were used as observation points during fault simulation. As can be seen, the majority of scan chains did not observe additional detected faults. One can take advantage of this observation to reduce the switching activity for both the scan shift phase and the capture phase of testing by preventing new data/different data from being captured into the scan cells during the capture phase. Whenever possible, it is also desirable to reduce the impact of unknown values on test response compaction. Exemplary techniques for achieving one or more of these objectives are introduced in the following sections. The technology described below further includes exemplary hardware architectures for performing the described techniques. Although particular representative implementations of the hardware architectures are shown, various other alternative arrangements based on the described principles are also possible (e.g., using alternative logic or arrangements of logic that achieve substantially the same functionality). All such alternative arrangements and their equivalents are considered to be within the scope of this disclosure.

III. Low-Power Loading Operations

Scan architectures typically have a single test stimulus source. Therefore, the embodiments disclosed below include only a single original test stimulus source. The low-power techniques described, however, can be readily extended to other scan-based architectures having multiple test stimulus sources.

A. Exemplary Architectures of Programmable Test Stimulus Selectors

Figure 6:
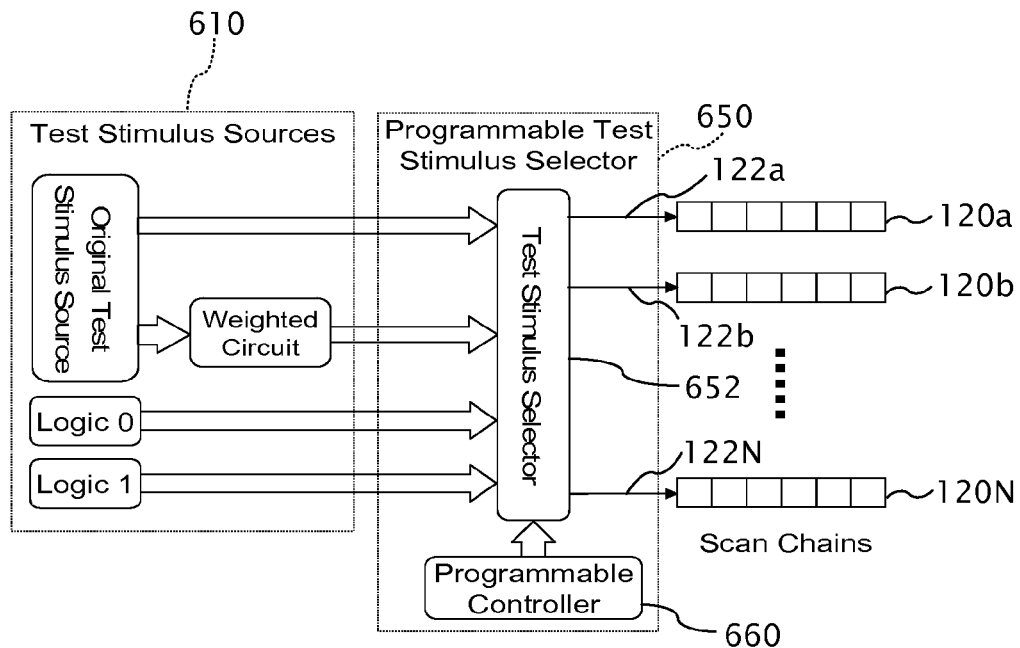
FIG. 6 is a schematic block diagram of a first exemplary embodiment of an integrated circuit comprising a programmable test stimulus selector.

To reduce switching activity during scan shifting, and thereby reduce power consumption, one or more programmable selectors can be logically positioned between a test stimulus source and scan chain inputs. FIG. 6 is a schematic block diagram illustrating a generalized version of a programmable selector 650 that is positioned between test stimulus sources 610 (comprising an original stimulus source, a weighted circuit coupled to the original stimulus source, a logic 0 source, and a logic 1 source) and scan chain inputs 122a, 122b, 122N of scan chains 120a, 122b, 122N.

The exemplary programmable selector 650 can comprise one or more test stimulus selectors 652 and one or more programmable controllers 660. A single test stimulus selector can be coupled, for example, to more than one scan chain input. Furthermore, the programmable selector 650 can be driven, for example, by multiple sources of test data. In the illustrated embodiment, for instance, four types of test data are possible as test stimulus: original test stimulus biased by a biasing circuit, original test stimulus not biased by a biasing circuit, constant values of 0, or constant values of 1.

An exemplary test application method using the exemplary programmable selector 650 comprises loading control data of the test stimulus into the programmable controller; providing the test stimuli from the original test stimulus source; shifting the test stimuli into the scan chains; at each scan shift cycle, using the programmable controller to determine the source passing through the test stimulus selector; applying capture clocks; and unloading test responses from the scan chains. The switching activity created during scan shifting can be reduced by reducing the amount of toggling that occurs in successive scan cells during scan chain loading. Such a reduction can be achieved by performing any one or more of the following acts: loading a constant 0 or 1 into a group of scan chains; loading a constant 0 or 1 into one or more segments of a scan chain; or employing a weighting circuit to increase the probability of receiving the same logic value in consecutive scan cells when the scan chains are driven by the original test stimulus source.

The programmable controller in one exemplary form increases the flexibility of selecting a test stimulus source during scan shift operations while reducing the hardware overhead and additional test data volume for each test pattern.

Figure 40:
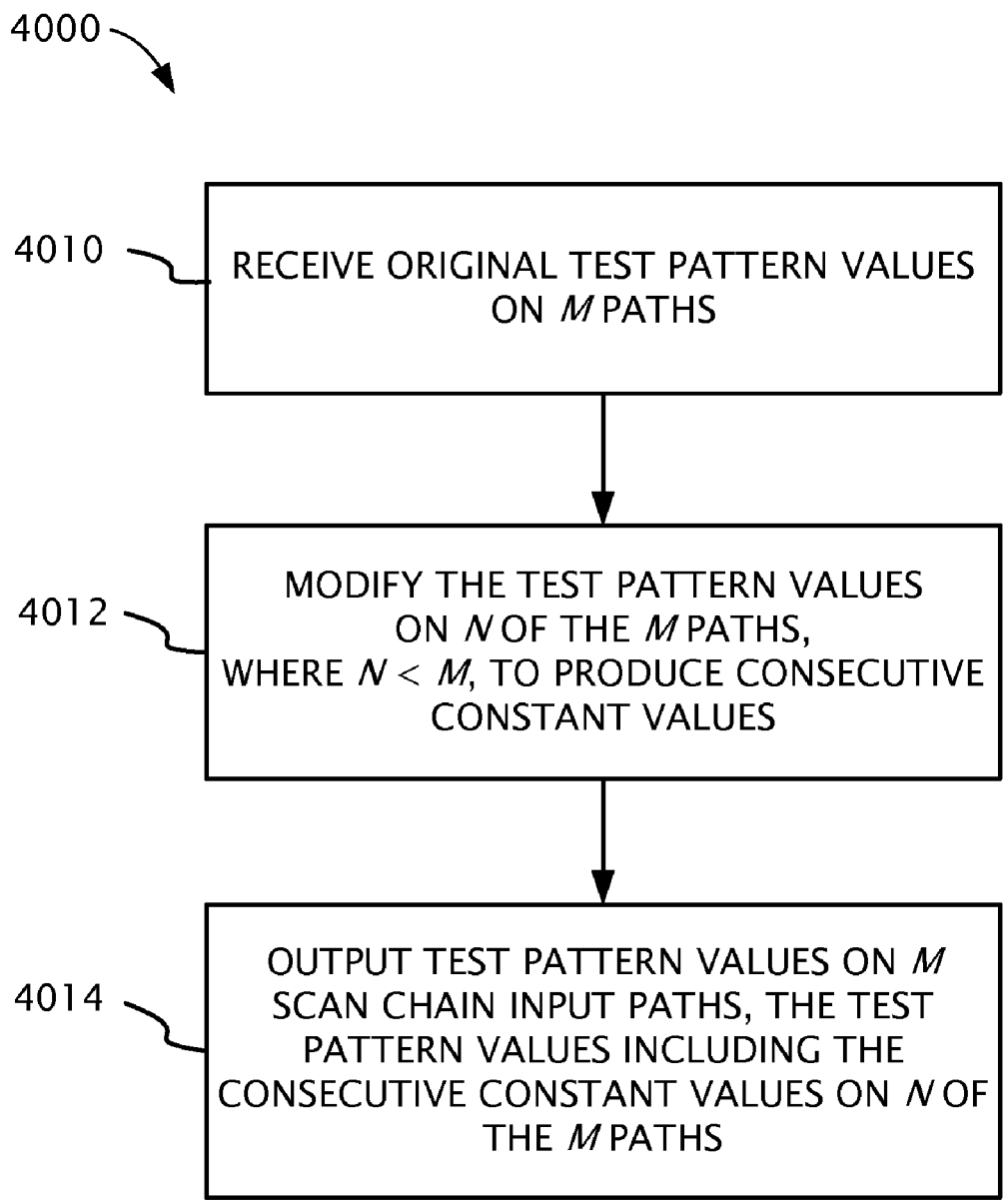
FIG. 40 is a flowchart of an exemplary method for selectively modifying test pattern values to be loaded into scan chains of an integrated circuit.

FIG. 40 is a flowchart of one exemplary method for selectively modifying test pattern values using, for example, a programmable test stimulus selector. At 4010, original test pattern values for testing an integrated circuit are received on m paths. The original test pattern values can be received, for example, from a decompressor. At 4012, the test pattern values on at least n of the m paths are selectively modified, where n is less than m, so that the test pattern values on the n paths become at least two consecutive constant values. At 4014, test pattern values are output on m scan chain input paths. These test pattern values include the at least two consecutive constant values on n of the m scan chain input paths. In certain implementations, control data indicating which of the m input paths are to be modified is received. The control data can be reused for multiple additional test patterns. The outputted test pattern values can include all specified bits of the original test pattern that target one or more faults in the integrated circuit. Further, and in certain implementations, the test pattern values can be modified at 4012 in response to control signals being applied to logic gates configured to produce the at least two consecutive constant values.

1. Exemplary Test Stimulus Selectors

Figure 7:
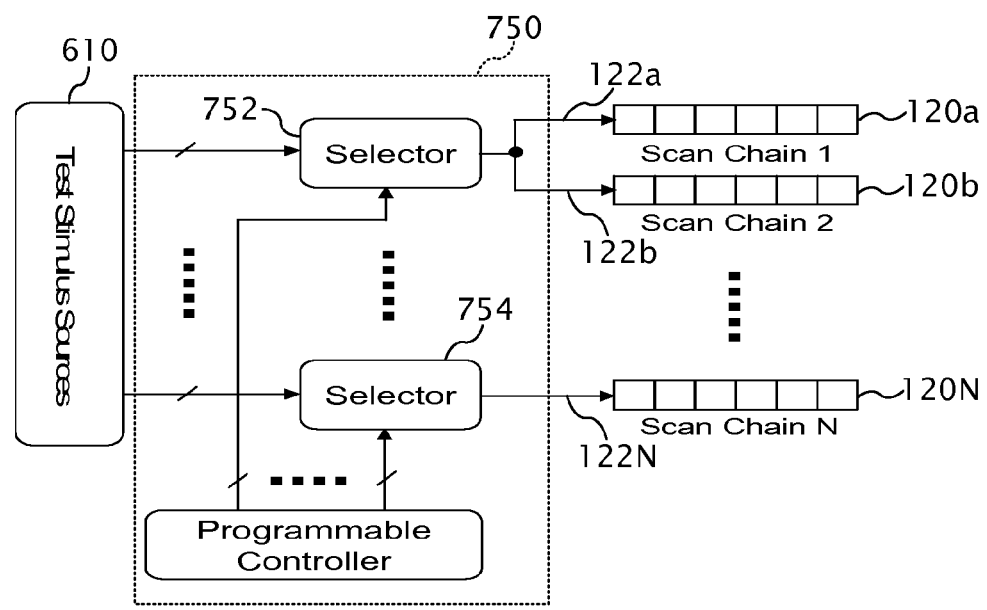
FIG. 7 is a schematic block diagram of a second exemplary embodiment of an integrated circuit comprising a programmable test stimulus selector.

An exemplary test stimulus selector can comprise a group of selectors with the same or different functionality. FIG. 7 is a schematic block diagram of a programmable test stimulus selector 750 that may be used as the programmable test stimulus selector 650 of FIG. 6 and that includes multiple selectors, each coupled to one or more scan chains. For example, as shown in FIG. 7, a selector can drive a single given scan chain (such as selector 754 shown driving scan chain 120N) or can drive a group of two or more scan chains (such as selector 752 shown driving scan chains 120a, 120b).

Figure 8:
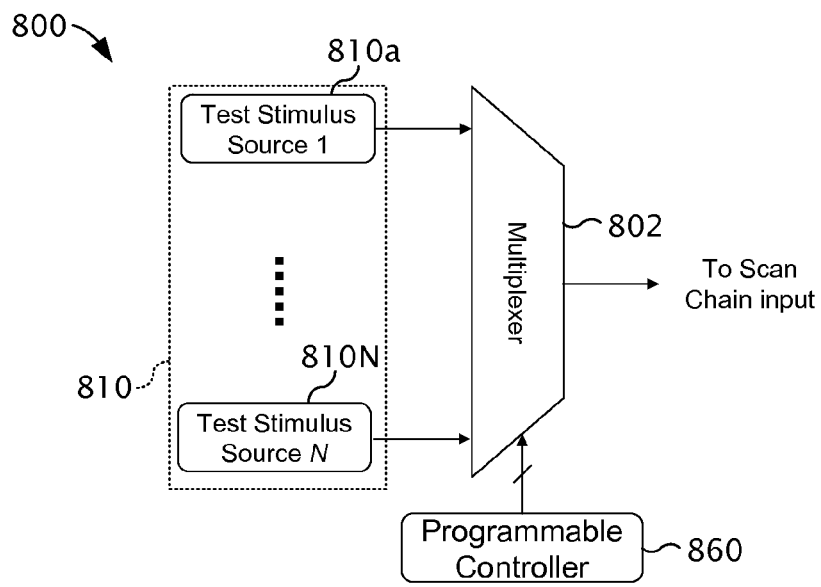
FIG. 8 is a schematic block diagram of an exemplary selector circuit as may be used in the embodiments of FIG. 6 or FIG. 7.

An exemplary form of selector is shown in the schematic block diagram of FIG. 8 and has two or more inputs and a single output. The illustrated selector 800 can be used, for example, as one of the selectors 752, 754 illustrated in FIG. 7. Each of the inputs of the selector is driven by a selected test stimulus source from among multiple test stimulus sources 810. In FIG. 8, the test stimulus sources can comprise any number of test stimulus sources and are represented as test stimulus source 810a to test stimulus source 810N. The other inputs to the selector 800 in this example are coupled to the programmable controller 860 and are used to control which one of the test sources 810a-810N is to be passed to the output of the selector 800. Depending on the type of test sources available, the implementation of the selector can be optimized to reduce its area overhead. In FIG. 8, for example, a multiplexer 802 is used to implement the selector 800.

Figure 9:
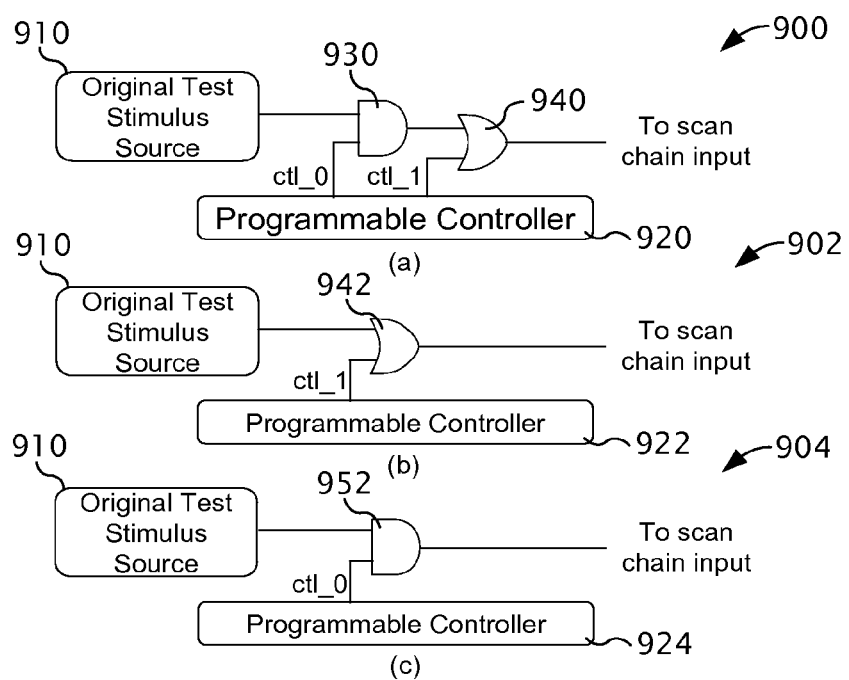
FIGS. 9(a)-9(c) are schematic block diagrams of exemplary selector circuits as may be used in the embodiments of FIG. 6 or FIG. 7.

Other exemplary forms of selectors as may be used for the test stimulus selection circuitry are shown in FIGS. 9(a)-9(c). In particular, FIGS. 9(a)-9(c) show three exemplary selectors 900, 902, 904. Selector 900 is coupled to an original stimulus source 910 and is controlled by programmable controller 920 to produce either the value output from the original stimulus source 910, a logic 0, or a logic 1, using AND gate 930 and OR gate 940. Selector 902 is coupled to the original stimulus source 910 and is controlled by the programmable controller 922 to produce either the value output from the original stimulus source 910 or a logic 1 using OR gate 942. Selector 904 is coupled to the original stimulus source 910 and is controlled by the programmable controller 924 to produce either the value output from the original stimulus source 910 or a logic 0 using AND gate 952.

The encoding patterns that can be used to select the values to be loaded into the scan chain input using the embodiments of FIGS. 9(a)-9(c) are set forth in Table 2.

TABLE 2

| | Encoding of Control Signals | | | |
|---|---|---|---|---|
| | FIG. 9(a) | | FIG. 9(b) | FIG. 9(c) |
| Test Stimulus Source | ctl_0 | ctl_1 | ctl_1 | ctl_0 |
| Original | 1 | 0 | 0 | 1 |
| Logic 0 | 0 | 0 | Not Available | 0 |
| Logic 1 | X | 1 | 1 | Not Available |

2. Exemplary Programmable Controllers

The programmable controller 660 of the exemplary architecture shown in FIG. 6 can receive control data from, for example, an external tester, an embedded test generator, or an embedded ROM. In general, the controller 660 is responsible for providing signals that select a test stimulus source during each scan shift cycle. According to one exemplary embodiment, a programmable controller desirably exhibits two properties: it controls each available selector circuit independently; and it selects a test stimulus source in a cycle-based manner. In other embodiments, the programmable controller is configured to select the test stimulus source one scan-chain-segment-by-scan-chain-segment basis or test-pattern-by-test-pattern basis.

Figure 10:
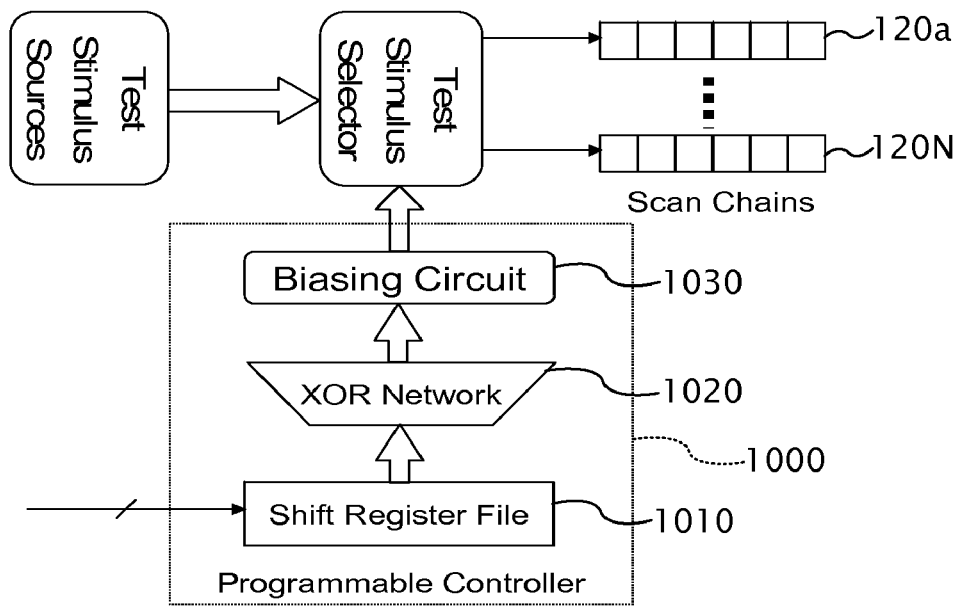
FIG. 10 is a schematic block diagram of an exemplary programmable controller as can be used in the embodiments of FIG. 6 or FIG. 7.

An exemplary implementation of the programmable controller 660 is shown in the schematic block diagram of FIG. 10. The illustrated controller 1000 comprises a shift register file 1010, an XOR network 1020, and an optional biasing circuitry 1030. The shift register file 1010 (representing an arrangement of two or more shift registers) stores the compressed control data. The compressed control data can be delivered, for instance, from a source such as an external tester, an embedded test generator, or an embedded ROM. That data is decompressed by means of the XOR network 1020 and passes through the biasing circuitry 1030 before driving the test stimulus selector.

Figure 11:
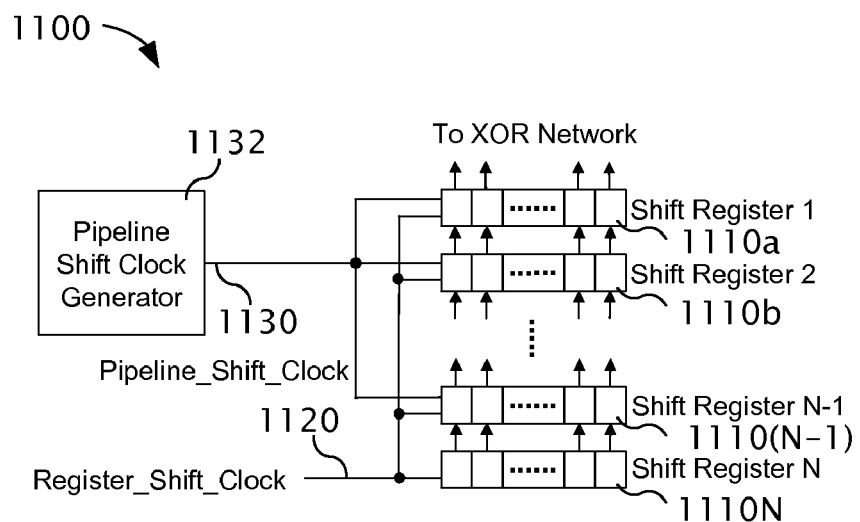
FIG. 11 is a schematic block diagram of an exemplary shift register file as may be used in the controller of FIG. 10.

FIG. 11 illustrates an exemplary implementation 1100 of the shift register file 1010. The illustrated shift register file 1100 comprises N shift registers (numbered 1110a-1110N in this example) and employs a clock Register_Shift_Clock signal 1120 to shift the control data into each of its state elements (e.g., the flip-flops of the shift register). Although not illustrated, the registers in the register file 1100 can also be coupled to each other in a concatenated fashion so that control can be serially shifted into the register file in response to the shift clock. Alternatively, each of the registers in the register file can load data through its own dedicated input. In the illustrated embodiment, each register file contains the control data that selects a different test stimulus source for a scan chain segment during scan shift operations.

As illustrated in FIG. 11, the N shift registers can form an N-stage register pipeline. A pipeline clock signal (Pipeline_Shift_Clock) 1130 is generated by a pipeline shift clock generator 1132. This implementation allows one to dynamically change test patterns up to N times during scan shift operations. In some implementations, the test source for each scan chain is fixed during the entire scan shift operation. In such implementations, it is possible to use only one shift register, as there is no need to include a pipeline shift clock generator.

Figure 12:
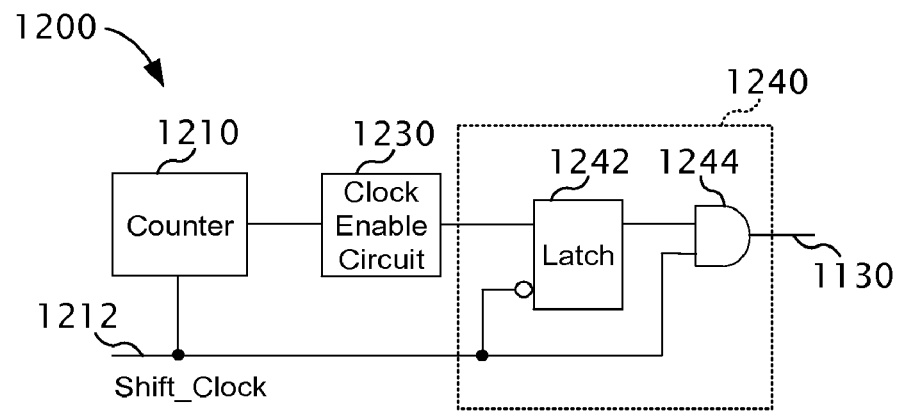
FIG. 12 is a schematic block diagram of an exemplary clocking circuit for the shift register file of FIG. 11.

One exemplary implementation 1200 of a pipeline shift clock generator as may be used for the generator 1132 in FIG. 11 is shown in FIG. 12. The circuit 1200, in the exemplary form shown, includes a counter 1210 coupled to a Shift_Clock signal line 1212. The counter 1210 has an output coupled to a clock enable circuit 1230. The clock enable circuit 1230 outputs a 1 (or other appropriate value) every k cycles to shift the pipeline register file. The illustrated form of clock gating logic 1240 is a glitch-free design, and comprises or consists of a latch 1242 and an AND gate 1244. The Shift_Clock signal line 1212 can be controlled directly from an external tester. In such a case, there is no hardware overhead related to the pipeline shift clock generator. The Shift_Clock signal may, in some cases, be the Register_Shift_Clock signal.

Figure 13:
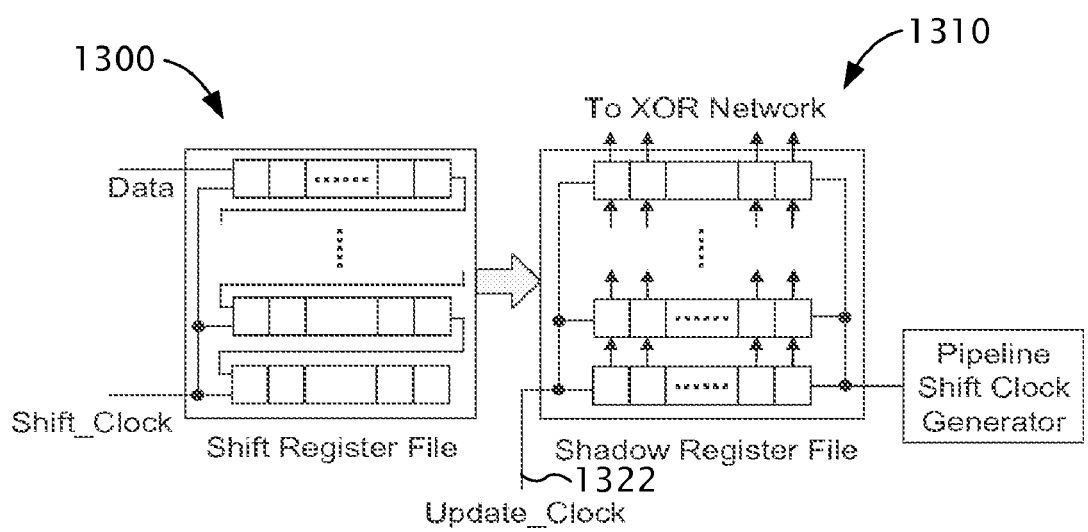
FIG. 13 is a schematic block diagram of an exemplary shift register file using a shadow register as may be used in the controller of FIG. 10.

In order to reduce the test application time, and as shown in FIG. 13, a shift register file 1300 can be implemented with a shadow register file 1310. For example, the control data for test pattern $t_i$ can be shifted into the shift register file 1300 in parallel while loading test pattern $t_{i-1}$ to the scan chains through the shadow register file 1310. Before loading test pattern $t_i$, the Update_Clock signal 1322 (also referred to as the Copy_Clock signal) can be activated in order to move the control data from the shift register file 1300 to the shadow register file 1310 within one clock period. The control data in the shadow register file 1310 can then be used to select the test stimulus source while loading test pattern $t_i$.

The architecture shown in FIG. 13 uses N shift registers and N shadow registers to support changing the control data N times during scan shift. To reduce area overhead, the registers shown in FIG. 13 can be replaced with a single shift register and a single shadow register.

To change the control data N times during scan shift in this example, a control procedure can be performed. An example of a suitable control procedure is described below. For purposes of this example, let $S_i$ be the number of scan cells to be loaded into the $i^{th}$ scan segment, where $i \in [1,N]$ and $$\sum_{i=1}^{N} S_i$$

is equal to the scan chain length. Further, let scan segment $S_1$ be the segment closest to the scan output pin and scan segment $S_N$ be the one closest to the scan input pin. Finally, let L be the length of the shift register. The exemplary control procedure is set forth in the pseudocode in Table 3.

TABLE 3

Exemplary Pseudocode for Controlling Shifting in Architectures Using Shadow Registers 1. Load the control data for shifting in scan segment $S_1$ and copy it to the shadow register.
2. Set i = 1.
3. While i < N, do
   (a) Shift test stimuli for the scan segment $S_i$ into scan chains and shift the control data for the scan segment i + 1 into the shift register. If $S_i$ is greater than L, pad ($S_i$ − L) extra bits before the control data such that the last control bit is shifted in at the same time as the last test pattern bit in $S_i$. If $S_i$ is less than L, load (L − $S_i$) control bits to the shift register first while stopping scan shift operation for (L − $S_i$) clock cycles. Then load the scan chain and the control data simultaneously.
   (b) Stop scan shift operation for one or more clock cycles and use these clock cycles to copy the control data from the shift register to the shadow register.
   (c) i = i + 1.

It should be noted that the method acts of the exemplary procedure can be performed alone or in various combinations and subcombinations with one another depending on the implementation.

The XOR network 1020 of the exemplary controller 1000 shown in FIG. 10 can be designed as an N-input, M-output linear mapping circuit, where N and M are the numbers of control bits and inputs of the biasing circuit, respectively. In other words, each output of the block can be obtained by XOR-ing certain control bits whose identity is provided by a b-term polynomial. The XOR network 1020 can be configured in such a way that high encoding efficiency is obtained (e.g., close to a 100% ratio of successfully encoded pre-specified output signals to the number of control bits). Furthermore, it should be understood that the XOR network can be implemented using other types of logic gates (e.g., XNOR gates or other such linear logic gates).

A biasing circuit (such as biasing circuit 1030 in FIG. 10) can be employed to increase the probability of producing a binary 0 or 1 at any one or more respective outputs of the XOR network 1020. Assuming that every input of the biasing circuit sees substantially a 50-50 split of zeros and ones, a biasing circuit implemented by, for example, a two-input AND (OR) gate increases the probability of having the value 0 (1) to 75% while reducing the probability of having the value 1 (0) to 25%.

Figure 14:
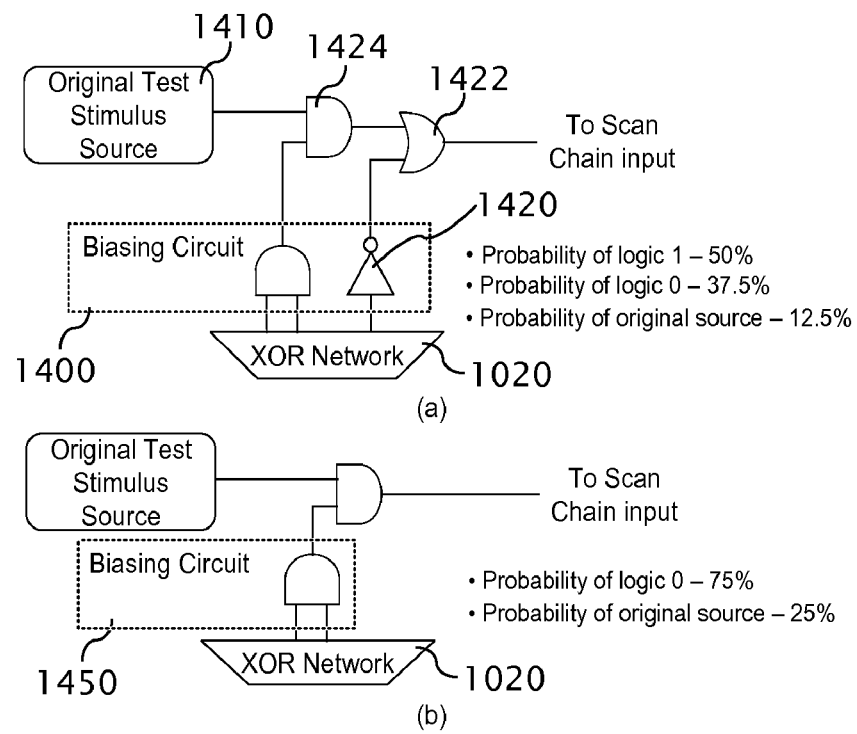
FIGS. 14(a)-14(b) are schematic block diagrams of exemplary biasing circuits as can be used in the controller of FIG. 10.

Two implementations 1400, 1450 of exemplary biasing circuitry are shown in FIGS. 14(*a*) and 14(*b*), respectively. The exemplary biasing circuitry 1400 in FIG. 14(*a*) is configured to provide three test stimulus sources. For instance, with the illustrated biasing circuit 1400, the probabilities of selecting an original test stimulus source 1410, selecting the constant 0, or selecting the constant 1 are 12.5%, 37.5%, and 50%, respectively. The exemplary biasing circuitry 1450 in FIG. 14(*b*) is configured to provide two test stimulus sources. For instance, with the illustrated biasing circuit 1450, the probabilities of selecting an original test stimulus source 1410, or selecting the constant 0 are 25% and 75%, respectively. The fraction of scan chains driven by the decompressor can be changed in the manner of FIG. 14(*a*) by adding more inputs to the AND gates on the outputs of the XOR network. For example, the addition of 3-input AND gates reduces this percentage down to 6.25%, while the fraction of scan chains getting the constant 0 increases accordingly.

It should be understood that a variety of different biasing circuits can be generated using different combinations of logic gates and depending on the desired probabilities of selecting the various possible test stimuli sources. Such variations would be understood by those of ordinary skill in the art and need not be set forth in detail here.

When the original test stimulus source is a decompressor, the actual number of scan chains that can be driven by the decompressor may depend on the encoding capabilities of the programmable controller. Because the encoding process is equivalent to solving a set of linear equations (see, e.g., U.S. Pat. No. 6,327,687), setting an output signal of the XOR network 1020 to a pre-specified value requires, on the average, one control bit (e.g., one variable). Therefore, for the biasing circuit 1400 shown in FIG. 14(*a*), it will typically be necessary to solve three equations (one per each gating signal) in order to drive the associated scan chain with specified bits. However, if a scan chain contains specified bits of only one value, the scan chain can be driven by a matching constant value. In such cases, it is usually possible to encode the control bits with fewer than three equations (e.g., just one equation). For instance, if the required constant is equal to 1, then it suffices to use an equation for the XOR network 1020 that represents the gating signal driving the OR gate 1422 and that is set to 0 (since inverter 1420 will cause the 0 to become a 1, thereby causing OR gate 1422 to output only 1s). If all specified bits are 0s, then the signal driving the OR gate 1422 can be set to 1. This does not force a constant 0 in the scan chain yet, as AND gate 1424 should also have a 0 on its input. However, to preserve the encoding capacity, one can choose not to use another equation. In this situation, two scenarios are possible: either the signal driving the AND gate 1424 is set to 0 and the scan chain receives the constant 0, or the decompressor feeds the scan chain with test data consistent with the specified 0s.

Figure 15:
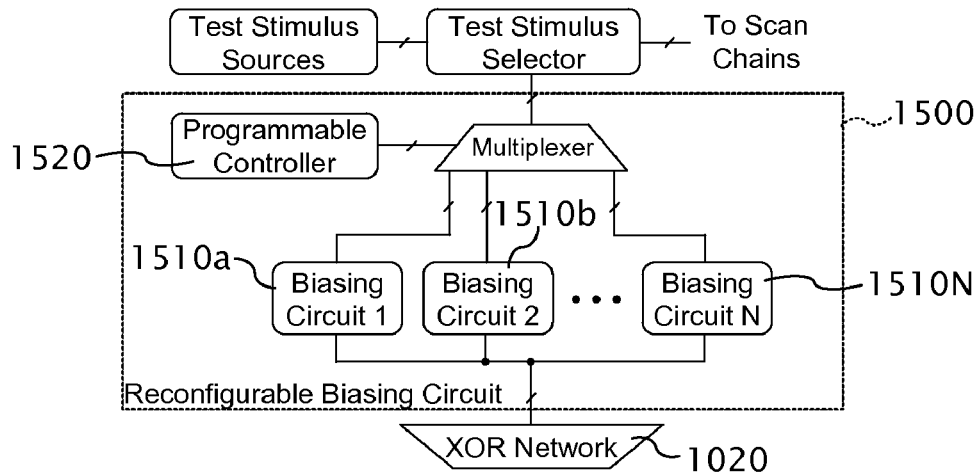
FIG. 15 is a schematic block diagram of an exemplary reconfigurable biasing circuit as can be used in the controller of FIG. 10.

To enhance the ability of a biasing circuit to reduce the switching activity during scan-in shifting, the biasing circuit (such as biasing circuit 1030 shown in FIG. 10) can be designed as a reconfigurable device. An exemplary form of a reconfigurable biasing circuit 1500 is shown in FIG. 15. This example comprises or consists of plural biasing circuits 1510*a*-1510N with different probabilities of selecting test stimulus sources. A programmable controller 1520 can be used to select one of the biasing circuits 1510*a*-1510N. Control data can be loaded into the programmable controller 1520 using, for example, an external tester, an internal test generator, or an embedded ROM. Depending on the implementation, the reconfigurable biasing circuit 1500 of FIG. 15 can be used in two modes: (1) the selected biasing circuit 1510*a*-1510N can remain unchanged during the whole scan shift period; or (2) various biasing circuits 1510*a*-1510N can be chosen for different scan chain segments during scan shift. The architecture of the programmable controller 1520 can be the same as that of the other programmable controllers discussed above and used to control the test stimulus selector 652.

Figure 16:
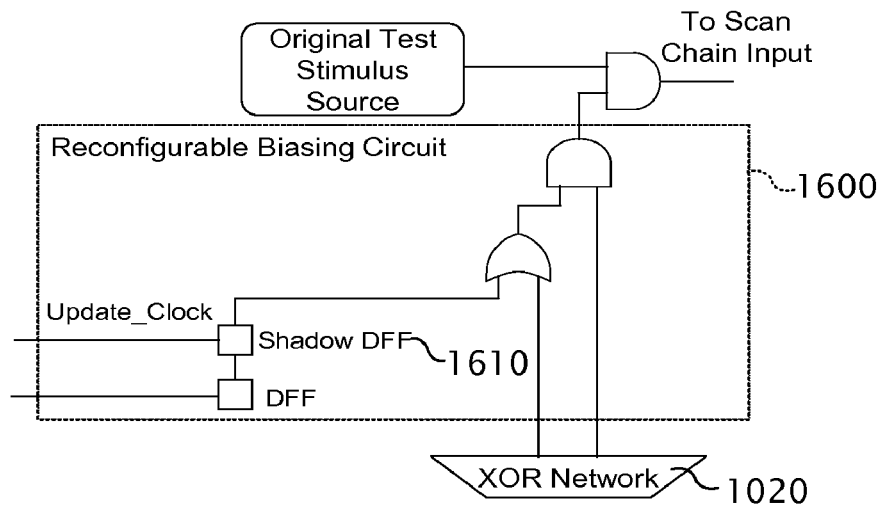
FIG. 16 is a schematic block diagram of another exemplary reconfigurable biasing circuit as can be used in the controller of FIG. 10.

Another form of a reconfigurable biasing circuit 1600 is shown in FIG. 16. In this particular implementation, the probability of selecting the original test stimulus or the constant 0 is 50%, provided that the control data loaded into shadow data flip flop 1610 ("DFF") is equal to 1. On the other hand, if the control data loaded into the shadow DFF 1610 is set to 0, then the probability of selecting the original test stimulus source or the constant 0 is 25% or 75%, respectively.

B. Low Power Test Generation for Architectures Having Programmable Controllers

Figure 17:
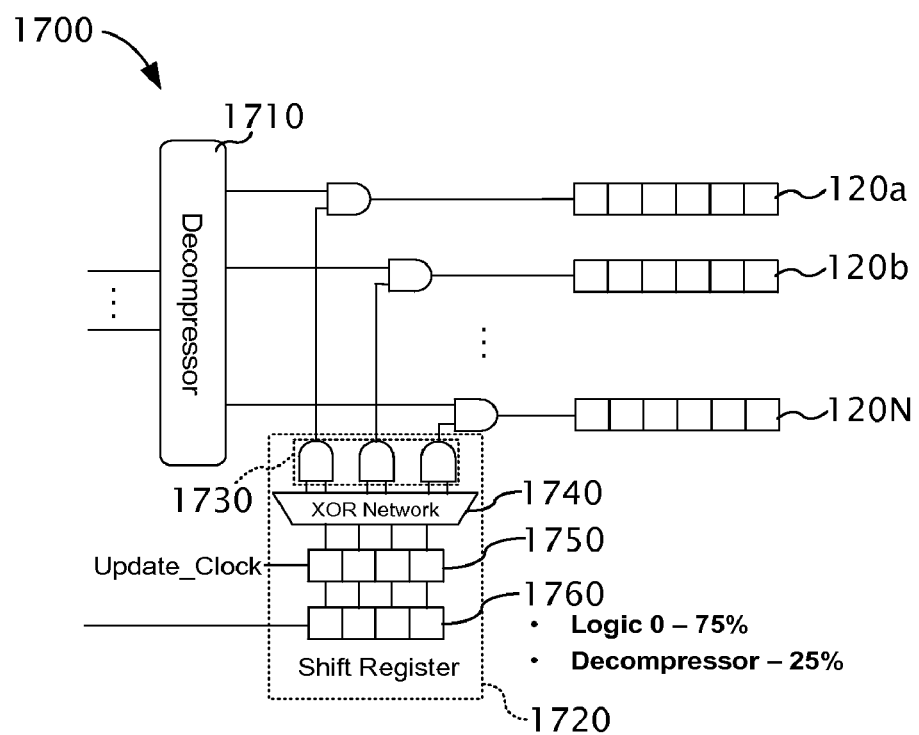
FIG. 17 is a schematic block diagram of an exemplary circuit having a test stimulus controller with a biasing circuit.

During automatic test pattern generation ("ATPG"), the test generation procedure can be adapted to take into account the existence of a programmable controller (e.g., to take into account the area limitations of the programmable controller). FIG. 17 is a schematic block diagram illustrating one exemplary architecture 1700 for which the ATPG procedure can be used. For purposes of the example in FIG. 17, assume that the test stimulus selector is implemented as a decompressor 1710 (e.g., an EDT decompressor). In the illustrated embodiment, there are two types of test stimulus sources: a decompressor 1710 and a constant 0. In this example, the constant 0 is produced by controller 1720, which comprises a biasing circuit 1730 of AND gates, an XOR network 1740, a shadow register 1750 and a shift register 1760. The type of test stimulus source driving a scan chain can remain unchanged during a scan loading operation. For example, the XOR network 1740 can be designed in such a way that loading shadow register 1750 with an all-1 pattern will result in all of the scan chains being driven by the decompressor 1710.

An exemplary procedure for generating test patterns for the architecture shown in FIG. 17 is set forth in the following pseudocode. It should be noted that this procedure can be readily extended to other architectures with other decompression hardware and/or other programmable test selectors.

TABLE 4

Exemplary Pseudocode for Generating Test Patterns with the Exemplary Test Stimulus Selector of FIG. 17
Exemplary Procedure: generate_tests_with_test_stimulus_selector 1. Identify hardware limitations of the test stimulus selector. (The exemplary hardware shown in FIG. 17 can select up to 75% of scan chains to be driven by the constant 0.)
2. Set test set T to be empty.
3. Set the maximum number of scan chains that are driven by the decompressor to N. (For the hardware of FIG. 17, N should not be greater than 25% of the total number of scan chains.)
4. While target fault list F is not empty, do:
   a. Set test cube C to an all-x pattern.
   b. Pick a fault f from F and remove it from F.

TABLE 4-continued

Exemplary Pseudocode for Generating Test Patterns with the Exemplary
Test Stimulus Selector of FIG. 17
Exemplary Procedure: generate_tests_with_test_stimulus_selector c. Generate test cube $C_f$ for f.
    d. If f is untestable, continue from step 4.
    e. Merge $C_f$ with C and set S to be the number of specified scan chains in C.
    f. Mark every fault in F as untried.
    g. While there exist untried faults in F and S is not greater than N, do:
        i. Pick an untried fault g from F and mark it as tried.
        ii. Assign C to $C_g$.
        iii. Expand $C_g$ by specifying additional x bits in $C_g$ to detect g.
        iv. If fault g cannot to be detected by expanding $C_g$, or the number of specified chains in $C_g$ is greater than S, continue from act 4(g).
        v. Remove g from F.
        vi. Assign $C_g$ to C and set S to be the number of specified chains in C.
    h. Generate control data to be loaded into the programmable controller such that for scan chains having specified bits, the corresponding gating signals are set to 1, and for the remaining scan chains, the corresponding gate signals are set so that the scan chains are driven by the constant 0.
    i. Generate a new test pattern t by filling unspecified bits in C based on their test sources assigned from the control data.
    j. Fault simulate t and drop detected faults from F.
    k. Add t to test set T.
5. Return generated test set T.

It should be noted that the method acts of the exemplary procedure can be performed alone or in various combinations and subcombinations with one another depending on the implementation.

The exemplary procedure set forth in Table 4 includes a procedure that provides an additional check (e.g., before act 4(g)(v)) to verify whether the control data for the test selector 1740 can be generated such that all the scan chains with specified bits can be driven by the decompressor. If the control data cannot be generated for the test cube $C_g$, it can be discarded and the original test cube can be kept unchanged. Moreover, if the only specified bits in a scan chain are 0s, then, in this example, there is no need to count this chain in S.

FIG. 44 is a flowchart of another exemplary embodiment for test pattern generation according to the disclosed technology. At 4410, the number of scan chains to be driven by an original test stimulus source is determined. The number is typically less than the number of available scan chains in a circuit design. In certain implementations, the original test stimulus source is a decompressor configured to decompress compressed test patterns provided by an external tester. In some implementations, the encoding capacity of a controller for a test stimulus selector is used to determine the number of scan chains to be driven by an original test stimulus source. For instance, the number of scan chains to be driven by the original test stimulus source can be based on the maximum number of scan chains that can be individually controlled by a test stimulus selector. At 4412, a fault from a target fault list is selected. At 4414, a test cube for the selected fault is generated. The test cube comprises specified bits in a number of specified scan chains. At 4416, a determination is made as to whether the number of specified scan chains in the test cube is less than the number of scan chains to be driven by the original test stimulus source. If the number of specified scan chains in the test cube does not exceed the number of scan chains to be driven by the original test stimulus source, the test cube is stored and an additional fault is selected from the fault list at 4418. Otherwise, the test cube is rejected at 4424 and the method continues with the next fault from the target fault list if there are any more faults on the list (as determined at 4432). At 4420, the test cube for the first fault is expanded to include one or more additional specified bits for detecting the second fault. At 4422, a determination is made as to whether the one or more additional specified bits cause the number of specified scan chains in the expanded test cube to exceed the number of scan chains to be driven by the original test stimulus source. If the number of specified scan chains in the expanded test cube does not exceed the number of scan chains to be driven by the original test stimulus source, the expanded test cube can be stored and the process of selecting additional faults and expanding the test cube to include the additional faults is repeated if there are any additional faults (as determined at 4428). If the number of specified scan chains in the expanded test cube exceeds the number of scan chains to be driven by the original test stimulus source, then the expanded test cube is rejected at 4426 and the acts of selecting, expanding, determining, and storing are repeated for the next fault from the target fault list, if any. In some implementations, control signals for a test stimulus selector can be generated based on the stored test cubes. These control signals can be capable of causing the test stimulus selector to apply constant values to the unspecified scan chains as a test pattern with the test cube is loaded during testing.

C. Reduction of Control Data Volume

When generating test patterns, it is possible to make different test patterns that share the same control data such that the control data can be loaded into the programmable controller only once for multiple test patterns. In such instances, for example, only the unique control data can be stored in the external tester. To maximize the control data to be shared with different test patterns, the act 4(h) set forth in the exemplary pseudocode in Table 4 can be enhanced to give preference to control data that meets the current requirement and that is used by more than one test pattern.

Selecting different constant logic values loaded into the scan chains and fed by the constant test stimulus source can have a different impact on the switching activity during the capture phase. A preferred fill approach (embodiments of which are described in U.S. Patent Application Publication No. 2007/0250749, which is hereby incorporated herein by reference) can be used with embodiments of the disclosed technology. Such approaches use signal probabilities to help determine the filling value during test pattern generation that reduces the switching activity during capture. These strategies can be used with the disclosed technology, for example, to select the constant test stimulus source in such a way that a constant 0 is chosen anytime the number of scan cells with the preferred value 0 is greater than or equal to the number of scan cells with the preferred value 1. Note that the term "the number of scan cells" refers here either to all scan chains having the same test source, a group of scan chains sharing the same test source, or an individual scan chain driven by its own test source.

IV. Low Power Capture and Scan Shift Operations with Scan Enablers

Switching activity can be reduced by shifting constant logic values into a group of scan chains during the scan shift phase of testing. The switching activity during scan shifting is also determined by the values of the test responses that are captured during testing and shifted out as a new test pattern is shifted in.

If a scan chain loaded with a constant value is held in the scan shift mode during the capture window, then both the scan-in shift power and the scan-out shift power can be reduced. This is due to the fact that the values captured into the scan cells that are held in the scan shift mode will be the same as the loading values. Thus, the values do not create transitions that cause toggling in the downstream gates during the capture window and during the unloading of a test response. Even if the scan chain is not designed to operate at speed when the scan mode is enabled, the logic value at a scan cell operated in the shift mode during the capture window will not ordinarily become unknown during that time frame as the data input value of the scan cell will be unchanged.

A. Exemplary Architectures of Programmable Scan Enablers

Figure 18:
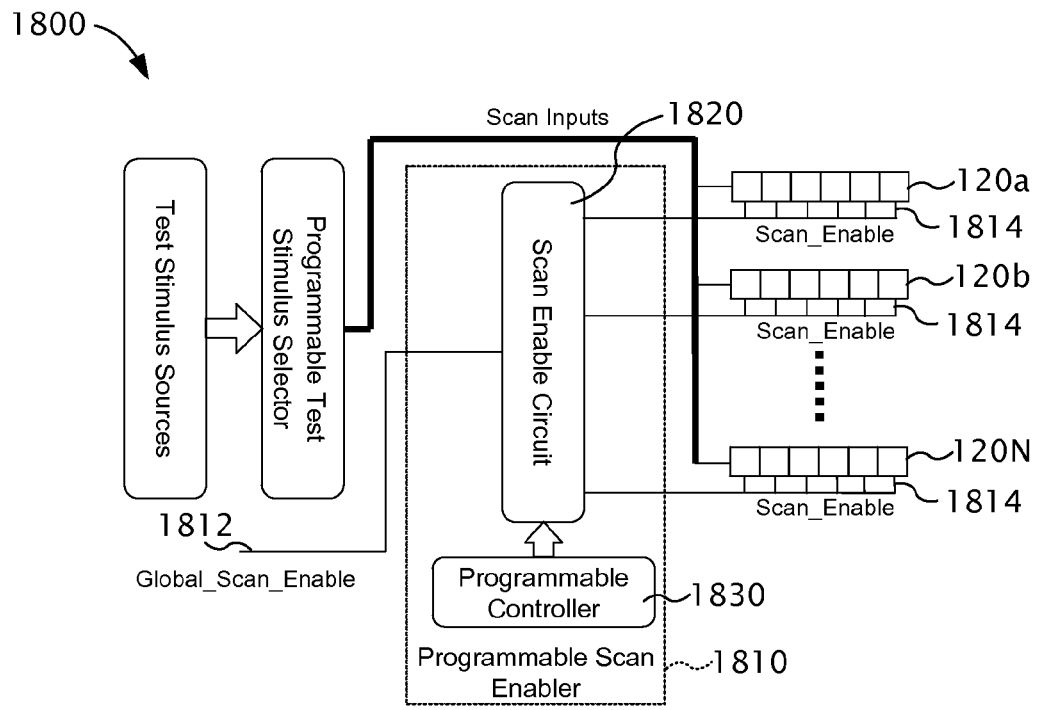
FIG. 18 is a schematic block diagram of a first exemplary embodiment of an integrated circuit comprising a programmable scan enable circuit.

An exemplary testing architecture 1800 having a programmable scan enabler is illustrated in FIG. 18. In particular, FIG. 18 shows a programmable scan enabler 1810 inserted between a Global_Scan_Enable signal line 1812 and scan enable inputs 1814 of the scan chains. The scan enabler 1810 can, for example, comprise or consist of two components: a scan enable circuit 1820 and a programmable controller 1830.

An exemplary test application procedure using the programmable scan enabler 1810 comprises loading control data for the test pattern t into the programmable test stimulus selector and the programmable scan enabler; asserting the Global_Scan_Enable signal to switch the circuit into a shift mode; shifting the test stimulus t into the scan chains; de-asserting the Global_Scan_Enable signal to switch the circuit into a capture mode; selectively asserting a scan enable signal to one or more selected scan chains; applying capture clocks; and asserting the Global_Scan_Enable signal to switch circuit into the shift mode and unload a test response from the scan chains.

Figure 41:
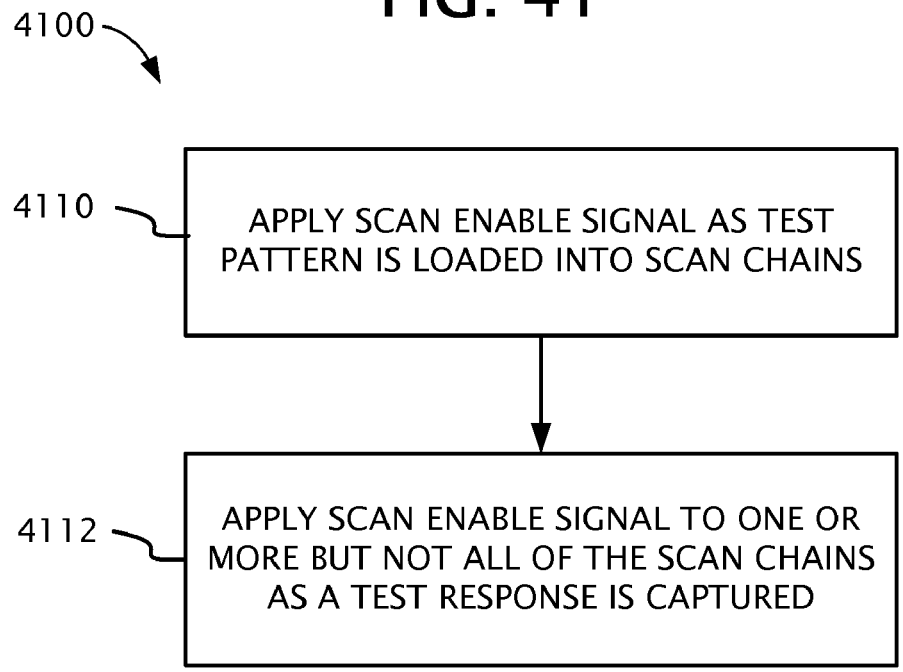
FIG. 41 is a flowchart of an exemplary method for selectively applying a scan enable signal as a test response is captured during testing.

FIG. 41 is a flowchart illustrating an exemplary embodiment for applying scan enable signals to a circuit during testing. At 4110, a scan enable signal is applied to scan chains of a circuit-under-test as a decompressed test pattern from a decompressor is loaded into the scan chains. The scan enable signal causes the scan chains to operate as one or more shift registers. At 4412, the scan enable signal is applied to one or more of the scan chains as a test response to the decompressed test pattern is captured in a remainder of the scan chains to which the scan enable signal is not applied. In some implementations, the one or more of the scan chains to which the scan enable signal is applied comprise one or more scan chains that would otherwise capture unknown values. Control signals can also be received that control which of the scan chains will have the scan enable signal applied as the test response to the decompressed test pattern is captured. These control signals can be reused as multiple additional decompressed test patterns are loaded into the scan chains. Still further, the control signals for a next test pattern can be loaded as the test pattern is being loaded into the scan chains.

B. Exemplary Scan Enable Circuits

Figure 19:
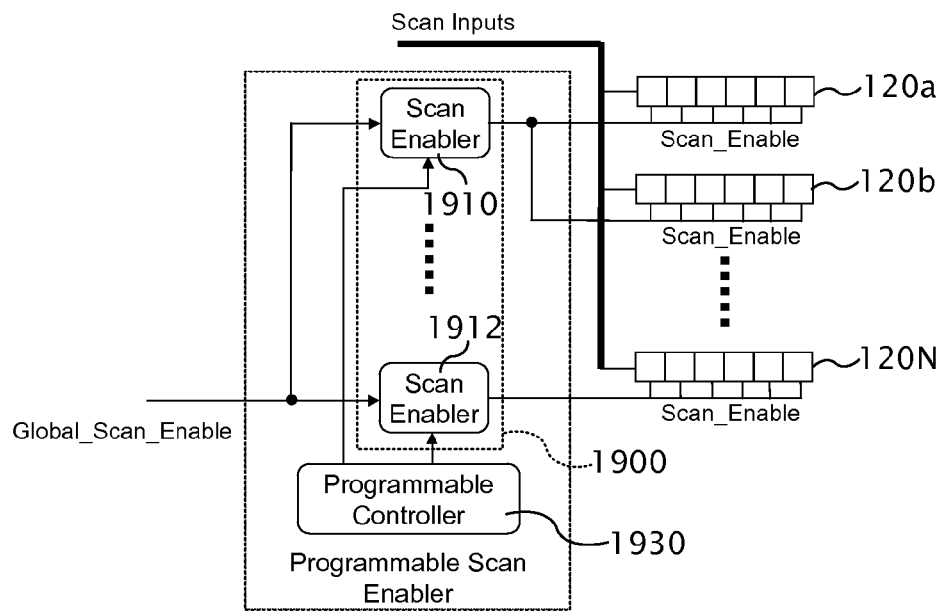
FIG. 19 is a schematic block diagram of an exemplary programmable scan enable circuit as can be used in the integrated circuit of FIG. 18.
Figure 20:
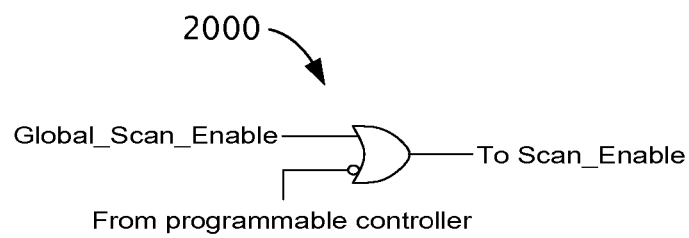
FIG. 20 is a schematic block diagram of a scan enable circuit as can be used in the embodiment of FIG. 19.

The scan enable circuit 1820 of FIG. 18 can be implemented in a variety of ways. One exemplary scan enable circuit 1900 is shown in FIG. 19. In particular, scan enable circuit 1900 comprises plural scan enablers (two of which are numbered as 1910, 1912 in FIG. 19). As shown in FIG. 19, a scan enabler can drive either a single scan chain's scan enable input (as with scan enabler 1912) or two or more scan chains' scan enable inputs (as with scan enabler 1910). The function of the exemplary scan enablers is to handle the Global_Scan_Enable signal in such a way that when the signal is de-asserted, the individual scan enable signal that the scan enablers output to the one or more scan chains is controlled by programmable controller 1930. An implementation of one form of scan enabler (such as 1910) is shown as scan enabler 2000 in FIG. 20.

C. Scan Enable Programmable Controller

The architecture of a scan enable programmable controller (e.g., programmable controller 1830 shown in FIG. 18) can be the same as for the controllers described earlier for selecting test stimuli sources. The use of an independent programmable controller for test stimulus selection in addition to a programmable scan enabler controller allows for the flexible control of scan enable signals for a group of scan chains loaded with a constant value. However, the use of both a programmable controller for test stimulus selection and a programmable scan enable controller can increase the test data volume and create additional area overhead. Therefore, in certain embodiments, the programmable test stimulus selector and the programmable scan enabler share a programmable controller.

Figure 21:
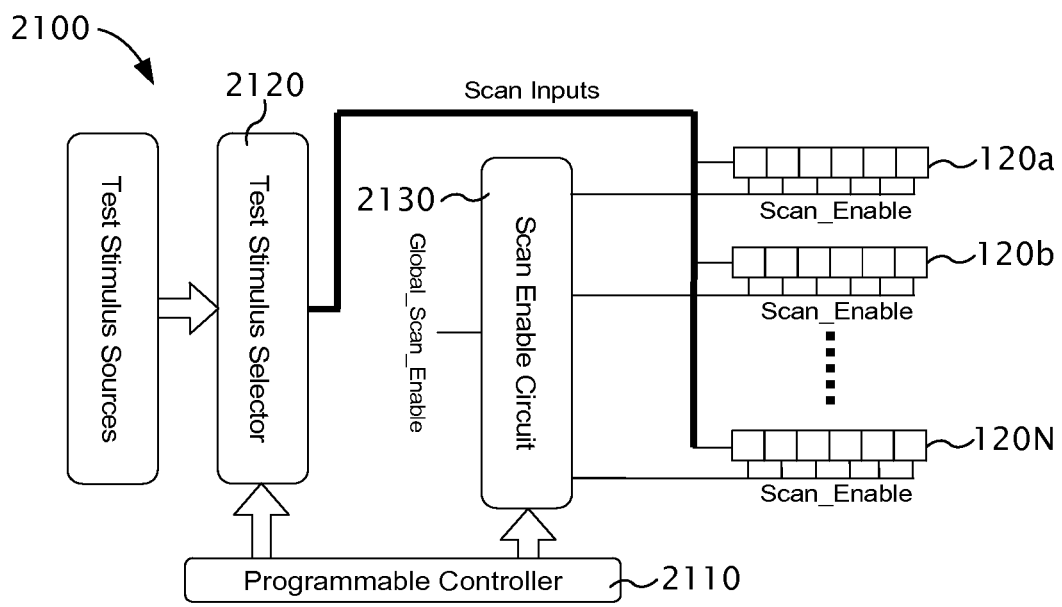
FIG. 21 is a schematic block diagram of a second exemplary embodiment of an integrated circuit comprising a programmable scan enable circuit. This embodiment further comprises a programmable test stimulus selector.

An exemplary architecture having a shared controller is shown in FIG. 21. In particular, FIG. 21 shows an architecture 2100 in which a shared controller 2110 is used to control both test stimulus selector 2120 and scan enable circuit 2130. The controller 2110 can be implemented using any of the controller designs introduced above.

The test generation procedure for a scan-based architecture with a programmable scan enabler can be similar to the test generation procedure described above. For illustrative purposes, an exemplary test generation procedure will be described for the exemplary scan architecture illustrated in FIG. 22. In relevant part, the exemplary architecture 2200 of FIG. 22 includes a single programmable controller 2210 that is used to control a test stimulus selector 2222 and a scan enabler 2224. The exemplary procedure described herein can be extended to other scan architectures having both a programmable test stimulus selector and a programmable scan enabler.

Figure 22:
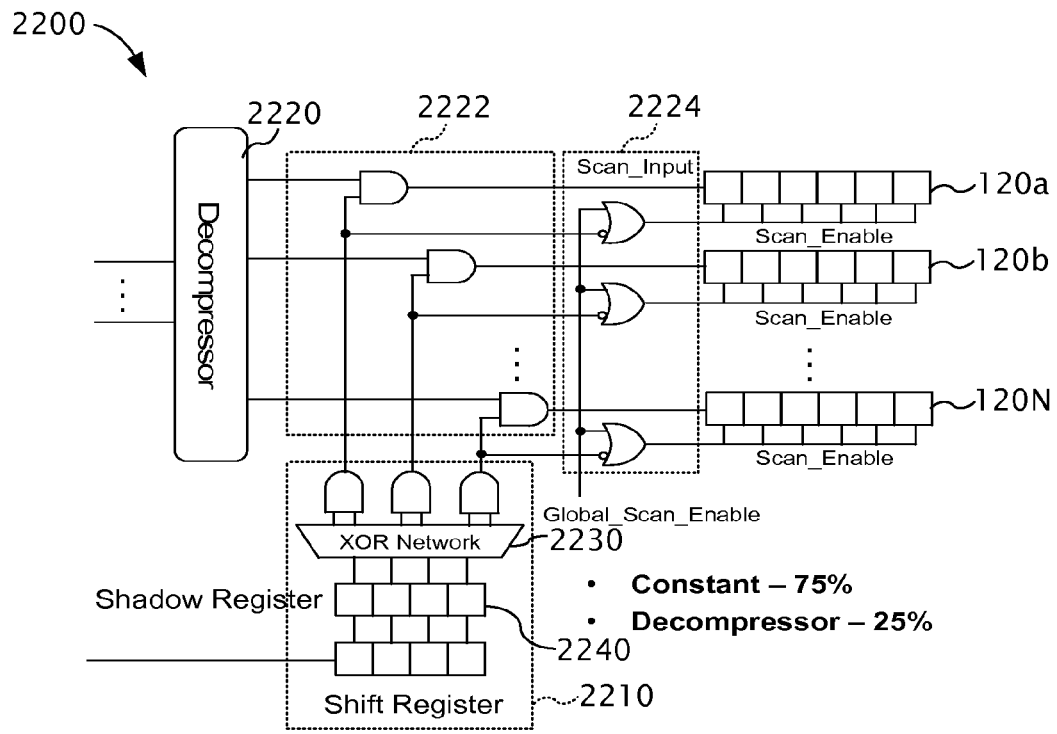
FIG. 22 is a schematic block diagram of an exemplary circuit having a programmable scan enable circuit and a programmable test stimulus selector with a biasing circuit.

In FIG. 22, two types of test stimulus sources are illustrated: decompressor 2220 and a source for the constant 0 (implemented by the AND gates in the test stimulus selector 2222). The type of test stimuli fed to a scan chain in this example remains unchanged during the scan loading process. Furthermore, with the illustrated embodiment, when a scan chain is driven by the constant 0, the Scan_Enable signal of the chain is asserted. The Scan_Enable signal can be applied not only during the scan shift phase of testing, but also during the capture phase so that the scan chain remains loaded with constant 0s. The XOR network 2230 can be designed in such a way that all the scan chains are driven by the decompressor 2220 when control shadow register 2240 is loaded with an all-1 pattern.

Table 5 includes exemplary pseudocode that describes one particular procedure for generating test patterns using test architectures that include both a test stimulus selector and a scan enabler.

TABLE 5

Exemplary Pseudocode for Generating Test Patterns with the Exemplary Test Stimulus Selector and Scan Enable Circuitry of FIG. 22
Exemplary Procedure:
generate_tests_with_test_stimulus_selector_and_scan_enabler 1. Identify hardware limitations of the programmable test stimulus selector and the programmable scan enabler. (The exemplary hardware shown in FIG. 22 can select up to 75% of scan chains to be driven by the constant 0 as well as to stay in the scan shift mode during capture.)
2. Set test set T to be empty.
3. Set the maximum number of scan chains that are driven by the decompressor to be N. (For the hardware of FIG. 22, N should not be greater than 25% of the total number of scan chains.)

TABLE 5-continued

Exemplary Pseudocode for Generating Test Patterns with the Exemplary
Test Stimulus Selector and Scan Enable Circuitry of FIG. 22
Exemplary Procedure:
generate_tests_with_test_stimulus_selector_and_scan_enabler 4. While target fault list F is not empty, do:
   a. Set test cube C to an all-X pattern.
   b. Pick a fault f from F and remove it from F.
   c. Generate test cube $C_f$ for f.
   d. If f is untestable, continue from step 4.
   e. Merge $C_f$ with C and set S to be the number of scan chains in C having specified bits and/or being used to observe fault effects of f.
   f. Mark every fault in F as untried.
   g. While there exist untried faults in F and S is not greater than N, do:
      i. Pick an untried fault g from F and mark it as tried.
      ii. Assign C to $C_g$.
      iii. Expand $C_g$ by specifying additional x bits in $C_g$ to detect g.
      iv. If fault g cannot to be detected by expanding $C_g$, continue from act 4(g).
      v. If the number of scan chains in $C_g$ having specified bits and/or being used to observe the fault effects for the fault g and all the faults targeted and detected by C is greater than S, continue from act 4(g).
      vi. Remove g from F.
   h. Generate control data to be loaded into the programmable controller such that for scan chains having specified bits and/or being used to observe the fault effects for the faults targeted and detected by C, the corresponding gating signals are set to 1, and for the remaining scan chains, the corresponding gating signals are set so that the scan chains are driven by the constant 0 and are kept in the shift mode during capture.
   i. Generate a new test pattern t by filling unspecified bits in C based on their test sources assigned from the control data.
   j. Fault simulate t and drop detected faults from F.
   k. Add t to test set T.
5. Return generated test set T.

It should be noted that the method acts of the exemplary procedure can be performed alone or in various combinations and subcombinations with one another depending on the implementation.

The exemplary procedure set forth in Table 5 includes a procedure (e.g., before act 4(g)(vi)) that is used to verify if the control data for the test selector can be generated such that all the scan chains with specified bits can be driven by the decompressor. If the control data cannot be generated for the test cube $C_g$, it can be discarded and the original test cube can be kept unchanged. Moreover, if the only specified bits in a scan chain are 0s, and the scan chain is not used to observe any fault effect, there is no need in this example to count this chain in S.

Furthermore, although the exemplary procedure outlined in Table 5 concerns generating control signals in architectures having both a test stimulus selector and a scan enable circuit, the procedure can be modified for architectures having just a scan enable circuit. For example, the variable S can be set to represent only the number of scan chains used to observe fault effects and the evaluation made at act 4(g)(v) can be based on the number of bits used to observe faults in the expanded test cube.

FIG. 45 is a flowchart illustrating an exemplary test pattern generation procedure for generating test patterns in architectures having a scan enable circuit. At 4510, a number of scan chains usable to observe fault effects is determined. The number is typically less than the number of available scan chains in a circuit design. In certain implementations, the encoding capacity for a controller of a scan enable circuit is used to determine the number of scan chains usable to observe fault effects. (When the exemplary test pattern generation procedure is used in connection with certain embodiments described below, the number of scan chains usable can be determined from the encoding capacity of a controller of a clock enable circuit, a controller of a reset enable circuit, or a controller of a shift clock enable circuit.) At 4512, a fault from a target fault list is selected. At 4514, a test cube for the selected fault is generated and the number of scan chains used to observe fault effects from the test cube is determined (e.g., using fault simulation). At 4516, an evaluation is made as to whether the number of scan chains used to observe fault effects from the test cube is less than the number of scan chains usable to observe fault effects. If the number of scan chains used to observe fault effects from the test cube is less than the number of scan chains usable to observe fault effects, the test cube is stored and an additional fault is selected from the fault list at 4518. If the number of scan chains used to observe fault effects from the test cube exceeds the number of scan chains usable to observe fault effects, then the test cube is rejected at 4524 and the process is repeated if there are additional faults in the fault list (as determined at 4532). At 4518, the test cube for the first fault is expanded to include one or more additional specified bits for detecting the second fault. At 4522, a determination is made as to whether the one or more additional specified bits cause the number of scan chains used to observe fault effects from the expanded test cube to exceed the number of scan chains usable to observe fault effects. If the number of scan chains used to observe fault effects from the test cube is less than the number of scan chains usable to observe fault effects, the expanded test cube is stored and the process of selecting additional faults and expanding the test cube if possible is repeated if there are additional faults on the fault list (as determined at 4528). If the number of scan chains used to observe fault effects from the test cube exceeds the number of scan chains usable to observe fault effects, the expanded test cube is rejected at 4526 and the process of selecting additional faults and expanding the test cube if possible is repeated if there are additional faults on the fault list (as determined at 4528). Control signals for the scan enable circuit can be generated based on the test cube. These control signals can be capable of causing the scan enable circuit to suppress scan enable signals from scan chains that do not observe fault effects from the test cube when a test pattern with the test cube is applied during testing.

As shown by Table 5, embodiments of the test pattern generation methods can also be used for architectures that include both a scan enable circuit and a programmable test stimulus source. In these cases, the determination of whether a test cube or expanded test cube can be accepted or not can also involve determining whether the number of specified chains in the test cube is less than the number of scan chains to be driven by the original test stimulus source. The number of scan chains to be driven by the original test stimulus source can be based, for instance, on the maximum number of scan chains that can be independently controlled by a scan enable circuit.

D. Suppression of Unknown States

Unknown states (sometimes referred to as "X states") can potentially render a test useless. Sources of X states include uninitialized memory elements, bus contentions, non-scan flip-flops, floating buses, internal three-state logic, and multi-cycle and false paths when generating at-speed tests. In many scan-based designs, X states, once captured in scan cells, can be subsequently injected into a test response compactor. In the test response compactor, X states can severely affect test results. The potential for test response corruption due to X states is especially great if a time compactor is used. For example, in time compactors, an X state can quickly multiply due to the feedback fan-out, contaminate the signature, and stay in the compactor until the signature is read out. By contrast, combinational compactors (which are a form of spatial compactor) are relatively immune to X states. To avoid masking and to allow diagnosis, however, such compactors sometimes have to observe each scan chain on two or more outputs. Finite memory compactors flush X states out of their registers after a number of scan shift cycles.

Even if a compactor is designed to tolerate a pre-specified number of X states, its vulnerability to X states can still produce unusable test responses. Therefore, it is desirable to limit the X states introduced into a compactor through a scan chain selection mechanism. Otherwise, certain combinations of X states not eliminated by an ATPG tool could prevent the observability of certain scan cells and cause the overall fault coverage drop.

There are several schemes that allow for the selective observation of scan chains using circuitry that masks selected unload values so that X states do not reach a compactor. Exemplary approaches for providing scan chain selection logic and ranking scan chains for purposes of generating appropriate masking signals are described in U.S. Patent Application Publication Nos. 2007/0234157, 2007/0234163, and 2007/0234169, and G. Mrugalski et al., "Test Response Compactor with Programmable Selector," Proc. DAC, pp. 1089-1094 (2006) ("G. Mrugalski et al."), all of which are hereby incorporated herein by reference. The exemplary approaches assist in finding scan chain selection control data that can be subsequently employed to suppress X states. Briefly stated, in certain embodiments described in U.S. Patent Application Publication Nos. 2007/0234157, 2007/0234163, and 2007/0234169, and G. Mrugalski et al., X states are masked by using logic gates driven by the scan chains and appropriate gating signals are produced by a programmable controller based on compressed control data. As a result, the disclosed approaches significantly reduce or entirely eliminate the X states occurring in test responses.

Embodiments of the disclosed technology can be used with the techniques described in U.S. Patent Application Publication Nos. 2007/0234157, 2007/0234163, and 2007/0234169, and G. Mrugalski et al. in order to perform efficient scan chain selection. However, when using embodiments of the disclosed technology, dedicated gating logic at the outputs of the scan chains is not necessary, as its functionality can be replaced by scan enable circuitry configured to hold selected scan chains in the scan shift mode during capture. An example of such functionality is illustrated using the exemplary architecture 2300 shown in FIG. 23. Instead of gating scan chains that carry X states, programmable scan enabler 2310 can be used to keep any of scan chains 120a-120N in the shift mode throughout a test cycle. This technique essentially prevents the scan chains 120a-120n from capturing X states and loading them into compactor 2320.

Figure 23:
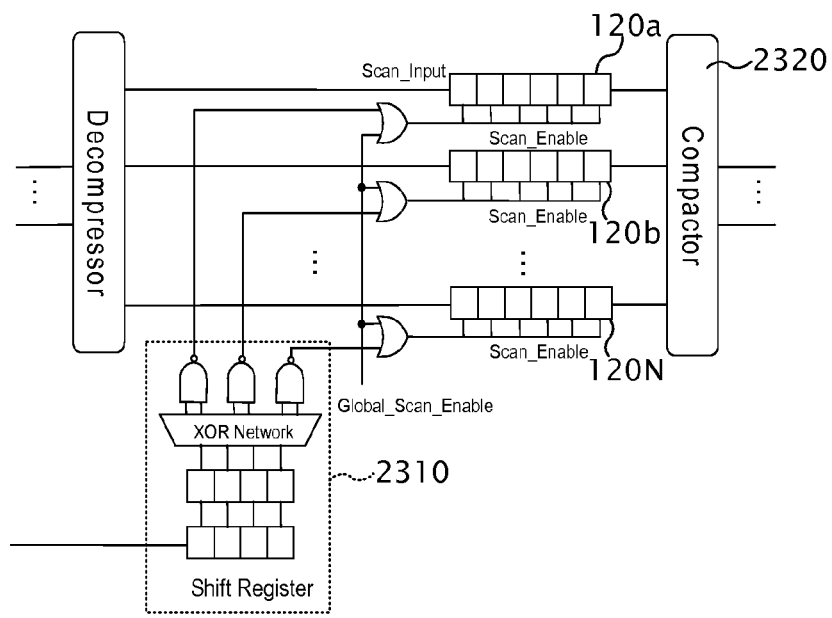
FIG. 23 is a schematic block diagram of an exemplary circuit having a programmable scan enable circuit with a biasing circuit.

In the specific example of FIG. 23, approximately 75% of the scan chains can remain in the scan shift mode during application of a given test pattern and not capture any test response values from the combinational logic of the circuit. The remaining 25% of the scan chains can capture the test response values that include values indicative of the presence of a targeted fault. The approach of FIG. 23 can be easily integrated with the solution described in connection with FIG. 22. As a result, the same control circuitry used to handle parallel power dissipation can be used to handle the presence of unknown states.

An exemplary technique for generating control data for the scan enable circuit that prevents X states from being captured comprises simulating a test pattern being applied to a circuit-under-test to generate a simulated test response; identifying one or more scan chains of the circuit-under-test that capture unknown states from the simulated test response; and generating control signals that cause the scan enable circuit to suppress the scan enable signal of one or more of the identified scan chains during the capture window. The control signals that are generated can be stored on one or more computer-readable media and subsequently loaded into the programmable controller of the scan enable circuit during test application.

V. Low-Power Capture and Scan Shift Operations with Clock Enablers

During test generation, it can be determined that certain scan chains do not observe fault effects (e.g., by simulating application of test pattern to the circuit-under-test). Capturing new values into those scan chains during the capture window can create undesired switching activity. To reduce the toggling in the capture window, the respective clocks for these scan chains (e.g., the respective clock trees) can be disabled such that the switching activity in the capture window is reduced. The relevant clocks may be a dedicated capture clock that is distributed to each of the scan cells of a scan chain or a single clock distributed though a single clock tree that provides both the shift signals (e.g., at a first frequency) and the capture signals (e.g., at a second frequency). In the latter scenario, the shift signals and the capture signals can be generated by a clock generator coupled to the clock tree.

A. Architectures of Exemplary Programmable Clock Enablers

Figure 24:
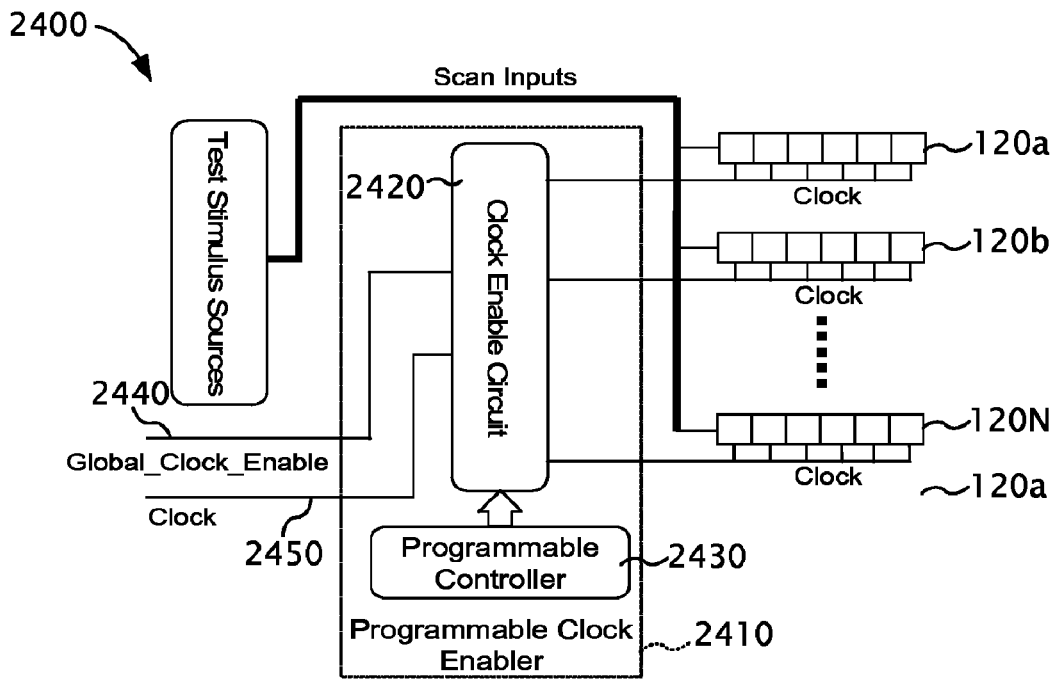
FIG. 24 is a schematic block diagram of a first exemplary embodiment of an integrated circuit comprising a programmable clock enable circuit.

FIG. 24 is a schematic block diagram showing an exemplary scan-based architecture 2400 employing a programmable clock enabler 2410. In particular, the programmable clock enabler 2410 is inserted between the clock (e.g., a capture clock) and a clock tree driving scan chains 120a-120N. As shown in FIG. 24, an exemplary programmable clock enabler 2410 can comprise or consist of two components: a clock enable circuit 2420 and a programmable controller 2430.

An exemplary test application procedure using the architecture 2400 comprises loading control data of a test pattern t into the programmable controller 2430; asserting Global_Clock_Enable signal 2440 before scan shifting starts; shifting the test stimulus t into the scan chains; de-asserting Global_Clock_Enable signal 2440 at the end of scan shift operation; applying the capture signals to selected scan chains; and asserting Global_Clock_Enable signal 2440 before unloading test response from the scan chains.

Figure 42:
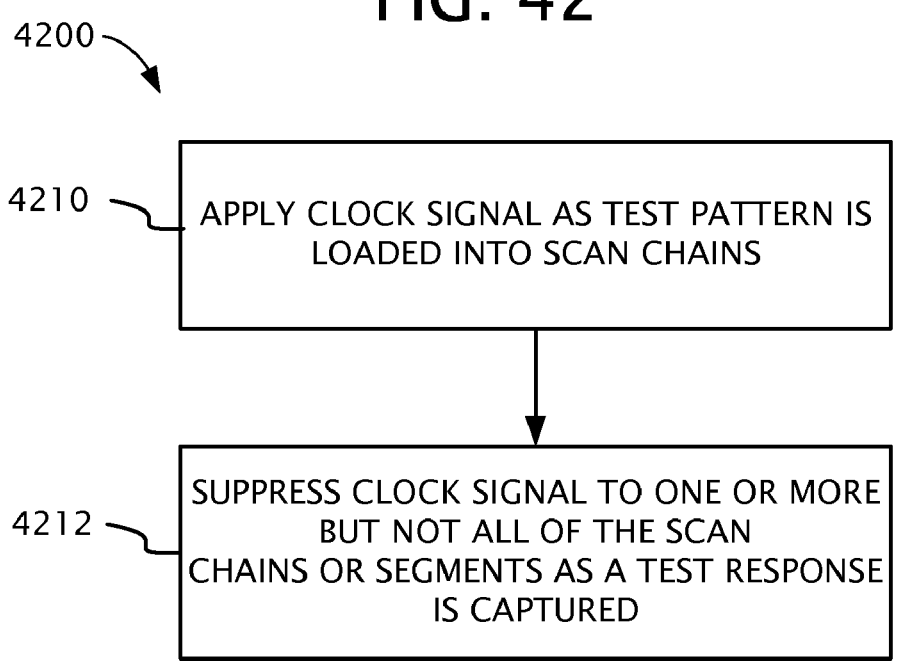
FIG. 42 is a flowchart of an exemplary method for selectively suppressing clock signals as a test response is captured during testing.

FIG. 42 is a flowchart showing an exemplary method for applying and suppressing clock signals during testing. At 4210, a clock signal is applied to scan chains of a circuit-under-test as a decompressed test pattern from a decompressor is loaded into the scan chains of the circuit-under-test. At 4212, the clock signal is suppressed at one or more but not all of the scan chains or segments of the scan chains as a test response to the decompressed test pattern is captured during a capture window. The suppression of the clock signal causes the one or more but not all of the scan chains or segments of the scan chains to remain in a constant state during the capture window. The one or more but not all of the scan chains or segments of the scan chains can comprise one or more scan chains or segments of the scan chains that would otherwise capture unknown values. Furthermore, control signals can be received that control which scan chains or segments of the scan chains will have the clock signal suppressed during the capture window. The control signals can be reused as test responses to multiple additional decompressed test patterns are captured.

B. Exemplary Clock Enable Circuits

Figure 25:
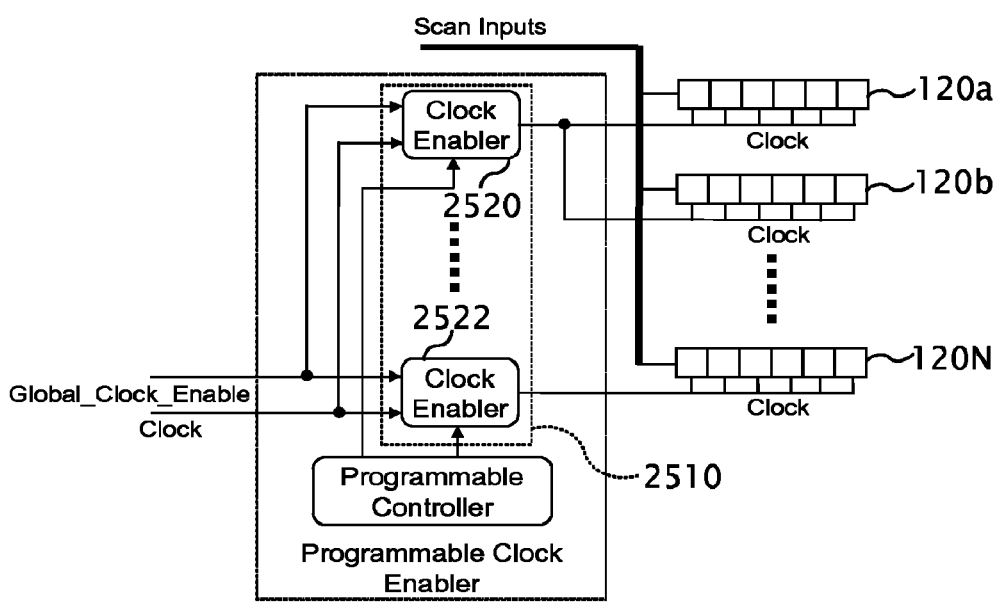
FIG. 25 is a schematic block diagram of an exemplary programmable clock enable circuit as can be used in the integrated circuit of FIG. 24.

The clock enable circuit 2410 can be implemented in a variety of ways. FIG. 25 illustrates one implementation of a clock enable circuit 2510. In particular, clock enable circuit 2510 can comprise or consist of plural clock enablers (two of which are numbered 2520, 2522 in FIG. 25). In the illustrated example shown in FIG. 25, a clock enabler drives the clock tree of either a single scan chain (as with clock enabler 2522) or a group of two or more scan chains (as with clock enabler 2520). In particular, clock enabler 2520 is shown in FIG. 25 driving scan chains 120a, 120b, whereas clock enabler 2522 is shown driving scan chain 120N.

Two alternative exemplary configurations of clock enablers are shown in FIGS. 26(a) and 26(b). In FIG. 26(a), plural clock enablers 2610, 2612 drive different segments of the same scan chain 2620. In FIG. 26(b), the same clock enabler 2650 drives plural segments of different scan chains 2660, 2662. Note that there is no need in these examples for a segment of a scan chain to be connected in a continuous manner. Instead, a segment of a scan chain can include any two or more scan cells in the scan chain.

Referring back to FIG. 24, in certain embodiments, the clock enabler 2410 can control the clocks at each state element so that the original clock is applied when the Global_Clock_Enable signal 2440 is asserted. In the capture mode, when the Global_Clock_Enable signal is de-asserted, the clock 2450 that triggers the scan cells in the scan chains can be gated using the control data loaded into the programmable controller 2430.

An exemplary glitch-free exemplary implementation 2700 of a clock enabler is shown in FIG. 27. When a glitch is not a concern, latch 2710 shown in FIG. 27 can be removed and the output of OR gate 2720 can be directly connected to the input of AND gate 2730.

Figure 28:
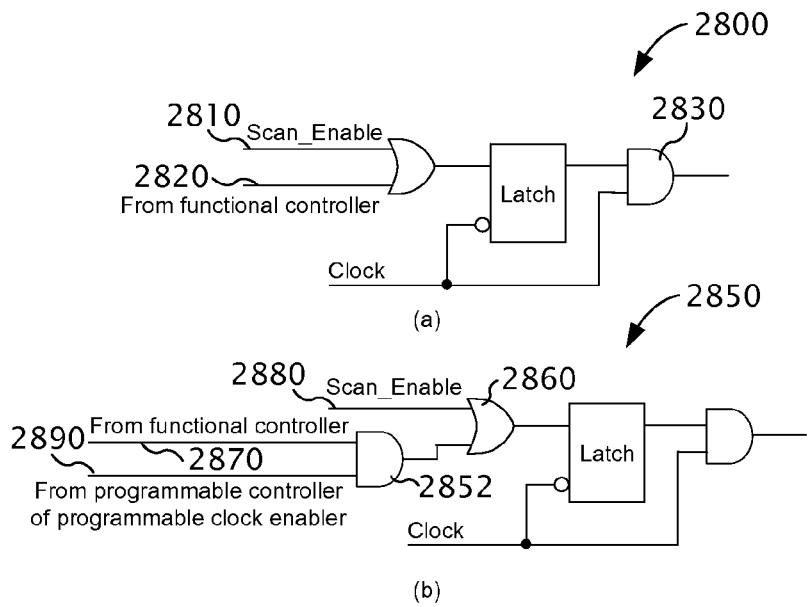
FIGS. 28(a)-28(b) are schematic block diagrams of exemplary clock enable circuits as can be used in the embodiments of FIG. 25.

To reduce area overhead, a clock enable circuit (e.g., clock enable circuit 2420) can be shared with the existing clock gating logic, if applicable. An example of original clock gating logic 2800 is shown in FIG. 28(a). In particular, in FIG. 28(a), the Scan_Enable signal 2810 serves as a global clock enable signal. For instance, when the Scan_Enable signal is a 1, all clock gates (e.g., gate 2830) in the design are enabled by ignoring the signal 2820 from the functional controller.

An exemplary modification 2850 of the existing clock gating logic 2800 is shown in FIG. 28(b). In the particular modification shown in FIG. 28(b), AND gate 2852 is inserted between the OR gate 2860 and signal path 2870 from the functional controller. When Scan_Enable signal 2880 is a 0, in this example, the signal from the programmable clock enabler 2890 enables/disables the functional clock control signal 2870.

The controller 2430 for the programmable clock enabler can be implemented using any of the controller designs introduced above. Furthermore, when the group of scan chains to be disabled during the capture window is the same for all capture cycles, the controller can be implemented using only one shift register. To allow for the group of scan chains to be disabled during the capture window to be dynamically changed at different capture cycles, a shift register file comprising two or more pipelined shift registers (such as the shift register file of FIG. 11) can be used.

C. Switching Activity Reduction for Both Scan Shift and Capture

Figure 29:
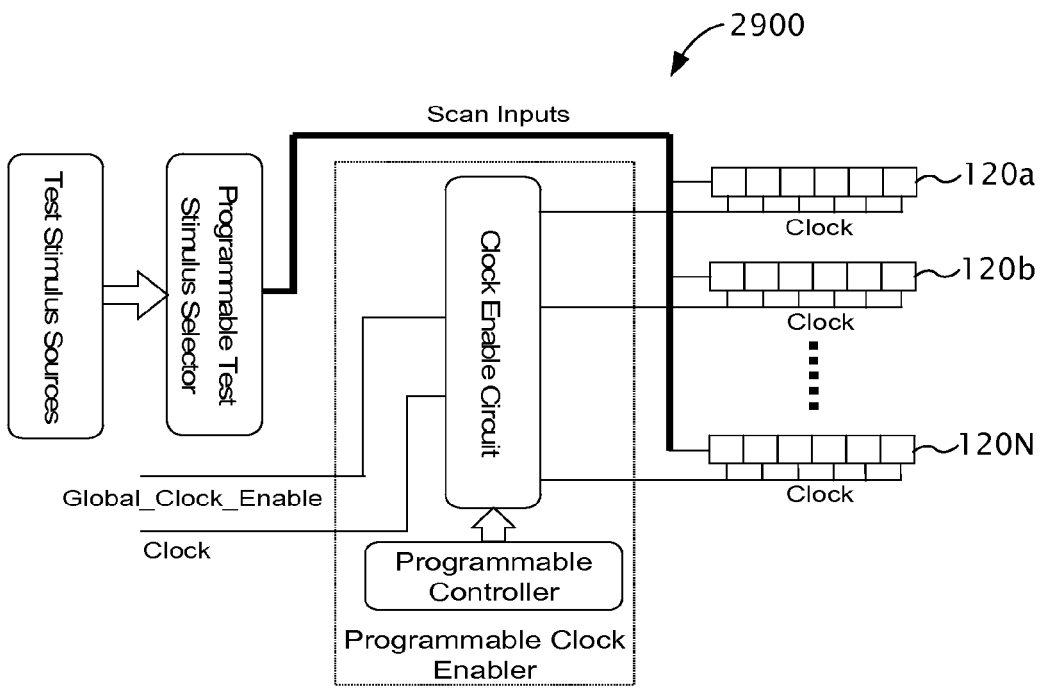
FIG. 29 is a schematic block diagram of an exemplary circuit having a programmable clock enable circuit and a programmable test stimulus selector.

To reduce switching activity during both the scan shift and capture phases, embodiments of the programmable clock enabler can be used in combination with embodiments of the programmable test stimulus selector introduced above. An exemplary scan architecture 2900 having both a programmable clock enabler and a programmable test stimulus selector is shown in FIG. 29. The most efficient reduction of switching activity is observed when the scan chains loaded with constant test stimuli are disabled to capture new data such that there is no transition when unloading test responses from those scan chains.

Figure 30:
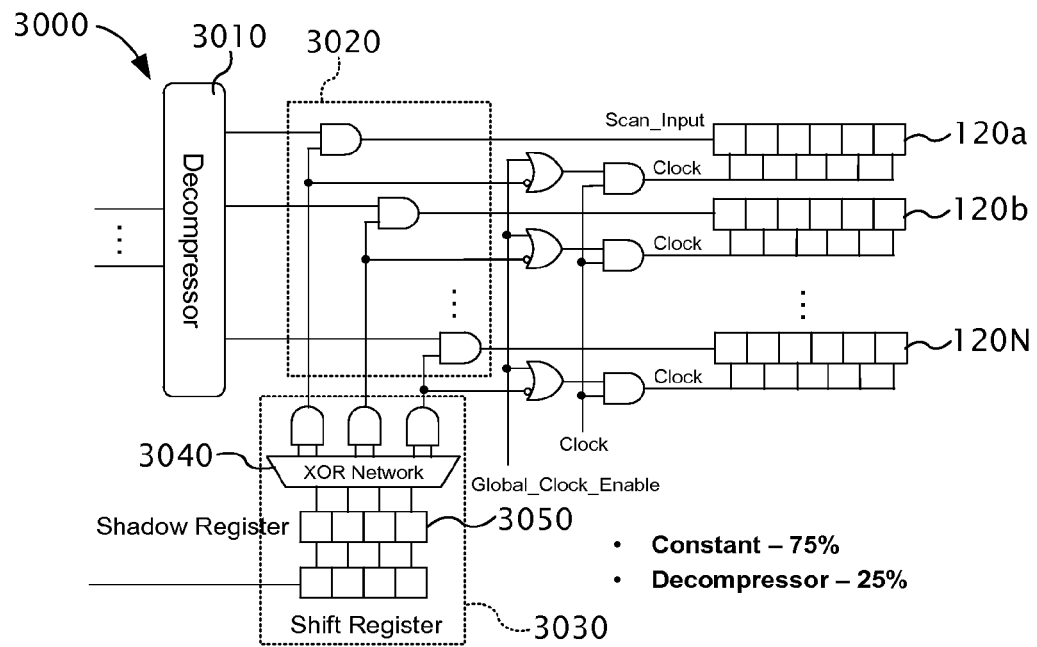
FIG. 30 is a schematic block diagram of an exemplary circuit having a programmable clock enable circuit and a programmable test stimuli selector with a biasing circuit.

To minimize area overhead, the programmable controller for the programmable clock enabler can be shared with the programmable test stimulus selector. FIG. 30 shows an implementation 3000 with such a shared programmable controller.

D. Test Pattern Generation

The test pattern generation procedure for a scan-based architecture using a programmable clock enabler can be similar to the test pattern generation procedures described above. For instance, assume that the scan architecture is as shown in FIG. 30. In FIG. 30, there are two types of test sources: a decompressor 3010 and a source producing the constant 0 (produced by gates 3020 in combination with the programmable controller 3030). The type of test stimuli fed to a scan chain is unchanged in this example during scan shifting. For the illustrated architecture, when a scan chain is driven by the constant 0, the clock driving the scan chain is disabled during capture. In this example, XOR network 3040 is designed in such a way that the decompressor 3010 drives all the scan chains when the control data at the shadow register 3050 is loaded with an all-1 pattern.

Table 6 includes exemplary pseudocode that describes one particular procedure for generating test patterns using test architectures that include both a test stimulus selector and a clock enabler.

TABLE 6

Exemplary Pseudocode for Generating Test Patterns with the Exemplary Test Stimulus Selector and Clock Enable Circuitry of FIG. 30
Exemplary Procedure:
generate_tests_with_test_stimulus_selector_and_clock_enabler 1. Identify hardware limitations of the programmable test stimulus selector and the programmable clock enabler. (The exemplary hardware shown in FIG. 30 can select up to 75% of scan chains to be driven by the constant 0 as well as have their clocks disabled during capture.)
2. Set test set T to be empty.
3. Set the maximum number of scan chains that are driven by the decompressor to be N. (For the hardware of FIG. 30, N should not be greater than 25% of the total number of scan chains.)
4. While target fault list F is not empty, do:
   a. Set test cube C to an all-X pattern.
   b. Pick a fault f from F and remove it from F.
   c. Generate test cube $C_f$ for f.
   d. If f is untestable, continue from step 4.
   e. Merge $C_f$ with C and set S to be the number of scan chains in C having specified bits in all the capture clock cycles and/or being used to observe the fault effect of f.
   f. Mark every fault in F as untried.
   g. While there exist untried faults in F and S is not greater than N, do:
      i. Pick an untried fault g from F and mark it as tried.
      ii. Assign C to $C_g$.
      iii. Expand $C_g$ by specifying additional x bits in $C_g$ to detect g.
      iv. If fault g cannot to be detected by expanding $C_g$, continue from step 4g.
      v. If the number of scan chains in $C_g$ having specified bits in all the capture clock cycles and/or being used to observe the fault effects for the fault g and all the faults targeted and detected by C is greater than S, continue from step 4g.
      vi. Remove g from F.
   h. Generate control data for loading into the programmable controller such that for the scan chains having specified bits in all the capture clock cycles and/or being used to observe the fault effects for all the faults targeted and detected by C, the corresponding gating signals are set to 1, and for the remaining TABLE 6-continued Exemplary Pseudocode for Generating Test Patterns with the Exemplary Test Stimulus Selector and Clock Enable Circuitry of FIG. 30
Exemplary Procedure:
generate_tests_with_test_stimulus_selector_and_clock_enabler scan chains, the corresponding gating signals are set so that the scan chains are driven by the constant 0 and their clocks are disabled during capture.
    i. Generate new test pattern t by filling unspecified bits in C based on their test stimulus sources assigned from control data.
    j. Fault simulate t and drop detected faults from F.
    k. Add t to test set T.
5. Return generated test set T.

It should be noted that the method acts of the exemplary procedure can be performed alone or in various combinations and subcombinations with one another depending on the implementation.

The exemplary procedure set forth in Table 6 employs additional checking before act 4(g)(vi) to verify if the control data for the programmable controller can be generated such that the scan chains with specified bits can be driven by the decompressor. If the control data cannot be generated for the test cube $C_g$, it can be discarded and the original test cube can be left unchanged. Moreover, if the only specified bits in a scan chain are 0s, and the scan chain is not used to observe any fault effect, there is no need in this example to count this chain in S.

Furthermore, although the exemplary procedure outlined in Table 6 concerns generating control signals in architectures having both a test stimulus selector and a clock enable circuit, the procedure can be modified for architectures having just a clock enable circuit. For example, the variable S can be set to represent only the number of scan chains used to observe fault effects and the evaluation made at act 4(g)(v) can be based on the number bits used to observe faults in the expanded test cube.

The exemplary embodiment shown in FIG. 45 and discussed above can also be used to generate test patterns for architectures having a clock enable circuit. In such embodiments, control signals for a clock enable circuit can be generated based on the generated test cubes. For instance, the control signals can be capable of causing the clock enable circuit to suppress clock signals from scan chains that do not observe fault effects from the test cube when a test pattern with the test cube is applied during testing.

E. Suppression of Unknown States

Figure 31:
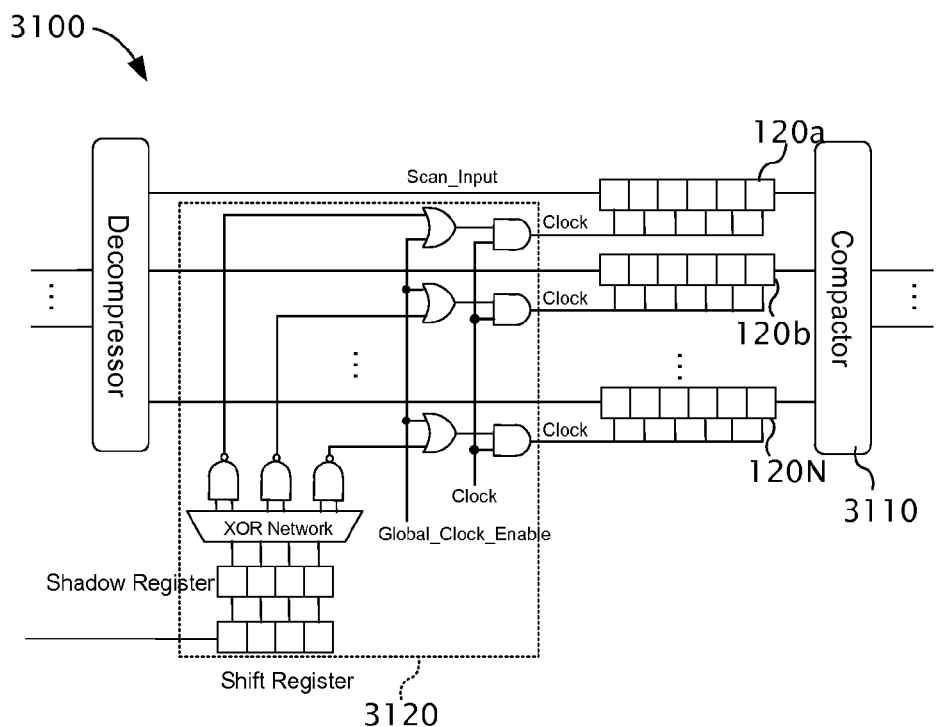
FIG. 31 is a schematic block diagram of an exemplary circuit having a programmable clock enable circuit with a biasing circuit.

The programmable clock enabler can be used to preclude the propagation of X states into scan cells. A significant number of X states that might be otherwise captured can be neutralized by using programmable clock enablers to perform scan chain selection. One exemplary architecture 3100 that can be used to suppress X states in a scan-based environment is shown in FIG. 31. For instance, the architecture 3100 can be used to help reduce the amount of X masking on the outputs of a test response compactor (e.g., compactor 3110 in FIG. 31). As was the case with deploying scan enablers, there is no need to use any customized gating logic at the outputs of the scan chains when using clock enablers to prevent X states from being captured. The desired functionality can be achieved by disabling clocks of the selected scan chains during capture. In other words, instead of gating scan chains that carry X states, one can use one or more exemplary programmable clock enabler 3120 to disable clock trees of the designated scan chains. The programmable clock enablers 3120 can be driven, for instance, by precomputed data (e.g., computed in any of the exemplary manners described in U.S. Patent Application Publication Nos. 2007/0234157, 2007/0234163, and 2007/0234169, and G. Mrugalski et al.). This exemplary technique essentially prevents the scan chains from capturing X states and loading them into the compactor 3110. In the example of FIG. 31, approximately 75% of scan chains have their clocks disabled during capture (that is, they do not record test results (including X states)), while the remaining 25% of the scan chains have their clocks enabled during capture and capture the test responses.

The exemplary approach explained with reference to FIG. 31 can be combined with the approach illustrated and described in connection with FIG. 30. As a result, the same control circuitry can be shared to handle, in parallel, power dissipation and the presence of unknown states.

An exemplary technique for generating control data for the clock enable circuit that prevents X states from being captured comprises simulating a test pattern being applied to a circuit-under-test to generate a simulated test response; identifying one or more scan chains of the circuit-under-test that capture unknown states from the simulated test response; and generating control signals that cause the clock enable circuit to suppress the capture clock of one or more of the identified scan chains during the capture window. The control signals that are generated can be stored on one or more computer-readable media and subsequently loaded into the programmable controller of the clock enable circuit during test application.

VII. Low-Power Scan Shift Operations with Reset/Shift Clock Enablers

Figure 32:
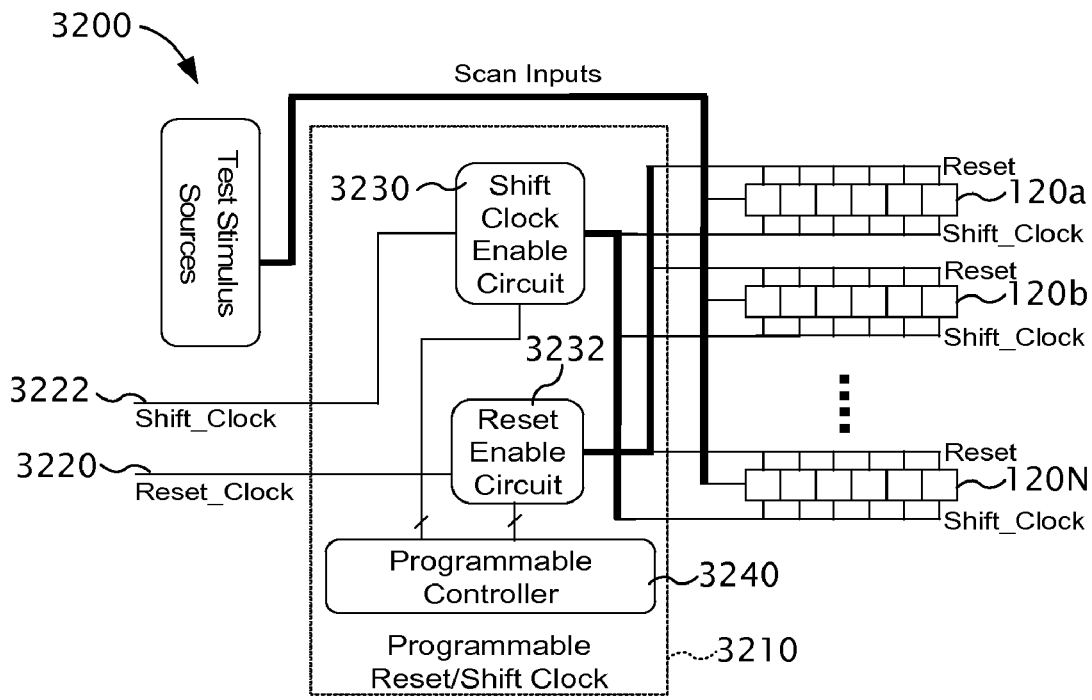
FIG. 32 is a schematic block diagram of a first exemplary embodiment of an integrated circuit comprising a programmable reset/shift clock circuit.

Since flip-flops are usually designed with one or more asynchronous control inputs intended for state initialization (e.g., an asynchronous set input or an asynchronous reset input), it is possible to reduce toggling during the scan shift phase by using a programmable signal e.g. that forces the scan cells into a known state through one of these asynchronous control inputs (e.g., an asynchronous set signal or an asynchronous reset signal). One exemplary architecture 3200 for implementing this approach is shown in FIG. 32. Implementations of the disclosed architecture also have the ability to significantly reduce clock wiring power dissipation, another major source of chip power consumption. The exemplary architecture uses a programmable controller, which can be implemented using any of the controller designs described above.

For the approach illustrated in FIG. 32, it is desirable to determine the scan chains that should be driven directly by the decompressor when shifting in a test pattern $t_i$ (because they contain specified bits of the test pattern $t_i$) and the scan chains that have test response values that should be loaded into the compactor after applying a test pattern $t_{i-1}$ (because they are values that are indicative of the targeted defects captured by $t_{i-1}$). The test pattern $t_i$ is typically applied right after the test pattern $t_{i-1}$. These scan chains can be identified, for example, during the ATPG process. According to one specific implementation, the scan chains can be controlled so that only the identified scan chains respond to the shift clock signal. The other scan chains can remain quiescent as their shift clock signals are suppressed. As a result, switching activity due to both scan shifting and clocking itself can be reduced. Furthermore, in some instances, there can be a small number of scan chains that remain active as a side effect of the encoding process. In general, the particular configuration of the biasing circuitry will affect the percentage of unnecessary scan chains that are activated. To avoid unknown values at the quiescent scan chains' outputs, their outputs can be gated to have a constant value before feeding to the inputs of the compactor.

The gating control signals can come from the programmable controller that controls the shift clock signal.

Toggling in the scan chains can be further reduced by taking advantage of the fact that in many cases, the test response values captured in certain scan chains are used to observe fault effects of targeted faults that have not been previously detected by earlier test patterns whereas the test response values captured in other scan chains are used to observe fault effects of targeted faults that have been previously detected by the earlier test patterns. Shifting out the response values in the latter subset of scan chains does not ordinarily improve the fault coverage. Accordingly, in certain embodiments, these scan chains can be reset before a previously captured test response is unloaded and the next test pattern is loaded in. This causes the scan chain to be set to all constant values before loading the next test pattern, thus reducing the amount of toggling that occurs when the scan chain is loaded with the next test pattern. Resetting a scan chain prior to application of a new test vector can reduce the switching activity by half (assuming that there is no inversion between adjacent scan cells).

A. Exemplary Architectures of Programmable Shift/Reset Clock Enablers

In the exemplary architecture 3200 of FIG. 32, a programmable reset/shift clock enabler 3210 is inserted between the primary input pins Reset_Clock 3220 and Shift_Clock 3222, and the reset clock and the shift clock trees driving the scan chains. As shown in FIG. 32, the exemplary programmable reset/shift clock enabler 3200 comprises or consists of three components: a shift clock enable circuit 3230, a reset enable circuit 3232, and a programmable controller 3240.

An exemplary test application procedure with the exemplary architecture 3200 of FIG. 32 comprises loading the control data to control the reset enable of a test pattern $t_i$ and the control data to control the shift clock enable of the next test pattern into a programmable controller; shifting the test stimulus $t_i$ into scan chains (the control data to control the shift clock enable of the test pattern $t_i$ is loaded when the test stimuli for $t_{i-1}$ is shifted in); applying capture clocks; asserting the Reset_Clock pin on selected scan chains and holding it at an active state for as many clock cycles as required; de-asserting Reset_Clock pin; and shifting out a test response from the scan chains.

It should be noted that in certain embodiments, the shift clock enable circuit 3230 is omitted from the design. The test application procedure outlined above will be modified in such embodiments so that no control data for the shift clock enabler is used.

FIG. 43 is a flowchart illustrating an exemplary embodiment for applying reset signals to a circuit during testing. At 4310, a test response to a test pattern (e.g., a test pattern decompressed by a decompressor) is captured in scan chains of a circuit-under-test. At 4312, a reset signal is applied to one or more but not all of the scan chains or segments of the scan chains after the test response to the test pattern is captured. At 4314, the contents of the scan chains are unloaded after the reset signal is applied. The one or more scan chains or segments of the scan chains to which the reset signal is applied can comprise one or more scan chains or segments of the scan chains that would otherwise capture unknown values. The application of the reset signal can cause values captured into the one or more but not all of the scan chains or segments of the scan chains to become a single constant value (e.g., a 1 or 0). Control signals can be received that control which scan chains or segments of the scan chains will have the reset signal applied. These control signals can be reused for test responses to multiple additional test patterns. Further, control signals for a next test pattern can be loaded as the test pattern is being loaded into the scan chains.

B. Shift Clock Enablers and Reset Enablers

Figure 33:
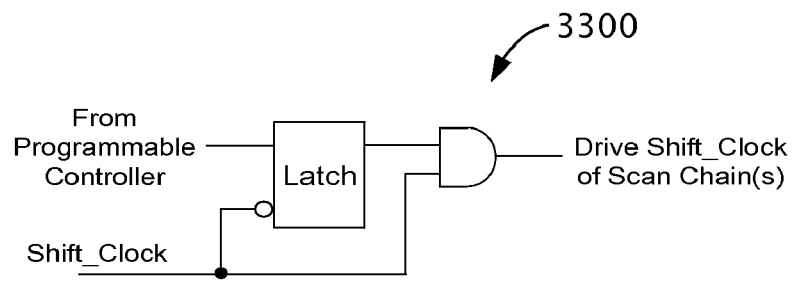
FIG. 33 is a schematic block diagram of an exemplary shift clock enable circuit as can be used in the integrated circuit of FIG. 32.

The shift clock enable circuit 3230 can comprise or consist of plural shift clock enablers. Furthermore, the shift clock enabler can drive either a single scan chain's shift clock input or a group of two or more scan chains' shift clock inputs. In general, the function of the shift clock enable circuit 3230 is to enable/disable scan chains to operate in a shift mode during scan shift. An exemplary glitch-free implementation 3300 of the shift clock enabler is shown in FIG. 33.

Figure 34:
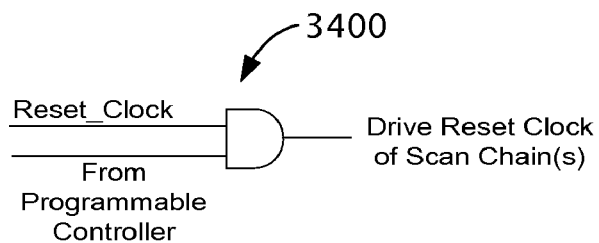
FIG. 34 is a schematic block diagram of an exemplary reset clock enable circuit as can be used in the integrated circuit of FIG. 32.

The reset enable circuit 3232 can comprise or consist of a group of plural reset enablers. The reset enabler can drive either a single scan chain's reset clock input or a group of two or more scan chains' reset clock inputs. The function of the reset enabler is to enable/disable Reset_Clock and thereby reset the scan chains when the Reset_Clock is active. An exemplary implementation 3400 of the reset enabler is shown in FIG. 34.

An exemplary form of the programmable controller 3240 can comprise or consist of two modules: one to control the shift clock enabler and the other to control the reset enabler. Each controller module can have the same architecture as the exemplary programmable controllers used with the programmable test stimulus selector 652 and described previously.

C. Test Pattern Generation

The test pattern generation procedures for architectures having any of the reset clock enable circuit or shift clock enable circuits described herein are substantially similar to the test pattern generation procedures described above with respect to Tables 5 and 6 for the architectures having clock enablers or scan enablers and need not be set forth separately here. For example, the test pattern generation procedures can be used to generate control data for the controller of a reset enable circuit so that the reset enable circuit resets one or more scan chains that do not observe fault effects before their test response is shifted out.

The exemplary embodiment shown in FIG. 45 and discussed above can also be used to generate test patterns for architectures having a reset enable circuit. In such embodiments, reset signals for the reset enable circuit can be generated based on the generated test cubes. For instance, the reset signals can be capable of causing the reset enable circuit to apply reset signals to scan chains that do not observe fault effects from the test cube after a test response to a test pattern with the test cube is captured during testing. The exemplary embodiment shown in FIG. 45 and discussed above can also be used to generate test patterns for architectures having a shift clock enable circuit (e.g., in combination with the reset enable circuit). In such embodiments, control signals for a shift clock enable circuit can be generated based on the test cubes. These control signals can be capable of causing the shift clock enable circuit to suppress shift clock signals from scan chains that do not observe fault effects from the test cube after a test response to a test pattern with the test cube is captured during testing.

D. Switching Activity Reduction for Both Scan Shift and Capture

To reduce the switching activity during capture as well as to further reduce the switching activity for scan shift, the programmable reset/shift clock 3210 can be used in combination with a programmable test stimulus selector and a programmable clock enabler as described in any of the previous sections. An exemplary scan architecture 3500 for such an implementation is shown in FIG. 35.

An exemplary test application procedure using this implementation comprises loading the control data to control the reset enable of a test pattern $t_i$ and the control data to control the shift enable of the test pattern $t_{i+1}$ into programmable controller; shifting the test stimulus $t_i$ into the scan chains (the programmable test pattern selector selects the source of the test pattern during the shifting in of the test stimuli); de-asserting Global_Clock_Enable at the end of a scan shift operation; applying capture clocks (the scan cells that are selected to capture new data are controlled by the programmable clock enabler); asserting the Reset_Clock pin and holding it at an active state for as many clock cycles as required; de-asserting the Reset_Clock pin; asserting the Global_Clock_Enable signal; and shifting out a test response from the scan chains.

Figure 35:
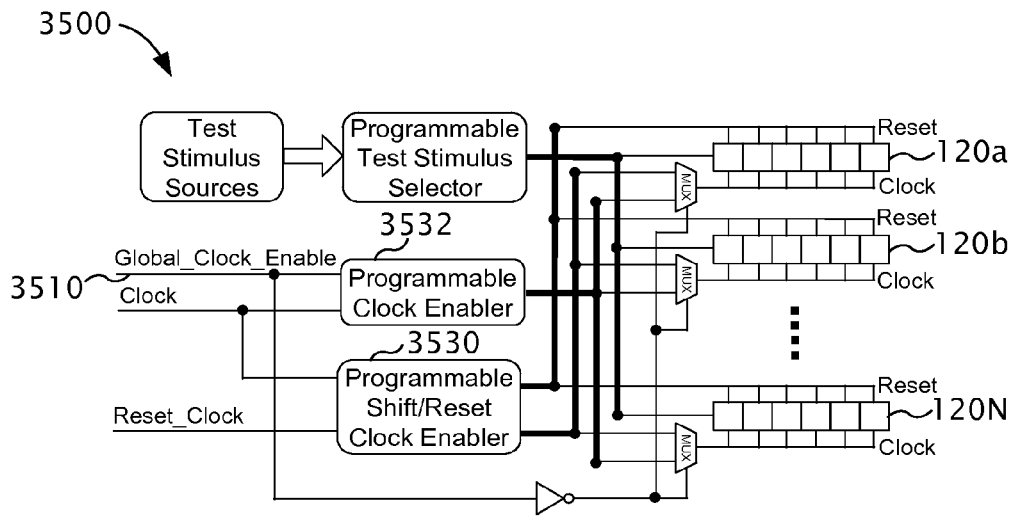
FIG. 35 is a schematic block diagram of an exemplary circuit having a programmable clock enable circuit, a programmable test stimulus selector, and a programmable shift/reset clock enable circuit.

In the architecture 3500 shown in FIG. 35, the shift clock and the capture clock are the same. The architecture of FIG. 35 can be adapted, however, to use different shift and capture clocks. For instance, in a scan shift mode, Global_Clock_Enable can be asserted to 1, and the shift clock can be controlled by the programmable shift/reset clock enabler. In the capture mode, Global_Clock_Enable can be de-asserted, and the capture clock can be controlled by the programmable clock enabler. To reduce the pin count, the pin Global_Clock_Enable can be shared with the pin Scan_Enable.

E. Suppressing Unknown States

The programmable reset enable circuit can be used to prevent X states from being output from the scan chains. For example, a significant number of X states that might be otherwise captured and output can be eliminated using programmable reset enablers. In particular, after a test response is captured in the scan chains, the Reset_Clock signal can be enabled at one or more scan chains that are known to have captured unknown states but that did not capture test response values indicative of targeted faults (or that captured test response values that do not significantly contribute to the desired test coverage). Consequently, the values in the scan chains will be reset to known constants. As was the case with using scan enablers, there is no need to use any customized gating logic at the outputs of the scan chains when using reset enablers to prevent X states from being captured. The desired functionality can be achieved by resetting the desired scan chains after the test response is captured. In other words, instead of gating scan chains that carry X states, one can use one or more of the exemplary reset enable circuits 3232 to reset the captured values in a scan chain to known constants. The programmable reset enabler 3210 can be driven, for instance, by precomputed data (e.g., computed in any of the exemplary manners described in U.S. Patent Application Publication Nos. 2007/0234157, 2007/0234163, and 2007/0234169, and G. Mrugalski et al.)).

An exemplary technique for generating control data for the reset enable circuit that prevents X states from being output comprises simulating a test pattern being applied to a circuit-under-test to generate a simulated test response; identifying one or more scan chains of the circuit-under-test that capture unknown states from the simulated test response; and generating control signals that cause a reset enable circuit to reset the values in one or more of the identified scan chains after the test response having the unknown states is captured. The control signals that are generated can be stored on one or more computer-readable media and subsequently loaded into the programmable controller of the reset enable circuit during test application.

VIII. Experimental Results

Scan shift operations dissipate power, which depends directly on the number of transitions that occur in the scan chains and other parts of the circuit-under-test ("CUT"). The resultant switching activity can be estimated by a weighted transition metric that not only counts the number of invoked transitions in successive scan cells, but also takes into account their relative positions. Let m be the length of a scan chain, and $T=b_1 b_2 \ldots b_m$ represent a test vector with bit $b_k$ scanned in before $b_{k+1}$. The normalized form of the metric can then be defined as follows:

$$P = 2[m(m-1)]^{-1} \sum_{i=1}^{m-1} (m-i)(b_i \oplus b_{i+1})$$

The average scan power dissipated during test application can be obtained by summing up results provided by the above formula over all scan chains and all test patterns. An embodiment of the previously described low power approaches was tested on several industrial designs.

Figure 36:
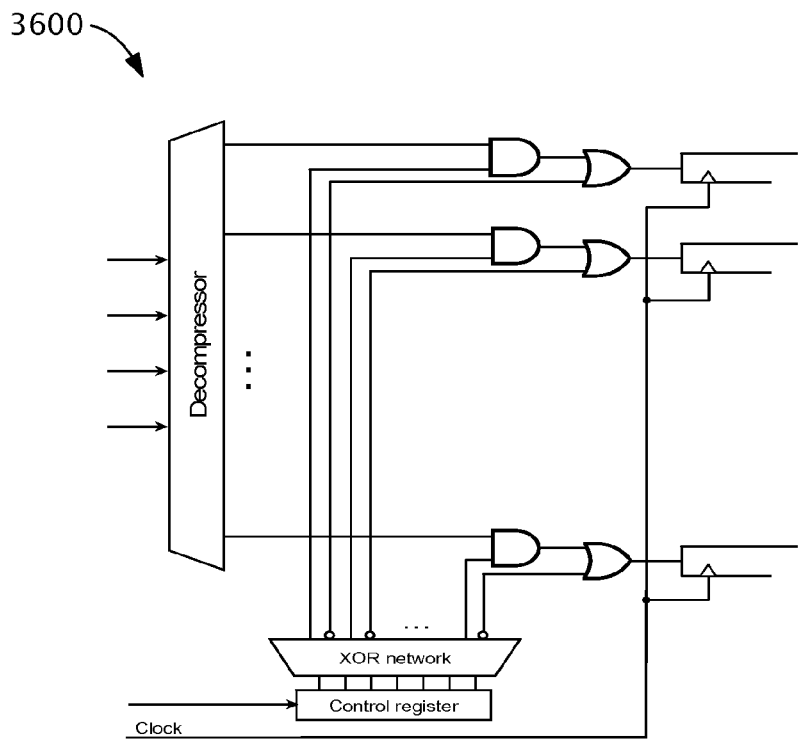
FIG. 36 is a schematic block diagram of an exemplary circuit having a programmable test stimuli selector with a biasing circuit and used to analyze embodiments of the disclosed technology.

In this section, results for circuits ranging in size from 220K to 10.5 M gates, and using the exemplary architecture 3600 of FIG. 36 are presented. For each design, EDT with different compression levels was used by fixing the number of scan channels to 8 and utilizing in all cases a 48-bit decompressor. Results of these experiments are summarized in Table 7. In addition to the number of gates, the following information is given for each circuit: the number of test patterns applied, the fill rate (the percentage of specified bits), the size of the control register ("CR"), the switching rate measured by means of the weighted transition metric assuming that a standard embedded deterministic test is employed (column "SDT"), and the switching rate after using the proposed low power scheme (column "LP"). As can be seen, in all examined cases a substantial reduction in the total number of transitions is achieved, and hence a significantly reduced switching rate was observed.

TABLE 7

Experimental results

| Design | Gates | Tests | Fill rate (%) | Scan chains | CR | SDT (%) | LP (%) |
|---|---|---|---|---|---|---|---|
| D1 | 220K | 5378 | 0.26 | 100 × 126 | 32 | 36.04 | 6.66 |
|  |  |  | 0.26 | 200 × 63 | 32 | 34.21 | 6.99 |
|  |  |  | 0.26 | 400 × 32 | 32 | 32.16 | 5.76 |
| D2 | 430K | 9047 | 0.24 | 100 × 285 | 48 | 35.52 | 5.82 |
|  |  |  | 0.22 | 200 × 143 | 48 | 40.09 | 6.18 |
|  |  |  | 0.22 | 400 × 72 | 48 | 38.36 | 6.09 |
| D3 | 2.6M | 18124 | 0.10 | 100 × 1382 | 48 | 45.15 | 11.66 |
|  |  |  | 0.10 | 200 × 691 | 48 | 45.67 | 11.74 |
|  |  |  | 0.10 | 400 × 346 | 48 | 45.80 | 11.36 |
| D4 | 430K | 5912 | 0.34 | 100 × 285 | 48 | 35.41 | 6.78 |
|  |  |  | 0.31 | 200 × 143 | 48 | 38.11 | 6.82 |
|  |  |  | 0.29 | 400 × 72 | 48 | 37.57 | 6.86 |
| D5 | 10M | 21016 | 0.11 | 100 × 3085 | 48 | 42.34 | 9.98 |
|  |  |  | 0.10 | 200 × 1543 | 48 | 44.96 | 11.45 |
|  |  |  | 0.10 | 400 × 772 | 48 | 45.98 | 11.11 |

IX. Exemplary Computing Environments

Figure 37:
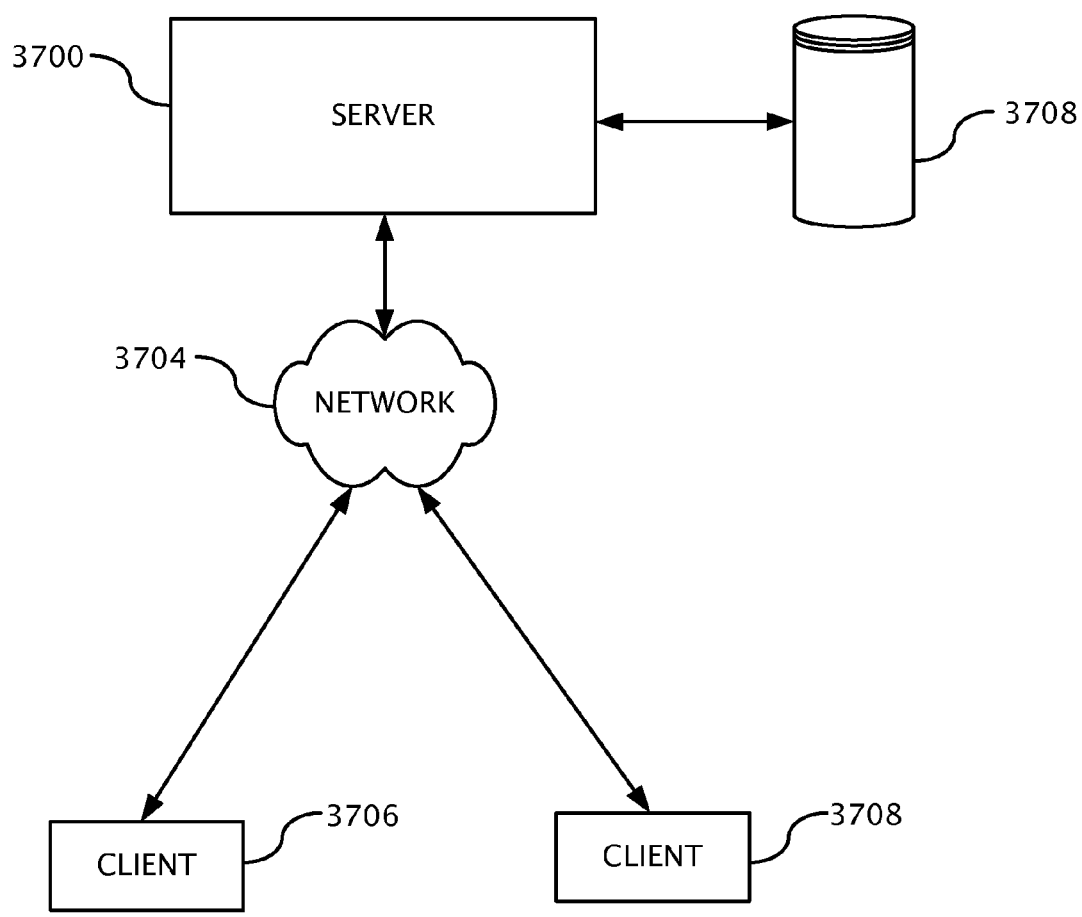
FIG. 37 is a schematic block diagram a first distributed computing network as can be used to perform or implement any of the disclosed embodiments.

Any of the aspects of the technology described above may be performed using a distributed computer network. FIG. 37 shows one suitable exemplary network. A server computer 3700 can have an associated storage device 3702 (internal or external to the server computer). For example, the server computer 3700 can be configured to generate test patterns, test pattern values, or control data according to any of the disclosed methods or to generate design data for implementing any of the disclosed architectures (for example, as part of an EDA software tool, such as a test pattern generation tool).

The server computer 3700 can be coupled to a network, shown generally at 3704, which can comprise, for example, a wide-area network, a local-area network, a client-server network, the Internet, or other suitable network. One or more client computers, such as those shown at 3706, 3708, may be coupled to the network 3704 using a network protocol. The work may also be performed on a single, dedicated workstation, which has its own memory and one or more CPUs.

Figure 38:
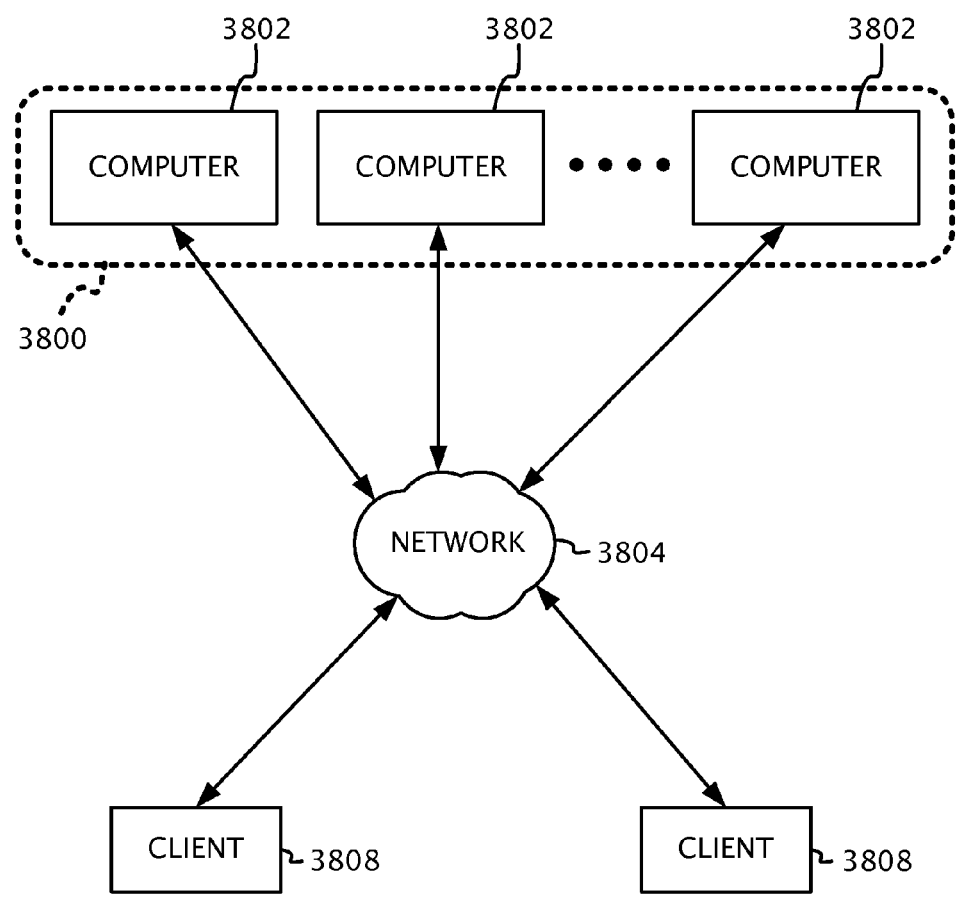
FIG. 38 is a schematic block diagram a second distributed computing network as can be used to perform or implement any of the disclosed embodiments.

FIG. 38 shows another exemplary network. One or more computers 3802 communicate via a network 3804 and form a computing environment 3800 (for example, a distributed computing environment). Each of the computers 3802 in the computing environment 3800 can be used to perform at least a portion of the test pattern generation, control data generation, or test hardware generation process. The network 3804 in the illustrated embodiment is also coupled to one or more client computers 3808.

Figure 39:
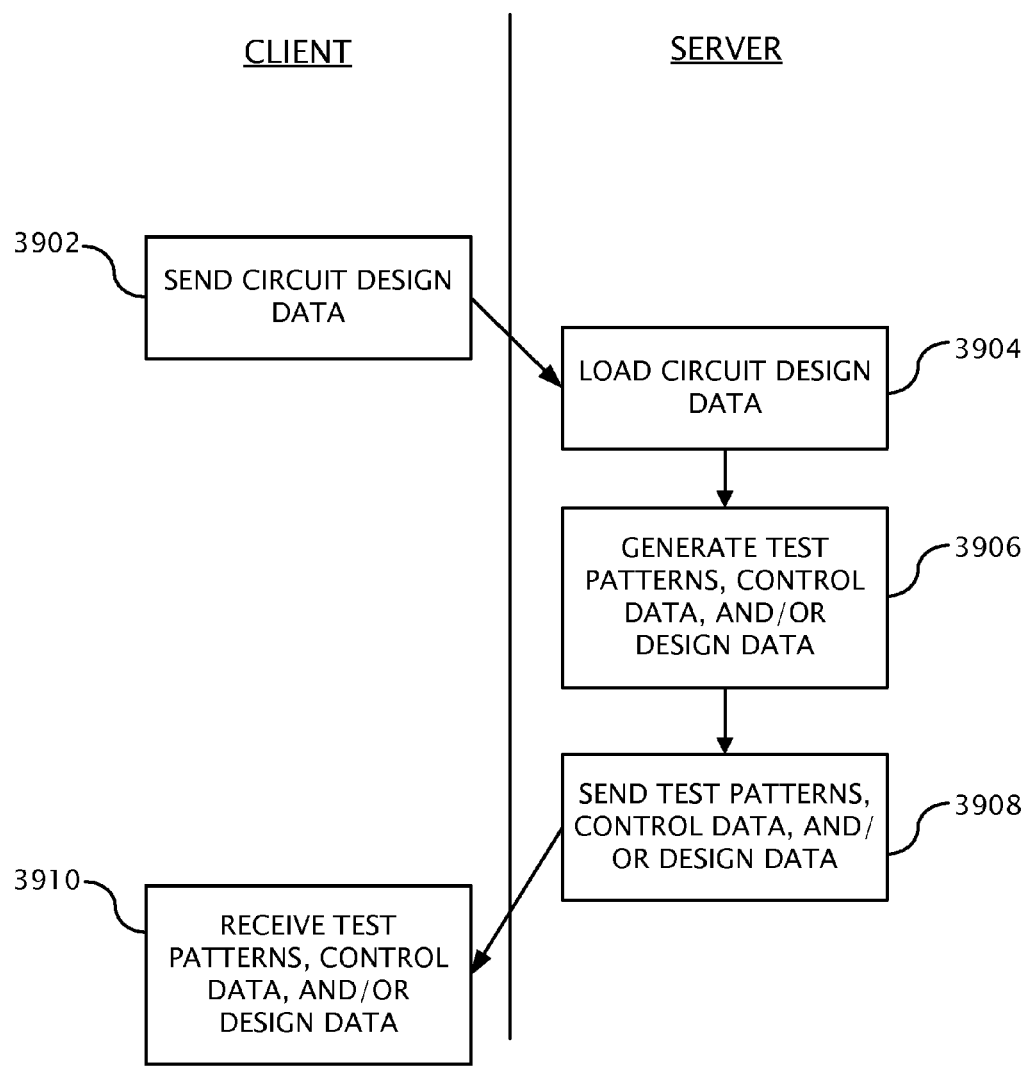
FIG. 39 is a flowchart showing an exemplary method for performing or implementing any of the disclosed embodiments using a distributed computer network (such as the networks of FIGS. 37 and 38).

FIG. 39 shows that design information for a circuit-under-test (for example, an HDL file, netlist, GDSII file, Oasis file, or other suitable design file representing the circuit-under-test together with its scan chains) can be analyzed using a remote server computer (such as the server computer 3700 shown in FIG. 37) or a remote computing environment (such as the computing environment 3800 shown in FIG. 38) in order to generate test patterns, control data, or test hardware according to any embodiment of the disclosed technology. At process block 3902, for example, the client computer sends the integrated circuit design information to the remote server or computing environment. In process block 3904, the integrated circuit design information is received and loaded by the remote server or by respective components of the remote computing environment. In process block 3906, test pattern generation, control signal generation, or test hardware generation is performed in order to implement any of the disclosed embodiments. At process block 3908, the remote server or computing environment sends the resulting test patterns, control signals, or design data storing the generated test hardware to the client computer, which receives the data at process block 3910.

It should be apparent to those skilled in the art that the example shown in Figure 3900 is not the only way to generate test patterns, control data, or design data for test hardware using multiple computers. For instance, the CUT design information may be stored on a computer-readable medium that is not on a network and that is sent separately to the server or computing environment (for example, a CD-ROM, DVD, or portable hard drive). Or, the server computer or remote computing environment may perform only a portion of the test pattern generation, control data generation, or test hardware generation procedures.

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

What is claimed is:

1. An integrated circuit, comprising:
   a decompressor coupled to data inputs of scan chains in the integrated circuit;
   a controller configured to generate control signals; and
   a scan enable circuit, the scan enable circuit having an input coupled to the controller and outputs coupled to scan enable inputs of scan cells of the scan chains,
   the scan enable circuit being configured to generate independently controllable scan enable signals at one or more of the outputs of the scan enable circuit, the values of the independently controllable scan enable signals being based at least in part on the control signals from the controller and causing a plurality of scan cells selected from the scan cells to operate in a shift mode during a capture window.

2. The integrated circuit of claim 1, wherein the values of the independently controllable scan enable signals comprise a first scan enable value and a second scan enable value, the first scan enable value being used to cause one or more of the scan chains to operate in a shift mode and the second scan enable value being used to cause the one or more of the scan chains to operate in a normal circuit mode.

3. The integrated circuit of claim 1, wherein each output of the scan enable circuit is coupled to the scan enable inputs of the scan cells in a respective one or more of the scan chains.

4. The integrated circuit of claim 1 further comprising a test stimulus selector having outputs that are configured to be coupled to scan chains formed by the scan cells, the test stimulus selector being configured to selectively output either an original test pattern value or a constant value at each respective one of the outputs of the test stimulus selector.

5. The integrated circuit of claim 1, wherein the controller is a programmable controller configured to load control data from one of an external tester, a memory on the integrated circuit, or a test generator on the integrated circuit.

6. The integrated circuit of claim 1, wherein the controller comprises shift registers for loading and outputting control data, the shift registers forming a multi-stage register pipeline.

7. The integrated circuit of claim 6, further comprising one or more shadow registers coupled to the one or more shift registers.

8. The integrated circuit of claim 6, wherein the controller further comprises:
   an XOR or XNOR network coupled to at least one of the shift registers; and
   a biasing circuit coupled to the XOR or XNOR network, the biasing circuit being configured to bias one or more of the outputs of the XOR or XNOR network so that each of the biased outputs is more likely to produce a respective binary value.

9. A computer-readable media storing design data for the circuit of claim 1.

10. A computer-readable media storing computer-executable instructions for causing a computer to create the integrated circuit of claim 1.

11. An integrated circuit, comprising:
    a decompressor coupled to data inputs of scan chains in the integrated circuit;
    a controller configured to generate control signals; and
    a clock enable circuit, the clock enable circuit having inputs coupled to the controller and outputs coupled to clock inputs of scan cells of the scan chains,
    the clock enable circuit being configured to generate independently controllable clock signals at one or more of the outputs of the clock enable circuit based at least in part on the control signals from the controller such that clock signals for a plurality of scan cells selected from the scan cells are suppressed during a certain period of time.

12. The integrated circuit of claim 11, wherein the independently controllable clock signals generated by the clock enable circuit are capture clock signals.

13. The integrated circuit of claim 11, wherein each output of the clock enable circuit is coupled to the clock inputs of the scan cells in a respective one or more of the scan chains of the integrated circuit.

14. The integrated circuit of claim 11, wherein the clock enable circuit comprises individual clock enabler circuits for controlling each respective output of the clock enable circuit.

15. The integrated circuit of claim 11 further comprising a test stimulus selector having outputs that are configured to be coupled to scan chains formed by the scan cells, the test stimulus selector being configured to selectively output either an original test pattern value or a constant value at each respective one of the outputs of the test stimulus selector.

16. The integrated circuit of claim 11, wherein the controller is a programmable controller configured to load control data from one of an external tester, a memory on the integrated circuit, or a test generator on the integrated circuit.

17. The integrated circuit of claim 11, wherein the controller comprises shift registers for loading and outputting control data, the shift registers forming a multi-stage register pipeline.

18. The integrated circuit of claim 17, further comprising one or more shadow registers coupled to the one or more shift registers.

19. The integrated circuit of claim 17, wherein the controller further comprises:
an XOR or XNOR network coupled to at least one of the shift registers; and
a biasing circuit coupled to the XOR or XNOR network, the biasing circuit being configured to bias one or more of the outputs of the XOR or XNOR network so that each of the biased outputs is more likely to produce a respective binary value.

20. An integrated circuit, comprising:
a decompressor coupled to data inputs of scan chains in the integrated circuit;
a controller configured to generate control signals; and
a reset enable circuit, the reset enable circuit having inputs coupled to the controller and outputs that are coupled to reset inputs of scan cells of the scan chains,
the reset enable circuit being configured to selectively generate a reset signal at one or more of the outputs of the reset enable circuit based at least in part on the control signals from the controller such that a plurality of scan cells selected from the scan cells are reset.

21. The integrated circuit of claim 20, wherein the scan cells in the integrated circuit are configured to be reset to 0 or 1 when the reset signal is applied to the reset inputs.

22. The integrated circuit of claim 20, wherein the reset enable circuit comprises individual reset enabler circuits for controlling each respective output of the reset enable circuit.

23. The integrated circuit of claim 20, wherein each output of the reset enable circuit is coupled to the reset inputs of the scan cells in a respective one or more scan chains of the integrated circuit.

24. The integrated circuit of claim 20, wherein the reset inputs of the scan cells comprise asynchronous control pins of the scan cells.

25. The integrated circuit of claim 20, further comprising a shift clock enable circuit, the shift clock enable circuit having outputs that are coupled to shift clock inputs of scan chains in the integrated circuit, the shift clock enable circuit being configured to selectively generate a shift clock signal at one or more of the outputs of the shift clock enable circuit.

26. The integrated circuit of claim 25, wherein the shift clock enable circuit further comprises inputs coupled to the controller, and wherein the shift clock signals that are selectively generated are based at least in part on the control signals from the controller.

27. The integrated circuit of claim 20 further comprising a test stimulus selector having outputs that are configured to be coupled to scan chains formed by the scan cells, the test stimulus selector being configured to selectively output either an original test pattern value or a constant value at each respective one of the outputs of the test stimulus selector.

28. The integrated circuit of claim 20, wherein the controller is a programmable controller configured to load control data from one of an external tester, a memory on the integrated circuit, or a test generator on the integrated circuit.

29. The integrated circuit of claim 20, wherein the controller comprises shift registers for loading and outputting control data, the shift registers forming a multi-stage register pipeline.

30. The integrated circuit of claim 29, further comprising one or more shadow registers coupled to the one or more shift registers.

31. The integrated circuit of claim 29, wherein the controller further comprises:
an XOR or XNOR network coupled to at least one of the shift registers; and
a biasing circuit coupled to the XOR or XNOR network, the biasing circuit being configured to bias one or more of the outputs of the XOR or XNOR network so that each of the biased outputs is more likely to produce a respective binary value.

* * * * *